(12) United States Patent
Yeong et al.

(10) Patent No.: US 12,324,146 B2
(45) Date of Patent: Jun. 3, 2025

(54) VERTICAL DRAM STRUCTURE AND METHOD OF FORMATION

(71) Applicant: Taiwan Semiconductor Manufacturing Co., Ltd., Hsinchu (TW)

(72) Inventors: Sai-Hooi Yeong, Zhubei (TW); Bo-Feng Young, Taipei (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 343 days.

(21) Appl. No.: 17/747,389

(22) Filed: May 18, 2022

(65) Prior Publication Data
US 2023/0240066 A1    Jul. 27, 2023

Related U.S. Application Data

(60) Provisional application No. 63/267,152, filed on Jan. 26, 2022.

(51) Int. Cl.
*H01L 21/00* (2006.01)
*G11C 5/06* (2006.01)
*H10B 12/00* (2023.01)
*H10D 64/27* (2025.01)

(52) U.S. Cl.
CPC ........... *H10B 12/395* (2023.02); *G11C 5/063* (2013.01); *H10B 12/0383* (2023.02); *H10B 12/0385* (2023.02); *H10B 12/315* (2023.02); *H10B 12/482* (2023.02); *H10B 12/488* (2023.02); *H10D 64/513* (2025.01)

(58) Field of Classification Search
CPC .......................... H10B 12/395; H10B 12/482; H10B 12/0383; H10B 12/0385; H10B 12/315; H10B 12/488; H10D 64/513; G11C 5/063
See application file for complete search history.

(56) References Cited

U.S. PATENT DOCUMENTS

| | | | |
|---|---|---|---|
| 6,872,609 B1 * | 3/2005 | Kamal | H10B 69/00 257/E21.679 |
| 7,679,118 B2 * | 3/2010 | Forbes | H10D 30/611 257/296 |
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |

(Continued)

FOREIGN PATENT DOCUMENTS

| | | |
|---|---|---|
| TW | 200933879 A | 8/2009 |
| TW | 201021098 A | 6/2010 |

(Continued)

*Primary Examiner* — Richard A Booth
(74) *Attorney, Agent, or Firm* — Slater Matsil, LLP

(57) ABSTRACT

Embodiments provide an integrated capacitor disposed directly over and aligned to a vertical gate all around memory cell transistor. In some embodiments, an air gap may be provided between adjacent word lines to provide a low k dielectric effect between word lines. In some embodiments, a bottom bitline structure may be split across multiple layers. In some embodiments, a second tier of vertical cells may be positioned over a first tier of vertical cells.

19 Claims, 66 Drawing Sheets

(56) References Cited

U.S. PATENT DOCUMENTS

| | | |
|---|---|---|
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2003/0062555 A1* | 4/2003 | Miyai .................... H10B 12/34 438/242 |
| 2010/0124812 A1 | 5/2010 | Jung |
| 2010/0142257 A1 | 6/2010 | Masuoka et al. |
| 2013/0320433 A1 | 12/2013 | Cho et al. |
| 2014/0011334 A1 | 1/2014 | Cho et al. |

FOREIGN PATENT DOCUMENTS

| | | |
|---|---|---|
| TW | 201349354 A | 12/2013 |
| TW | 201403796 A | 1/2014 |

* cited by examiner

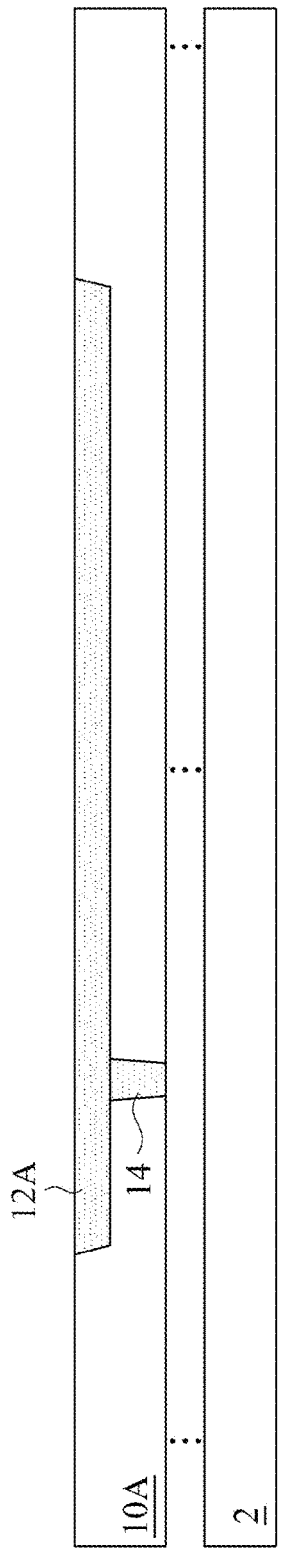
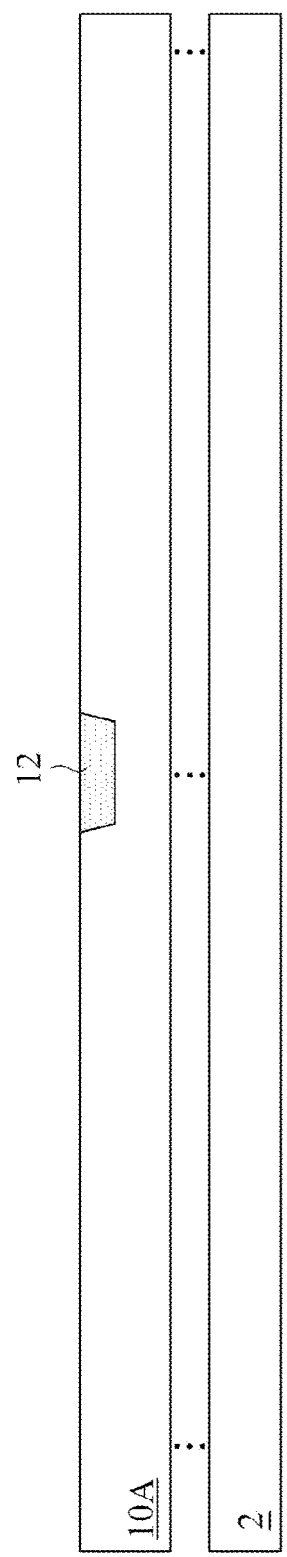
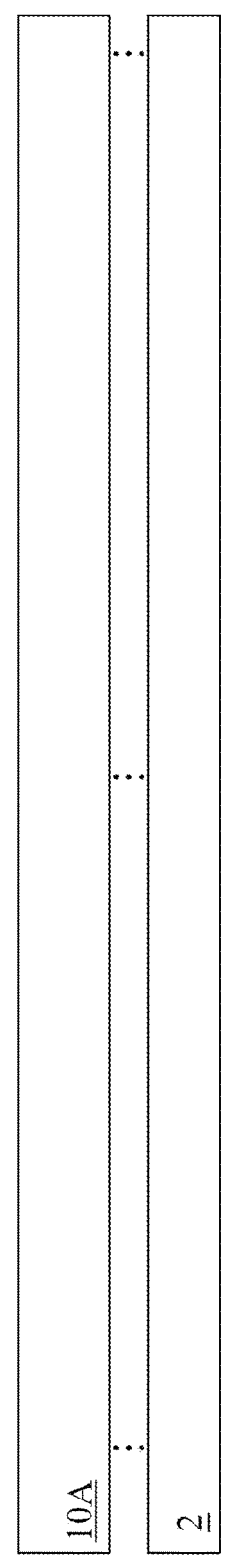
Figure 3C
Figure 3B
Figure 3A

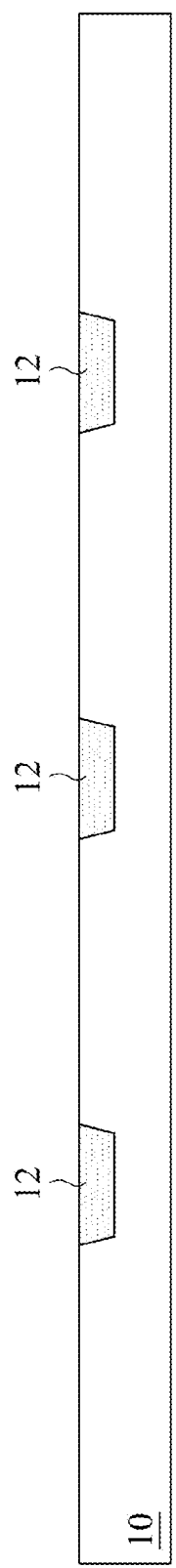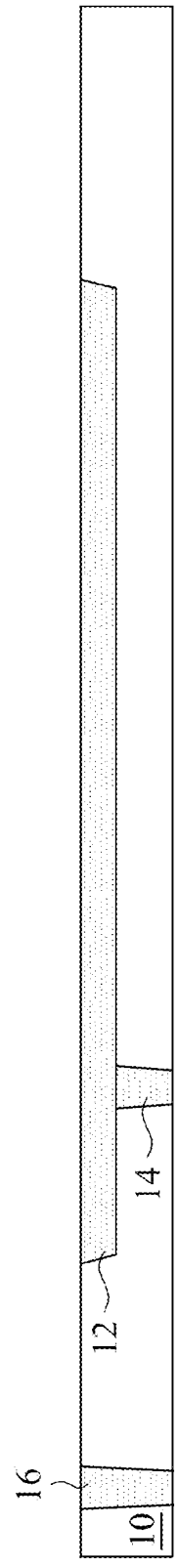
Figure 5B
Figure 5A

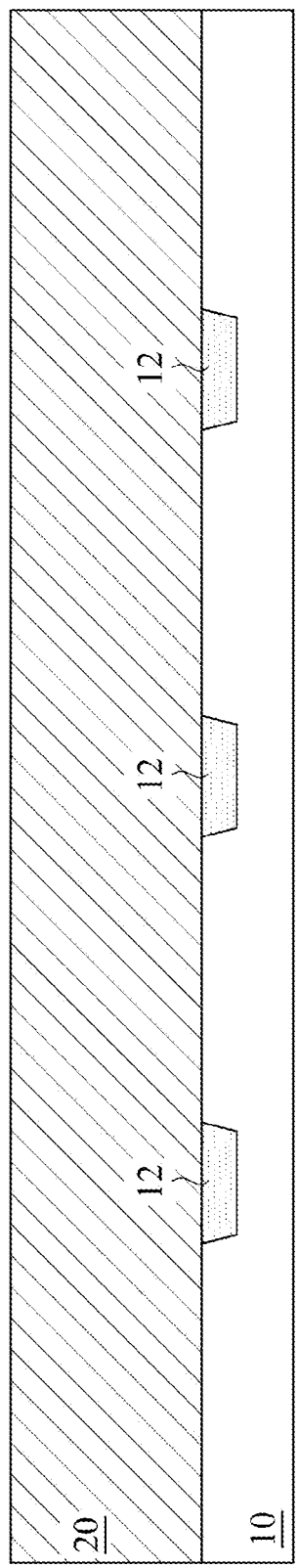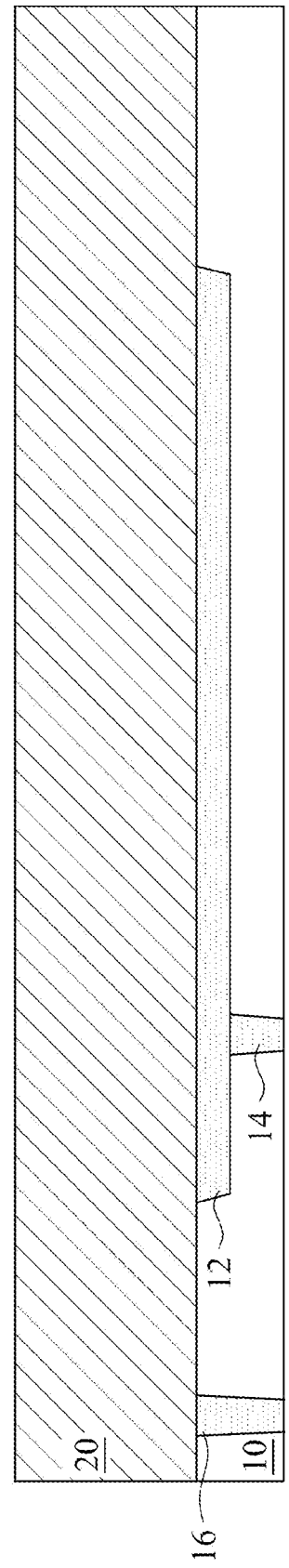
Figure 7B
Figure 7A

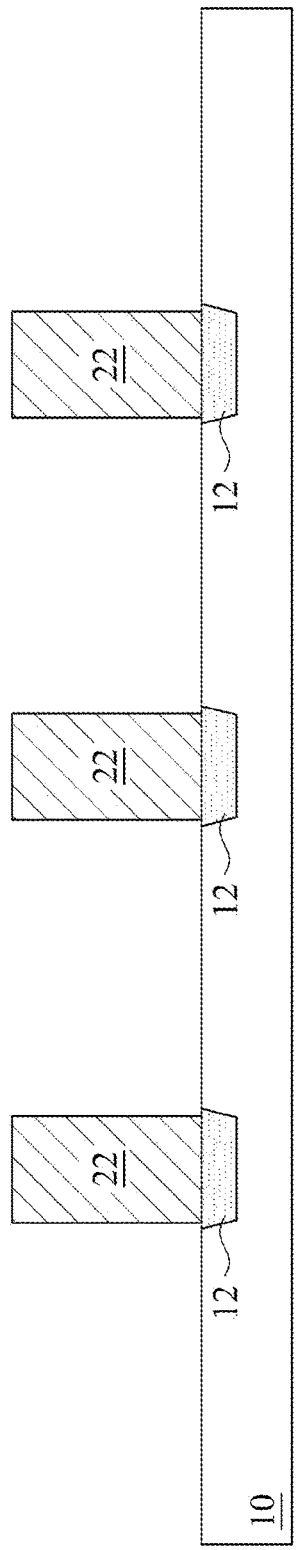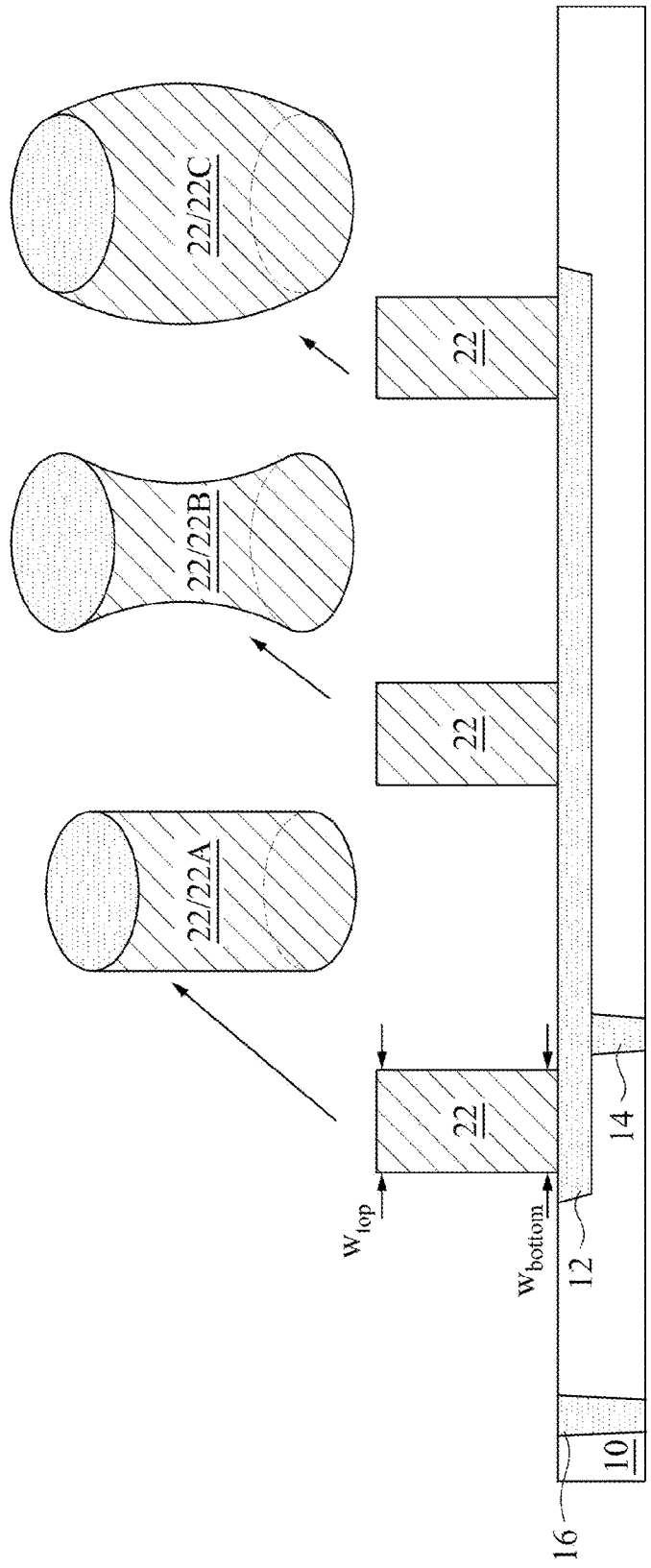

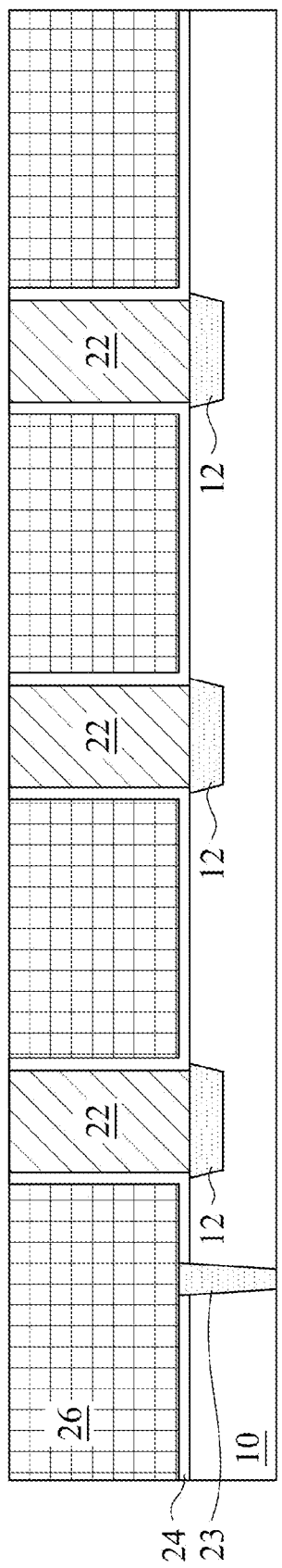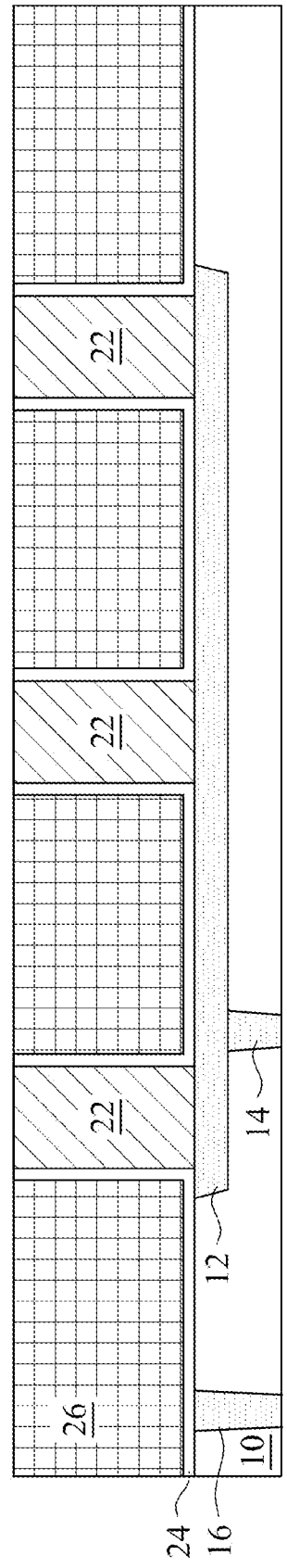

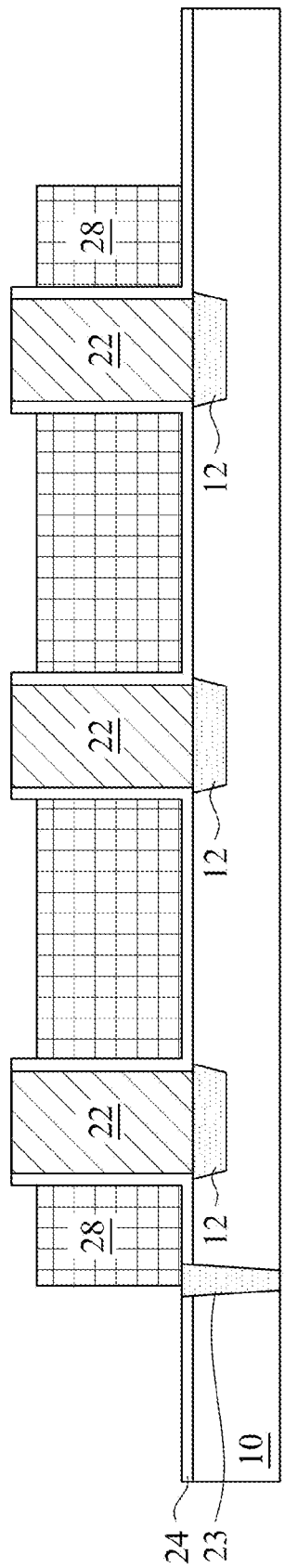
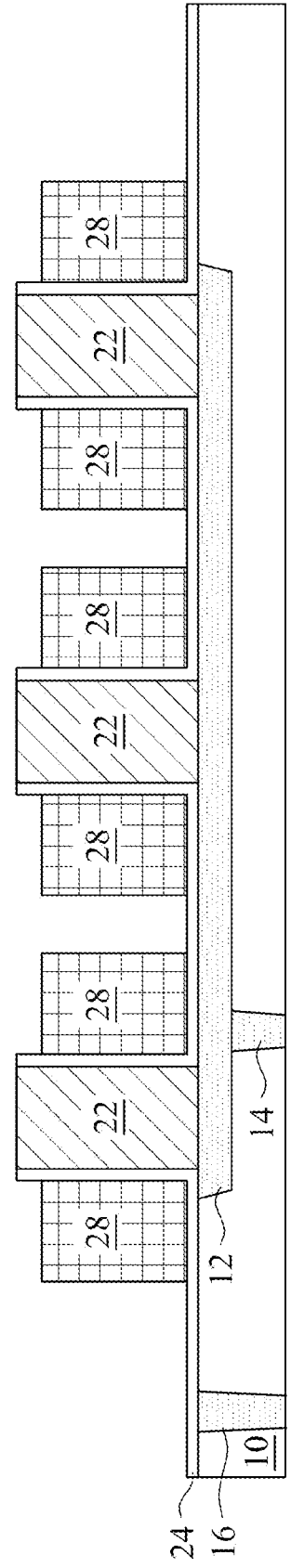
Figure 15B
Figure 15A

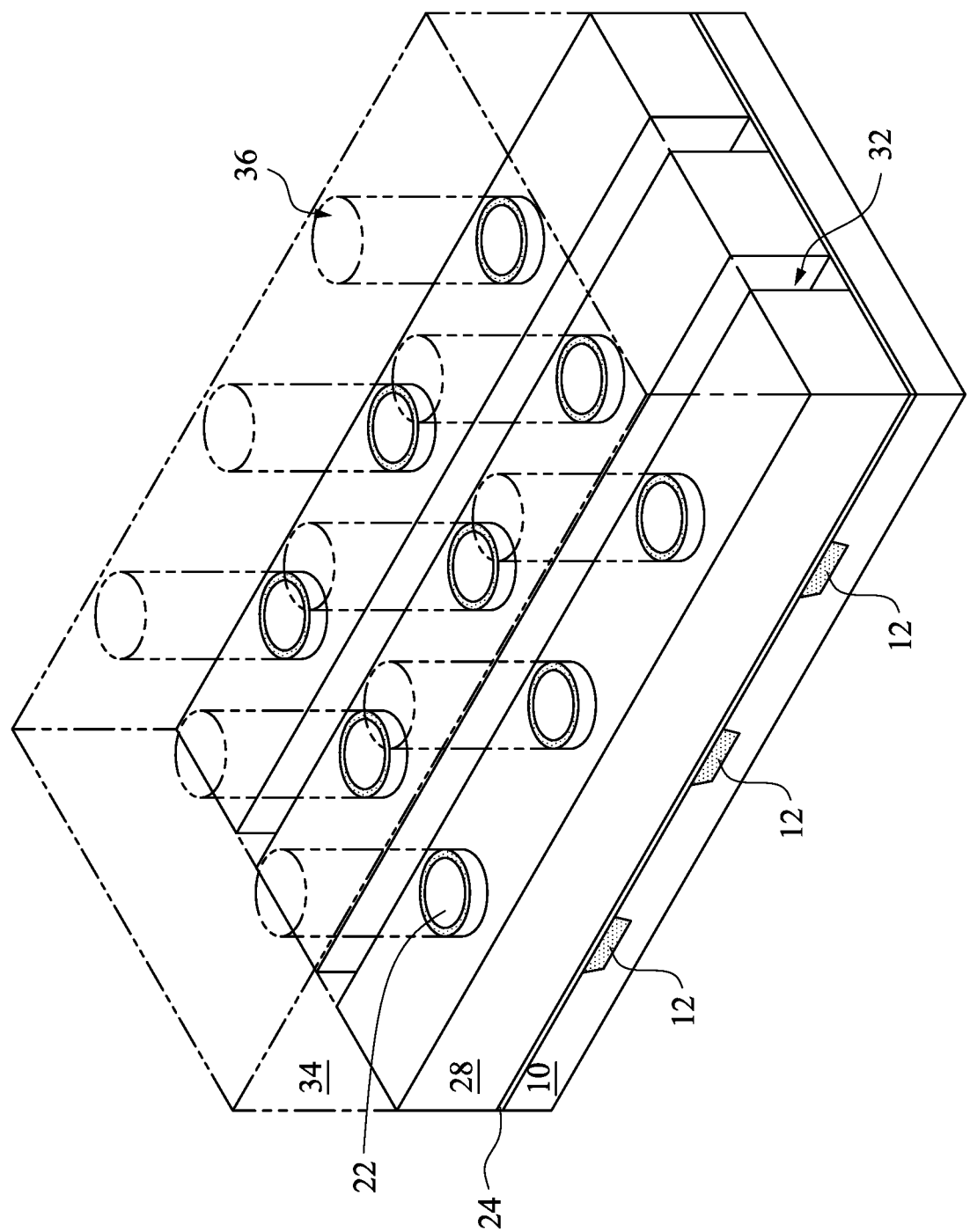

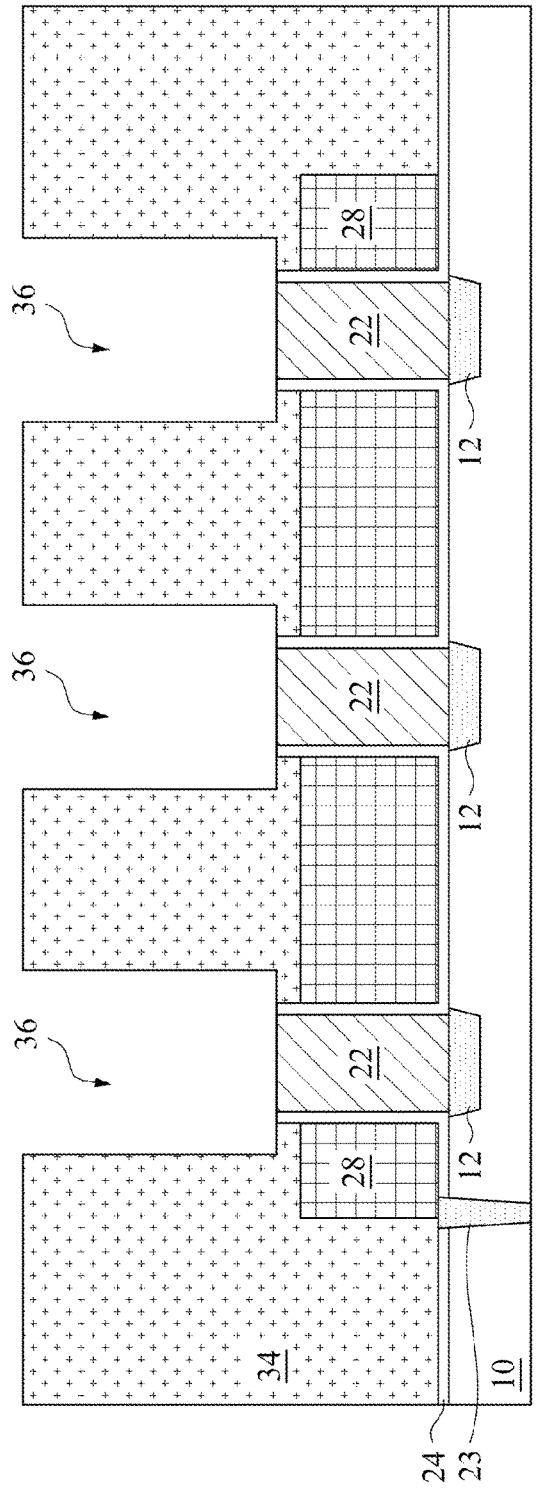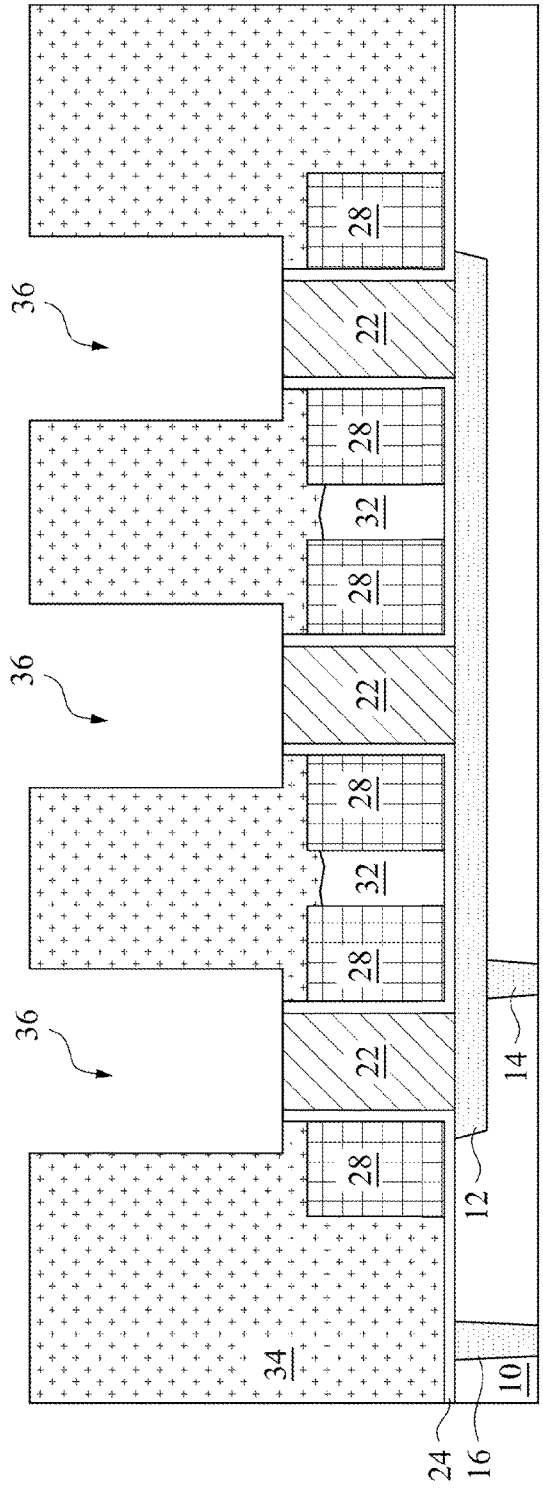
Figure 19B
Figure 19A

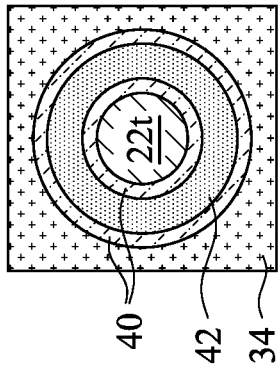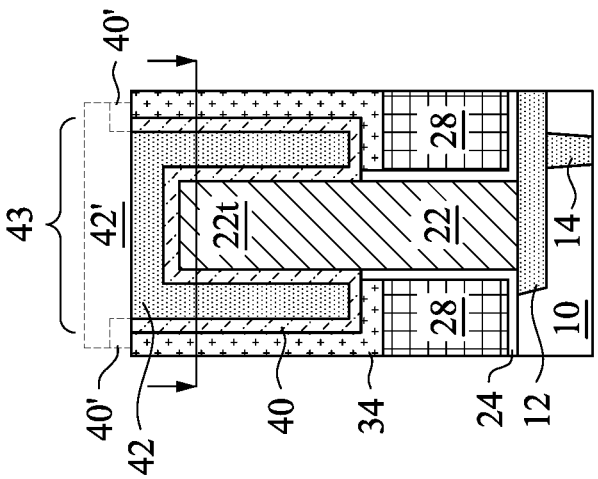
Figure 34C
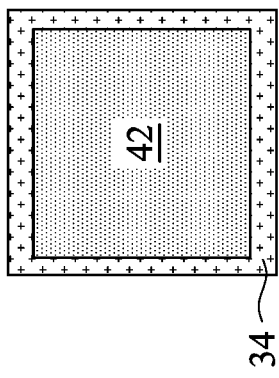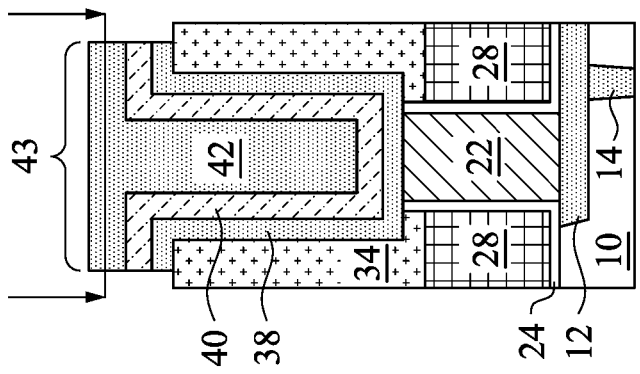
Figure 34B
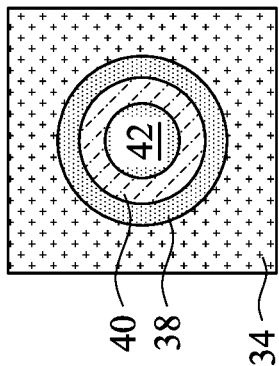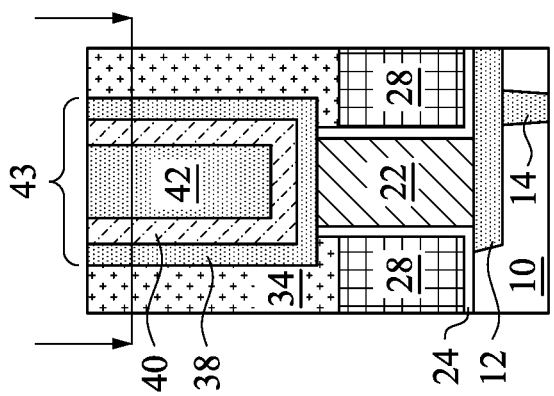
Figure 34A

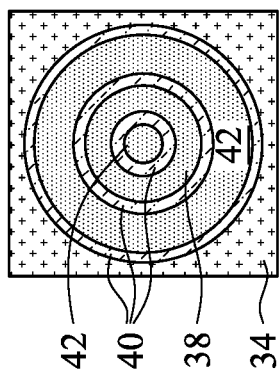
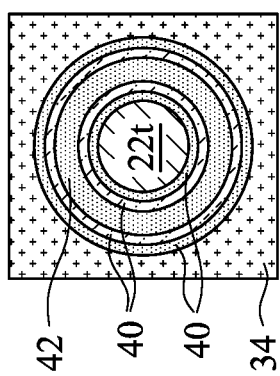
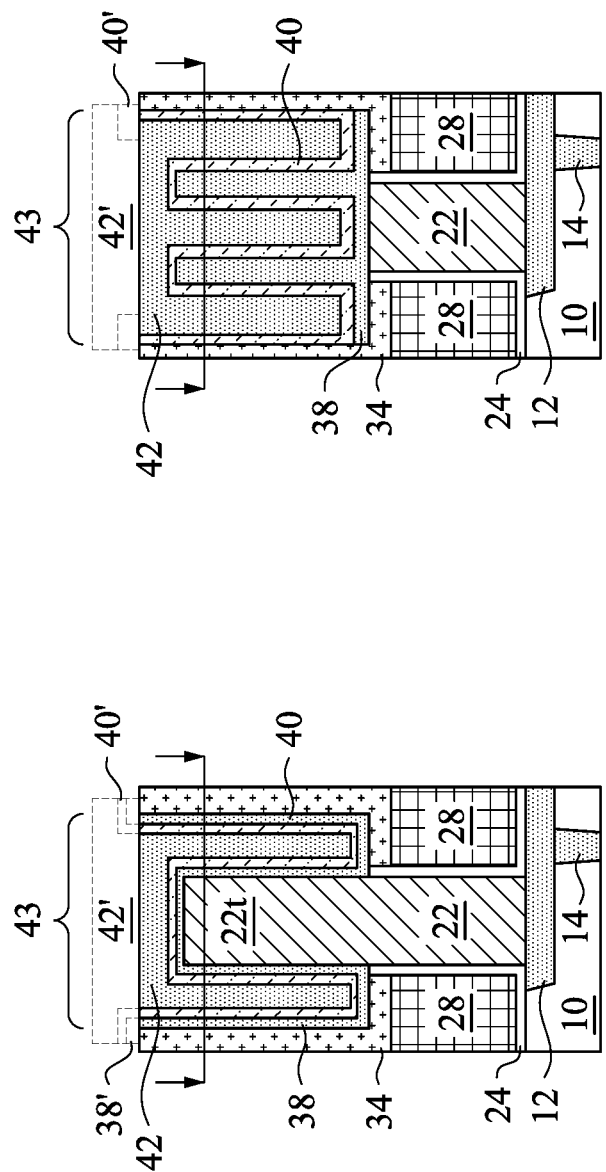
Figure 34E
Figure 34D

VERTICAL DRAM STRUCTURE AND METHOD OF FORMATION

PRIORITY CLAIM AND CROSS-REFERENCE

This application claims the benefit of U.S. Provisional Application No. 63/267,152, filed on Jan. 26, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

Semiconductor memory devices include, for example, static random-access memory (SRAM), and dynamic random-access memory (DRAM). DRAM memory cell has only one transistor and one capacitor, so it provides a high degree of integration. Vertical DRAM provides DRAM technology in a smaller footprint, which leads to potential additional problems that need to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, and 3C through 28A and 28B illustrate intermediate views of a process to form a vertical DRAM, in accordance with some embodiments.

FIGS. 29 through 41A and 41B illustrate intermediate views of various processes to form a vertical DRAM, in accordance with other embodiments.

DETAILED DESCRIPTION

Figure 1:
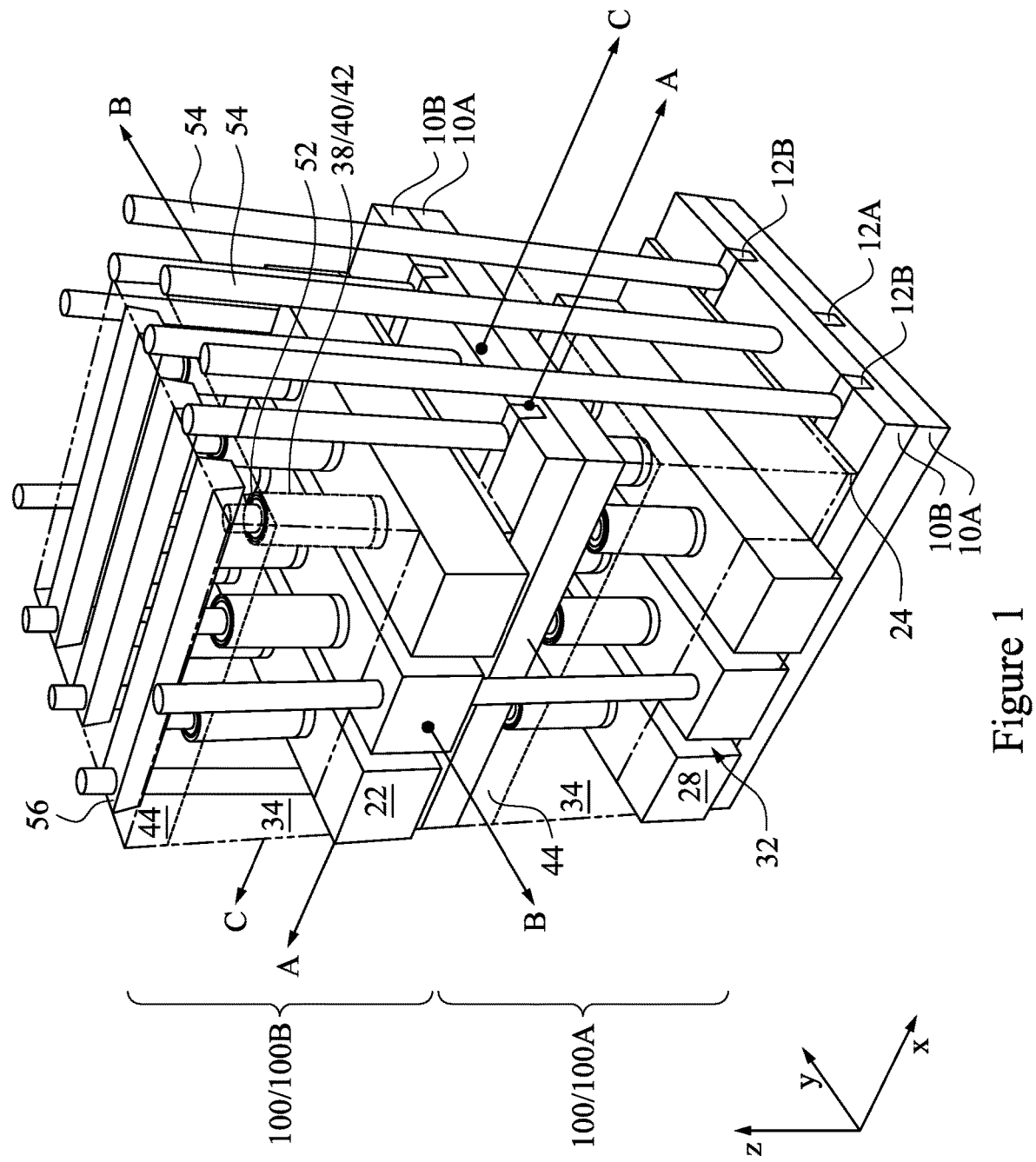
FIG. 1 illustrates an example of a two-tiered vertical DRAM in a three-dimensional view, in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide a dynamic random-access memory (DRAM) cell and cell array that utilizes a vertical design which is stackable to achieve three-dimensional cell density. DRAM utilizes an access transistor and capacitor to store the memory element. DRAM is a volatile memory that must be regularly refreshed. Embodiments integrate the DRAM in a back end of line (BEOL) process utilizing a vertical gate all around (GAA) transistor and capacitor disposed directly over the vertical GAA transistor. This arrangement uses less surface area to accomplish a memory cell and array than traditional DRAM. As the layout, however, becomes more compact, care must be taken to ensure electrical characteristics are maintained to appropriately separate each memory cell from other adjacent memory cells so as to prevent unwanted memory characteristics. Embodiments provide the ability to stack memory cells to achieve a three-dimensional layout. In such embodiments, for example, a second tier of memory cells may be deposited and formed over a first tier of memory cells, and a third tier of memory cells may be deposited and formed over the second tier of memory cells, and so forth. Embodiments also provide the ability to use a double layer of bit line wirings which provides better separation between adjacent bit lines which reduces parasitic capacitance, and as a result lowers memory cell RC (resistance/capacitance characteristics, thereby improving the read/write cycle time. Embodiments also provide the ability to integrate an air gap between adjacent write line wirings also reducing parasitic capacitance, which further assist in reducing memory cell RC and improving read/write cycle time. Implementing stacking and other features of the disclosed embodiments enables a $4F^2$ memory footprint. Embodiments also utilize monolithic processes to deposit and form the various components of the memory cells, resulting in a low thermal budget and further density gain.

Figure 2:
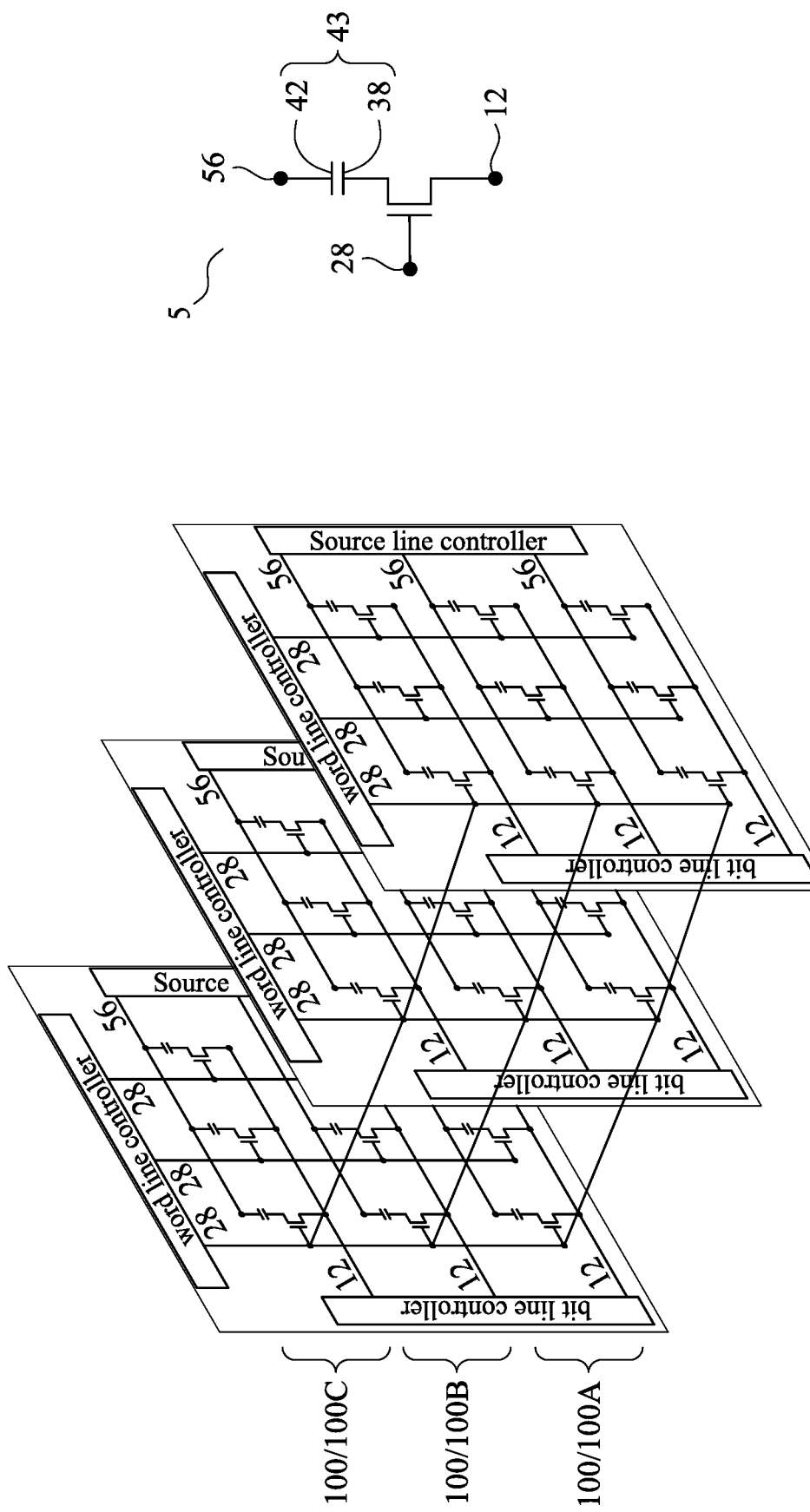
FIG. 2 illustrates a circuit diagram, in accordance with some embodiments.
Figure 4C:
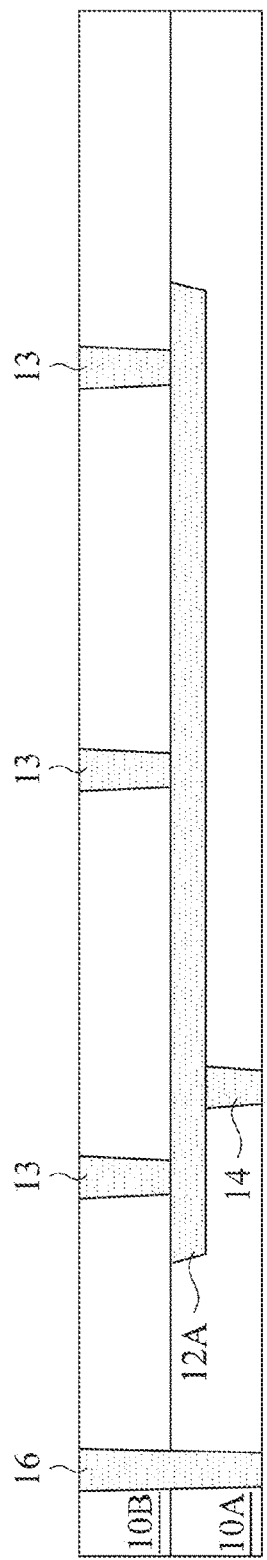

FIG. 1 illustrates an example portion of a multi-tiered three-dimensional (3D) vertical DRAM device, in accordance with some embodiments. FIG. 1 is in a three-dimensional or perspective view, where some features are omitted for illustration clarity. FIGS. 3A, 3B, and 3C through 48A and 48B are views of intermediate stages in the manufacturing of the vertical memory device, in accordance with some embodiments. FIG. 1 defines several cross-sections which may be referred to in the discussion below. Cross-section A-A is along a longitudinal axis of a BL 12. Cross-section B-B is along a longitudinal axis of a WL 28 surrounding a channel region 22 and in a direction, for example, perpendicular to the cross-section A-A. Cross-section C-C is parallel to cross-section A-A and extends through a bitline 12 adjacent to the cross-section A-A. Subsequent figures refer to these reference cross-sections for clarity. In general, Figures ending with 'A' illustrate a cross-section through the cross-section A-A and Figures ending with 'B' illustrate a cross-section through the cross-section B-B. FIGS. 1, 6, 8, 12, 14, 18, 20, 22, 25, 29, and 32 are three-dimensional views. FIGS. 3A, 4A, 5A, 7A, 9A, 9C, 9D, 10A, 11A, 13A, 15A, 16A, 16C, 17A, 17C, 19A, 21A, 23A, 24A, 26A, 27A, 28A, 30A, 31A, 33A, 35A, 36A, 37A, 38A, 39A, 40A, and 41A are cross-sectional views illustrated along a similar cross-section as reference cross-section A-A in FIG. 1. FIGS. 3B, 4B, 5B, 7B, 9B, 10B, 11B, 13B, 15B, 16B, 17B, 19B, 21B, 23B, 24B, 26B, 27B, 28B, 30B, 31B, 33B, 35B, 36B, 37B, 38B, 39B, 40B, and 41B are cross-sectional views illustrated along a similar cross-section as reference cross-section B-B in FIG. 1. FIGS. 3C, 4C, and 27C are cross-sectional views illustrated along a similar cross-section as reference cross-section C-C in FIG. 1. FIGS. 9E, 15C, 23C, and 30C are top down views. FIGS. 34A, 34B, 34C, 34D, and 34E include a hybrid view that has both a horizontal cross-sectional view and a cross-sectional view illustrated along a similar cross-section as reference cross-section A-A. FIG. 2 illustrates a circuit diagram, in accordance with some embodiments. Unless otherwise noted, similar reference numbers denote similar structures, which may be made using like processes and materials as elsewhere described.

In FIG. 1, the 3D DRAM device incorporates a vertical gate-all-around field-effect transistors (GAAFETs) and integrated capacitor for each memory cell of the 3D DRAM device. Embodiment DRAM memory cells include a vertical GAA transistor, the gate input being coupled to a wordline (WL) wiring, a first leg (i.e., source/drain) coupled to a bit line (BL) wiring, and a second leg (i.e., source/drain) coupled to a charge cell capacitor. The other end of the capacitor is coupled to a first reference voltage, such as ground. Source/drain or source/drain region(s) may refer to a source or a drain, individually or collectively dependent upon the context. A region may be a source or drain based on the type of materials and impurities used in the transistor.

A first tier 100/100A includes a memory array provided on the bottom of the vertical DRAM device and a second tier 100/100B including a memory array on first tier 100A. In the illustrated embodiment, the first tier 100A includes wordlines (WLs) 28 wirings with an air gap 32 between each of the WLs 28. These are formed over a two-level wiring including dielectric layers 10A and 10B and wiring patterns corresponding to bitlines (BLs) 12A and 12B, respectively. A gate dielectric 24 surrounds (laterally wraps around) a gate channel for each cell which are embedded in the WLs 28. A first inter layer dielectric (ILD) 34 is formed over the WLs 28 and metal-insulator-metal (MIM) capacitors including bottom electrode 38, capacitor dielectric 40, and top electrode 42 are formed within the first ILD 34. A source line via 52 through a second ILD 44 couples the top electrode 42 to a source line (SL) 56 wiring. The second tier 100B is like unto the first tier 100A, and wordline via 23 couples respective WLs 28 in each of the tiers to each other.

FIG. 2 illustrates a partial circuit diagram for a vertical 3D DRAM, in accordance with some embodiments. The circuit diagram illustrates a three-tiered structure having a first tier 100A, second tier 100B, and third tier 100C, each tier including a memory array 100 of memory cells 5. As illustrated in FIG. 2, each of the memory cells 5 includes a transistor paired with a cell capacitor 43. The bitlines 12 are coupled to the source/drain of the transistor. The bottom electrode 38 of the cell capacitor 43 is coupled to the opposite source/drain of the transistor. The top electrode 42 of the cell capacitor 43 is coupled to the source line 56. The gate of the transistor is coupled to a wordline 28 wiring. As indicated in FIG. 2, each of the wordlines 28 of, e.g., tier 100A, in a column are coupled together (only some of these are illustrated for the sake of clarity) to a wordline controller WLC, while each of the source lines 56 and bitlines 12 in a row are coupled together. The source lines 56 are coupled to a source line controller SLC, and the bitlines 12 are coupled to a bitline controller BLC. The wordlines 28 of each tier, e.g., 100A, 100B, 100C, may also be vertically coupled together. It should be understood that the circuit diagram in FIG. 2 is only representative and additional tiers and additional transistor/capacitor pairs can be added horizontally and/or vertically.

The DRAM operates in write mode by putting a charge voltage or a first reference voltage (e.g., ground) on the BL and then enabling the WL to either charge the capacitor or drain the capacitor, thereby writing a one or zero to the capacitor, respectively. The DRAM operates in read mode by putting a second reference voltage on the BL that is between the charge voltage and the first reference voltage. Then the WL is enabled. If the BL voltage is increased because the capacitor begins to drain to the BL, then it is determined to have been a one. If the BL voltage is reduced because it begins to charge the capacitor, then it is determined to have been a zero.

FIGS. 3A, 3B, and 3C through 4A, 4B, and 4C illustrate the formation of a two-layered bit line structure, in accordance with some embodiments. In FIGS. 3A, 3B, and 3C a substrate 2 is provided and a dielectric layer 10A is deposited thereover, with any number of layers and device features interposed between the substrate 2 and the dielectric layer 10A.

The substrate 2 may be a semiconductor substrate, which may be a silicon substrate, a silicon germanium substrate, or a substrate formed of other semiconductor materials. Substrate 2 may be doped with a p-type or an n-type impurity. In other embodiments, the substrate 2 may be a carrier substrate, such as a glass carrier, ceramic carrier, the like, and so forth. The dielectric layer 10A may be any suitable dielectric layer type. In some embodiments, the dielectric layer 10A may be an inter-layer dielectric (ILD) or an inter-metal dielectric (IMD), or the like, and may be a layer in a redistribution structure or interconnect. The dielectric layer 10A may include a dielectric material formed using, for example, FCVD, spin-on coating, CVD, or another deposition process. Dielectric layer 10A may be formed of an oxygen-containing dielectric material, which may be a silicon-oxide based dielectric material such as silicon oxide (formed using Tetra Ethyl Ortho Silicate (TEOS) as a process gas, for example), silicon oxycarbide, Phospho-Silicate Glass (PSG), Boro-Silicate Glass (BSG), Boron-Doped Phospho-Silicate Glass (BPSG), or the like.

Next, trenches are formed in the dielectric layer 10A. The trenches may be formed by a suitable photo etching process. For example, a resist layer (not illustrated) may be formed over the dielectric layer 10A and exposed to a light source through a light mask, which is then patterned onto the resist layer. Next, the resist layer is developed and cured, forming openings in the resist layer according to the pattern of the light mask. The resist layer is used as a mask for performing an etching process. The etching process may include wet and/or dry etching processes to transfer the openings of the resist layer to the underlying layer. In some embodiments, additional etch masks may be used between the resist layer and the target layer (in this case, the dielectric layer 110). In some embodiments, the etching process utilizes an isotropic etch to pattern the trenches into the dielectric layer 10A. In some embodiments, via openings, corresponding to the subsequently formed vias 14 may be made to penetrate through the dielectric layer 10A, for example along one or more of the trenches.

After the trenches are formed, the BLs 12A are formed by depositing a conductive material in the trenches and vias 14 are formed by depositing the conductive material in the via openings. For example, a seed layer may be deposited in the openings and in the trenches and over the mask, a mask formed over portions of the seed layer, and then a plating process may be used to deposit the conductive material on exposed portions of the seed layer. Following the plating process, the mask may be removed, and the excess seed layer etched away. The BLs 12A correspond to wiring patterns running or extending in a lengthwise direction according to a row of a memory array. The conductive material of the BLs 12A and vias 14 may include any suitable material, such as ruthenium, copper, tin, tungsten, cobalt, aluminum, gold, titanium, titanium nitride, tantalum, tantalum nitride, and so forth, alloys thereof, combinations thereof, and the like. In some embodiments, a barrier layer may first be deposited to inhibit diffusion of the conductive material into the surrounding dielectric layer 10A. The barrier layer may be formed of any suitable material such as titanium nitride or the like and may be deposited by CVD, PVD, ALD, or another suitable process. In some embodiments, a planarization process may be used, such as a CMP process to level the upper surfaces of the BLs 12A with the upper surface of the dielectric layer 10A. Other processes may be used to form the BLs 12A and vias 14 in the dielectric layer 10A.

Figure 4B:
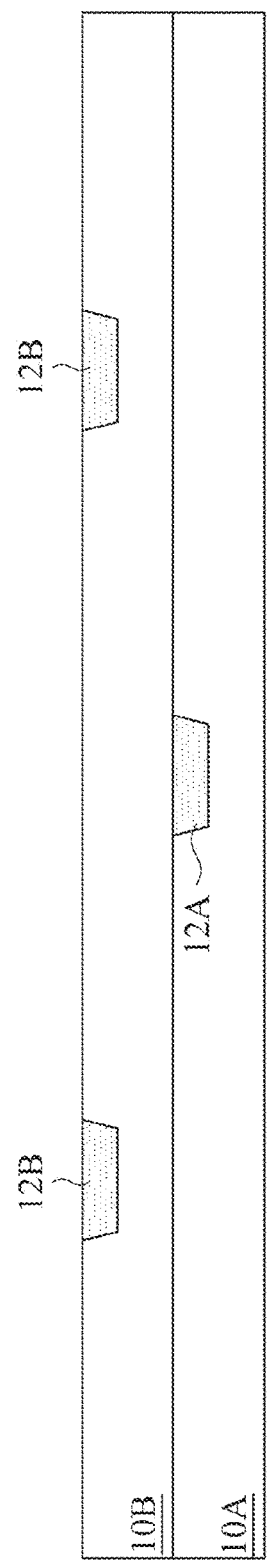
Figure 4A:
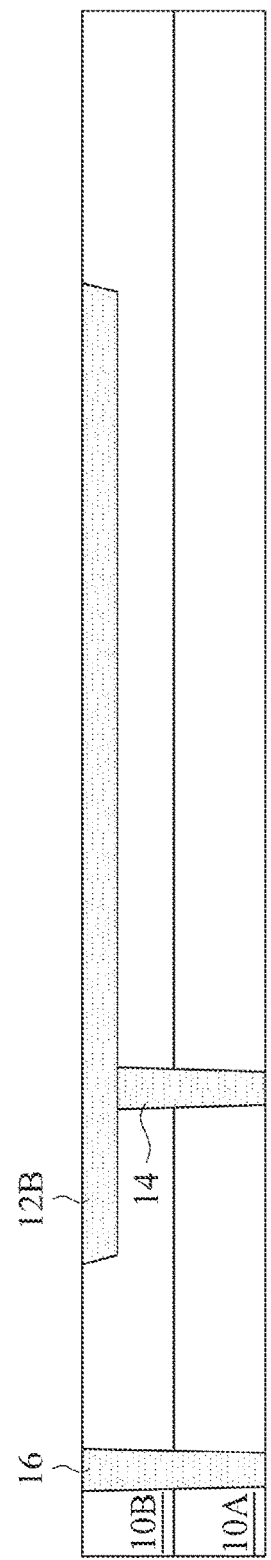

In FIGS. 4A, 4B, and 4C a second dielectric layer 10B is deposited over the dielectric layer 10A. The view in FIGS. 4A, 4B, and 4C follow from processes performed on the structure illustrated in FIGS. 3A, 3B, and 3C, respectively. The view of the substrate 2 and intervening layers (if used) is omitted in these and subsequent figures for the sake of simplicity. The dielectric layer 10B may be formed using processes and materials similar to those used to form the dielectric layer 10A. The BLs 12B and vias 14 (e.g., of FIG. 4A) may be formed using processes and materials similar to those used to form the BLs 12A and vias 14 described above. The BLs 12B correspond to wiring patterns running or extending in a lengthwise direction according to a row of a memory array. Similarly, the vias 13 and the vias 16 may be formed using processes and materials similar to those used to form the vias 14. The vias 13 are formed to extend through the dielectric layer 10B to contact the BLs 12A and the vias 16 are formed to extend through both the dielectric layer 10A and the dielectric layer 10B to contact underlying features. In particular, the vias 16 may be used for routing the source line (SL) wirings to underlying metallization patterns. FIG. 4B illustrates that the BLs may be separated into the BLs 12A and the BLs 12B, providing better separation than running or extending all the BLs in the same dielectric layer, which reduces parasitic capacitance between adjacent BLs. This, in turn, reduces the RC and increases the switching speed so that the read/write times of the memory is also increased.

In FIGS. 5A and 5B, a similar embodiment to that illustrated in FIGS. 4A, 4B, and 4C is provided except that the BLs 12 are contained within a single dielectric layer 10. The dielectric layer 10 may be formed using processes and materials similar to those used to form the dielectric layer 10A. The BLs 12 and vias 14 (e.g., of FIG. 5A) may be formed using processes and materials similar to those used to form the BLs 12A and vias 14 described above. Unless otherwise noted, the remaining Figures are illustrated with a single layer BL structure, however, it should be understood that the double layer BL structure illustrated with respect to FIGS. 4A, 4B, and 4C may instead be used in each of the subsequently illustrated embodiments.

Figure 6:
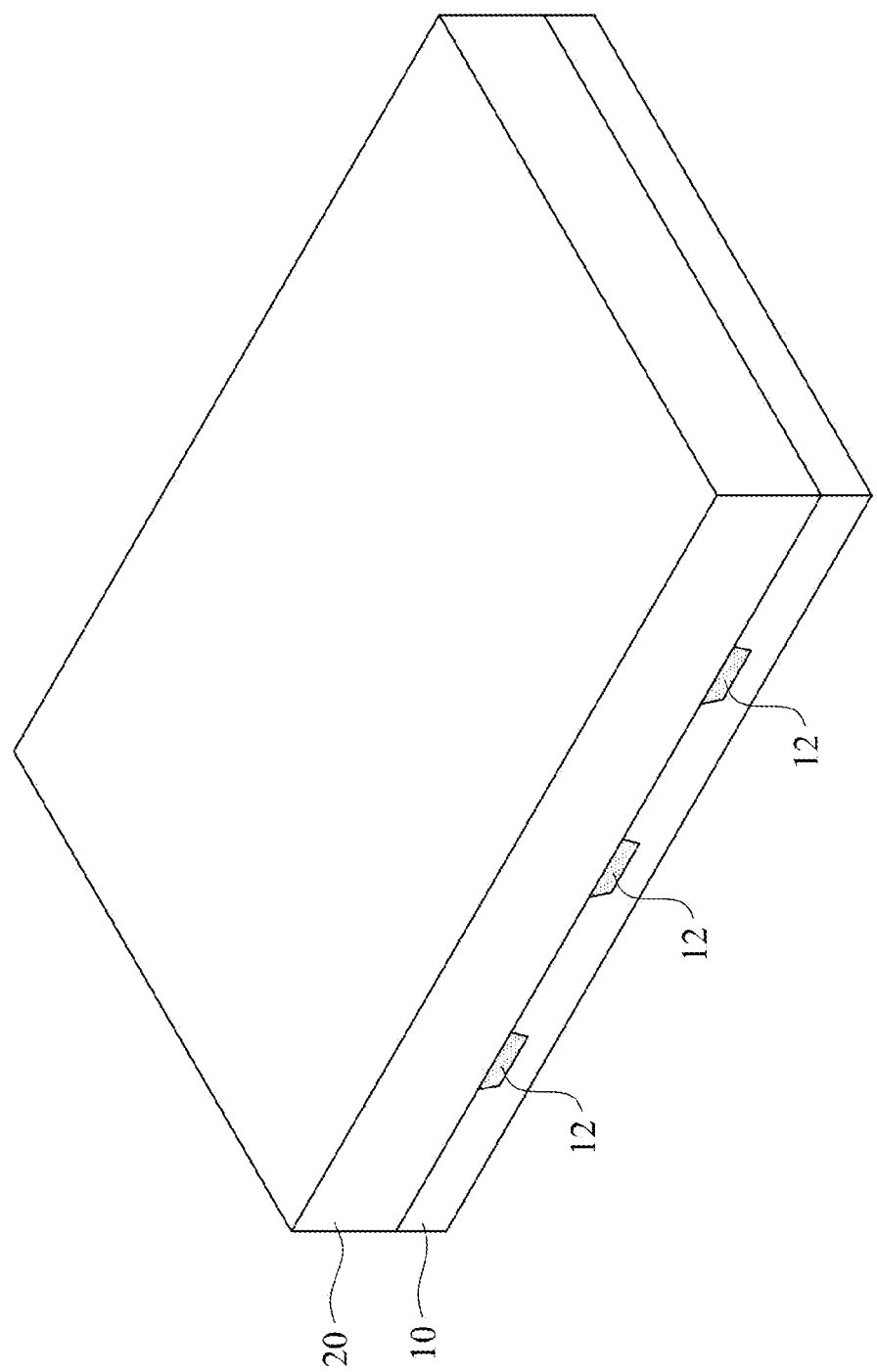

FIG. 6 is a perspective view of the structure illustrated in FIGS. 5A and 5B, after a semiconductor material layer 20 has been deposited over the dielectric layer 10 and the BLs 12. The view in FIGS. 7A and 7B follow from processes performed on the structure illustrated in FIGS. 5A and 5B, respectively. In FIGS. 7A and 7B a semiconductor material layer 20 is deposited over the dielectric layer 10 and the BLs 12. The semiconductor material layer 20 may be any suitable material, including any of those materials listed above for the substrate 2, or, for example, a semiconductor oxide, such as indium oxide (InO), zinc oxide (ZnO), gallium oxide (GaO), indium zinc oxide (IZO), indium tungsten oxide (IWO), indium tin oxide (ITO), indium zinc gallium oxide (IZGO), the like, or combinations thereof. In other embodiments, the semiconductor material layer 20 may include polysilicon in an amorphous or crystalline form.

The semiconductor material layer 20 may be deposited using any suitable deposition technique, such as CVD, PVD, molecular beam epitaxy (MBE), and so forth. In some embodiments, one or more dopants may be implanted in the semiconductor material layer 20 by an implantation process. In some embodiments, the dopants may be implanted by an implantation process after depositing the semiconductor material layer 20 and/or after patterning the semiconductor material layer 20 to form channel regions 22 (see FIGS. 8, 9A, and 9B). In some embodiments, where the semiconductor material layer 20 is epitaxially grown, the epitaxially grown materials may be in situ doped during growth, which may replace implantations or may be done in addition to implantations. In some embodiments, the implantation may be done at a subsequent process, for example, after shaping the semiconductor material layer 20. The implantation may use suitable n-type or p-type impurities, depending on the conductivity type desired. The n-type impurities may be phosphorus, arsenic, antimony, or the like implanted in the region to a concentration in the range of $10^{13}$ cm$^{-3}$ to $10^{14}$ cm$^{-3}$. The p-type impurities may be boron, boron fluoride, indium, or the like implanted in the region to a concentration in the range of $10^{13}$ cm$^{-3}$ to $10^{14}$ cm$^{-3}$. After the implantation, an anneal may be performed to repair implant damage and to activate the p-type and/or n-type impurities that were implanted.

Figure 8:
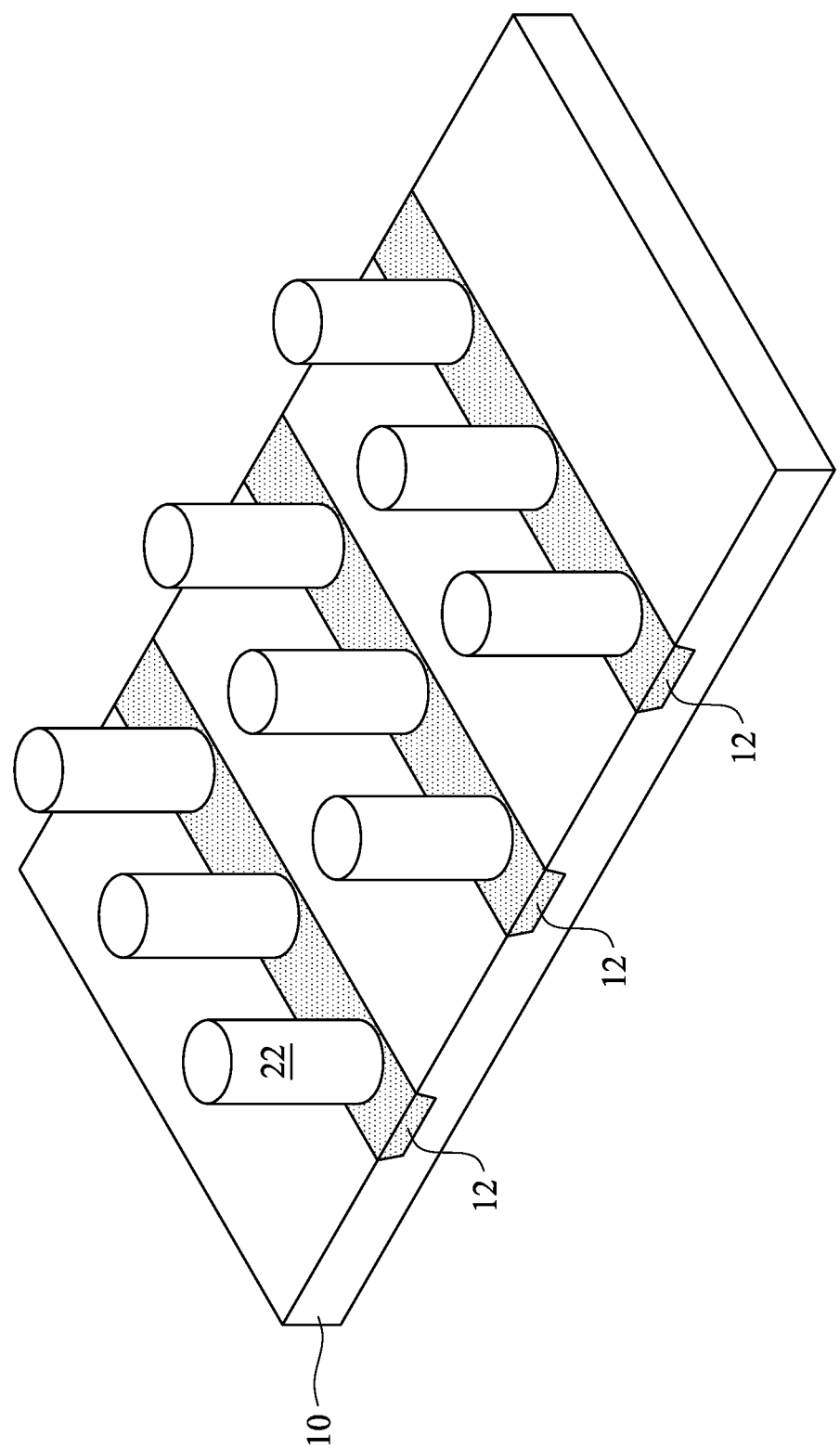
Figure 9D:
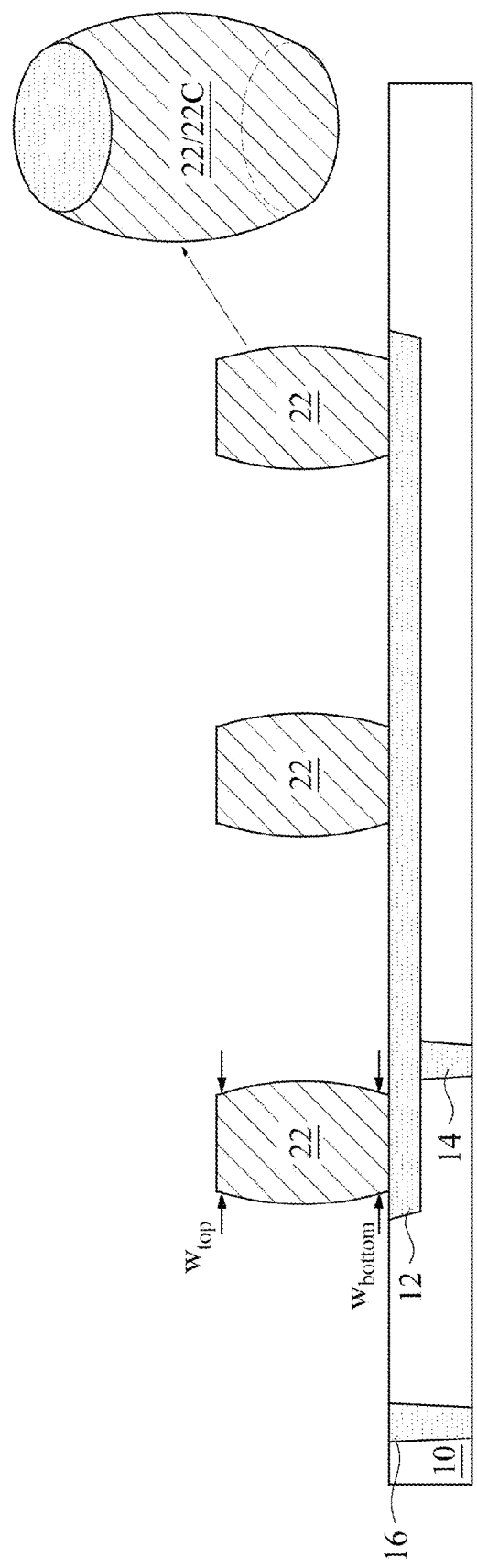
Figure 9C:
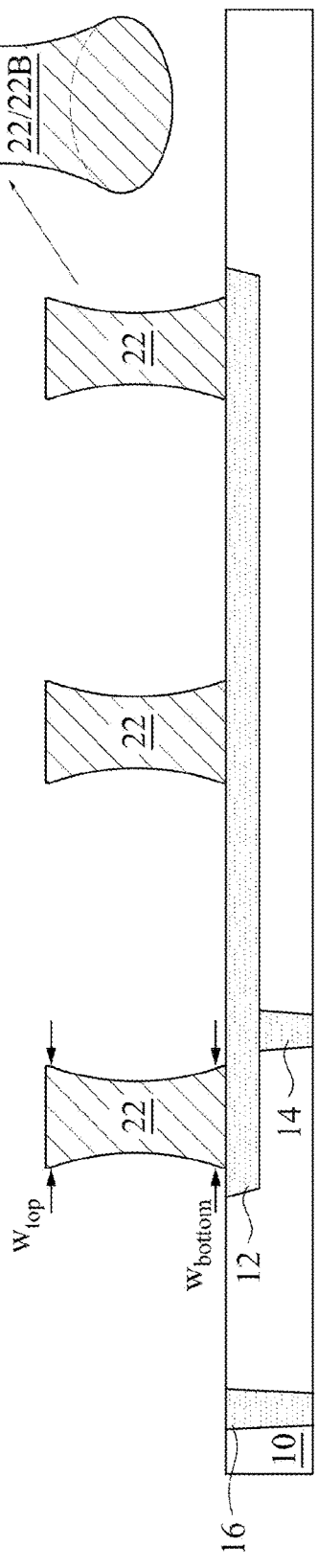
Figure 9E:
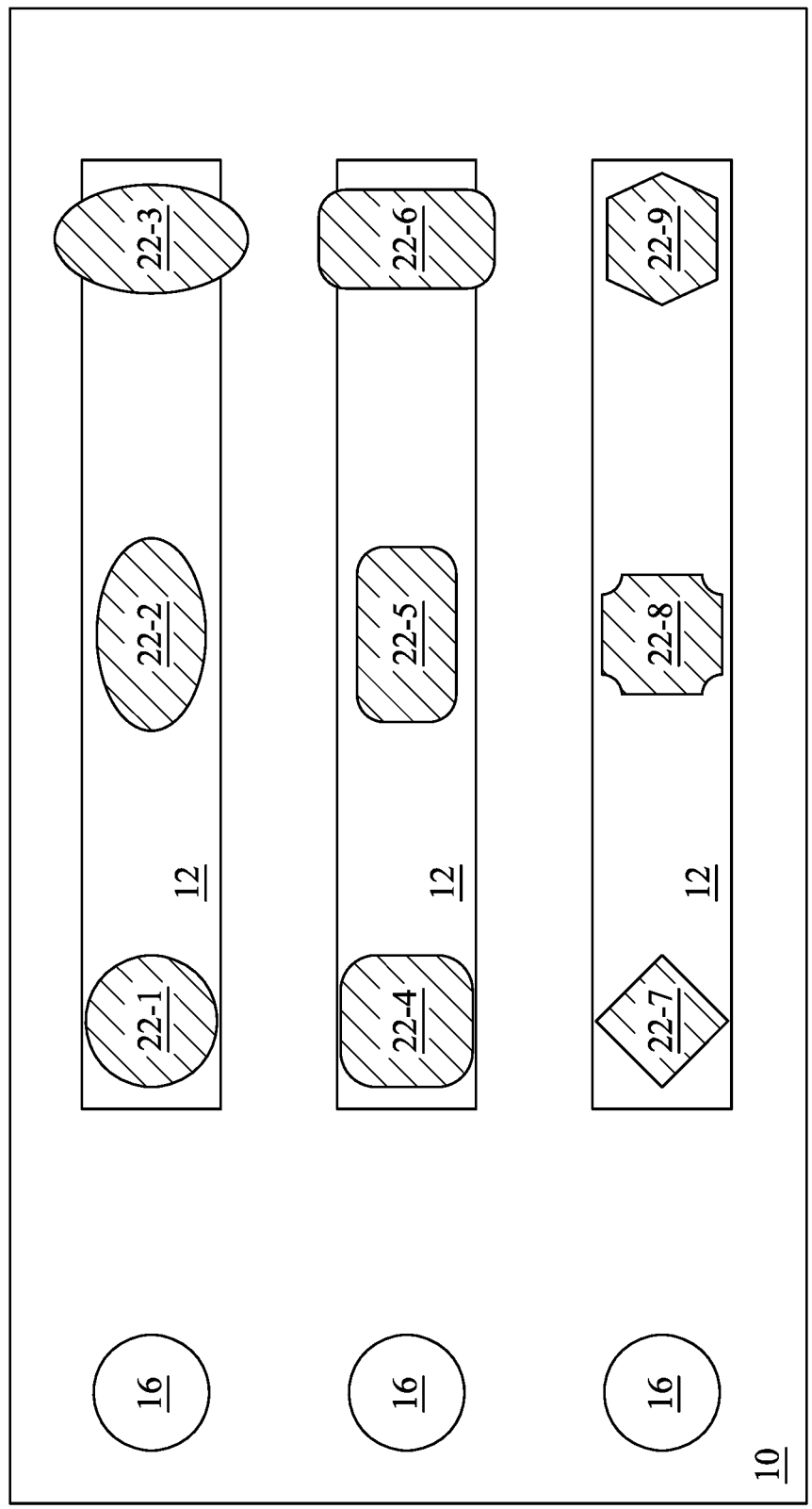

FIG. 8 is a perspective view of the structure illustrated in FIGS. 9A and 9B, after the semiconductor material layer 20 has been patterned into channel regions 22. The view in FIGS. 9A, 9B, 9C, and 9D follow from processes performed on the structure illustrated in FIGS. 7A and 7B. The view in FIG. 9E is a top down view of the structure illustrated in FIG. 8. FIGS. 9C and 9D illustrate various shapes of the sidewalls of channel regions 22 which may result from the patterning process, in accordance with some embodiments. FIG. 9E illustrates a combined view of various shapes of the upper surface of the channel region 22 which may result from the patterning process.

In FIGS. 9A and 9B, the semiconductor material layer 20 is patterned into pillars which are the channel regions 22. The patterning process may be performed by forming a photoresist mask over the semiconductor material layer 20, developing the photoresist mask to form openings therein corresponding to the portions of the semiconductor material layer 20 to be removed, and then etching the exposed semiconductor material layer 20, thereby leaving the pillars for channel region 22 behind. The etching process may use any suitable etchant selective to the material of the semiconductor material layer 20 and may use a wet etch or dry etch. As illustrated in FIGS. 9A and 9B, the resulting pillars 22/22A may have substantially vertical sidewalls. In FIGS. 9C and 9D, however, in some embodiments, the channel regions 22/22B may have sidewalls which are concave (such as illustrated in FIG. 9C) or convex (such as illustrated by the channel regions 22/22C in FIG. 9D). In some embodiments, the pillars for the channel region 22 may have sidewalls which are tapered so that they are narrower at the top and wider at the bottom (i.e., the width Wtop is less than the width Wbottom) or inverse tapered so that they are wider at the top and narrower at the bottom (i.e., the width Wtop is greater than the width Wbottom). Each of these differences may result from the etching process conditions used to remove the unwanted portions of the semiconductor material layer 20. It should be understood that a single embodiment may realize any combination of these types of sidewalls for the channel region 22.

FIG. 9E illustrates a top down view which provides various configuration of the top down shape of the channel regions 22. Although the various configurations are illustrated in one Figure, it should be understood that they need not all be present in a single embodiment (though they may all be present in a single embodiment). Embodiments may contain a combination of any number of any of the illustrated shapes or their like, depending on the masking and etching processes used to create the channel region 22 pillars. The below described shapes need not be perfect representations as such and should be understood to allow some error, for example, of about 0% to 30% for any given measurement from an ideal representation of that measurement. The shape of the channel region 22-1 illustrates that the channel region may have a circular outline in top down view. The shape of the channel regions 22-2 and 22-3 illustrate that the channel region may have an elliptical outline (or elongated circular outline) in top down view (these may be disposed horizontal (e.g., 22-2), vertical (e.g., 22-3), or at any angle in between). The shape of the channel region 22-4 illustrates that the channel region may have a square outline in top down view which may also optionally have rounded corners, such as illustrated. The shape of the channel regions 22-5 and 22-6 illustrate that the channel region may have a rectangular outline in top down view (these may be disposed horizontal (e.g., 22-5), vertical (e.g., 22-6), or at any angle in between). The shape of the channel region 22-7 illustrates that the channel region may have a diamond-like or rhombus-like outline in top down view which may also optionally have rounded corners. The shape of the channel region 22-8 illustrates that the channel region may have a square (or rectangular) outline in top down view which may also optionally have inverted rounded corners, such as illustrated. The shape of the channel region 22-9 illustrates that the channel region may have other polygon outlines, such as a triangle, pentagon, hexagon, etc., in top down view which may also optionally have rounded corners.

Figure 10B:
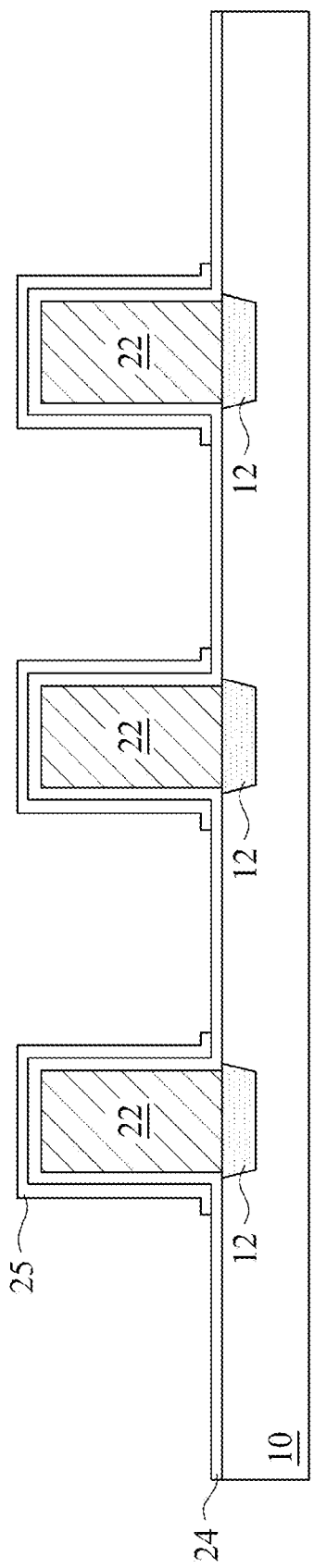
Figure 10A:
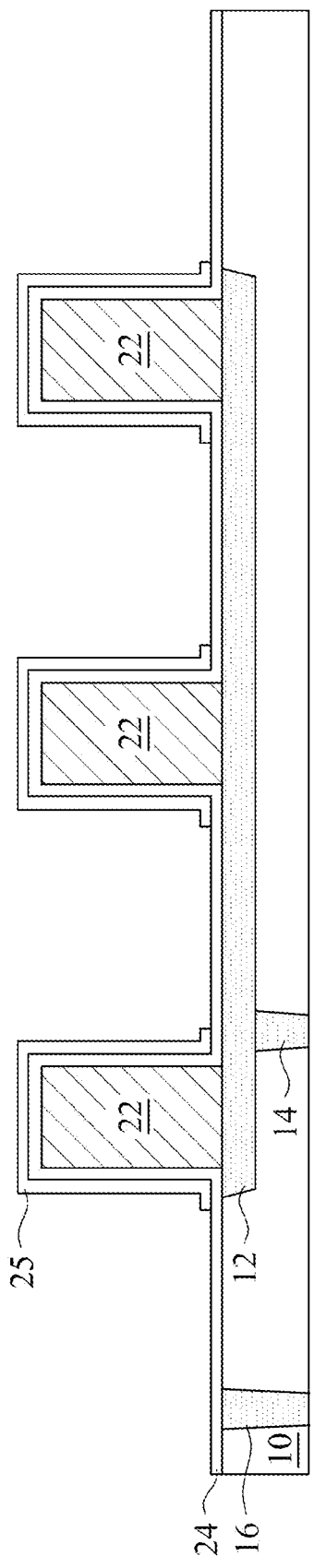

FIGS. 10A and 10B are cross-sectional views of the structure illustrated in FIG. 8 after a gate dielectric 24 and work function layers 25 have been deposited over the channel regions 22. The view in FIGS. 10A and 10B follow from processes performed on the structure illustrated in FIGS. 9A and 9B. The gate dielectric 24 may include silicon oxide, silicon nitride, or multilayers thereof. In some embodiments, the gate dielectric 24 may also or instead include a high-k dielectric material. In such embodiments, gate dielectric 24 may have a k value greater than about 7.0, and may include a metal oxide or a silicate of hafnium (Hf), aluminum (Al), zirconium (Zr), lanthanum (La), magnesium (Mg), barium (Ba), titanium (Ti), lead (Pb), combinations thereof, and the like. The formation methods of the gate dielectric 24 may include molecular beam deposition (MBD), ALD, PECVD, and the like. The gate dielectric 24 may laterally wrap around the channel regions 22 and provide electrical separation from a subsequently formed gate electrode.

After the gate dielectric 24 is formed, one or more work function layers 25 may optionally be formed over gate dielectric 24. Work function layers 25 may comprise different materials used to adjust the work function of the resulting gates to a desired value based on device design. In an embodiment, work function layers 25 may comprise one or more layers of titanium nitride (TiN), titanium aluminum (TiAl), titanium aluminum carbon (TiAlC), tantalum silicon (TaSi), combinations thereof, or the like. Following the deposition of the work function layers 25, the work function layers 25 may be patterned using an acceptable patterning process to separate the work function layers 25 over each of the channel regions 22. In some embodiments, such as illustrated in FIG. 10B, the work function layers 25 may span multiple channel regions 22 in an array of channel regions 22. In the remaining Figures, for the sake of simplicity, the view of the work function layers 25 is omitted.

Figure 11B:
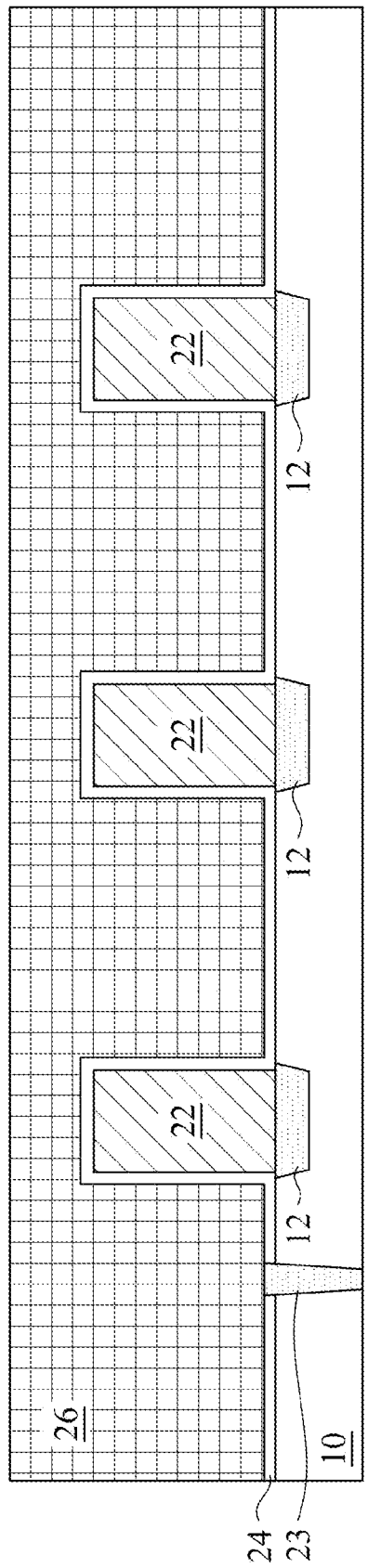
Figure 11A:
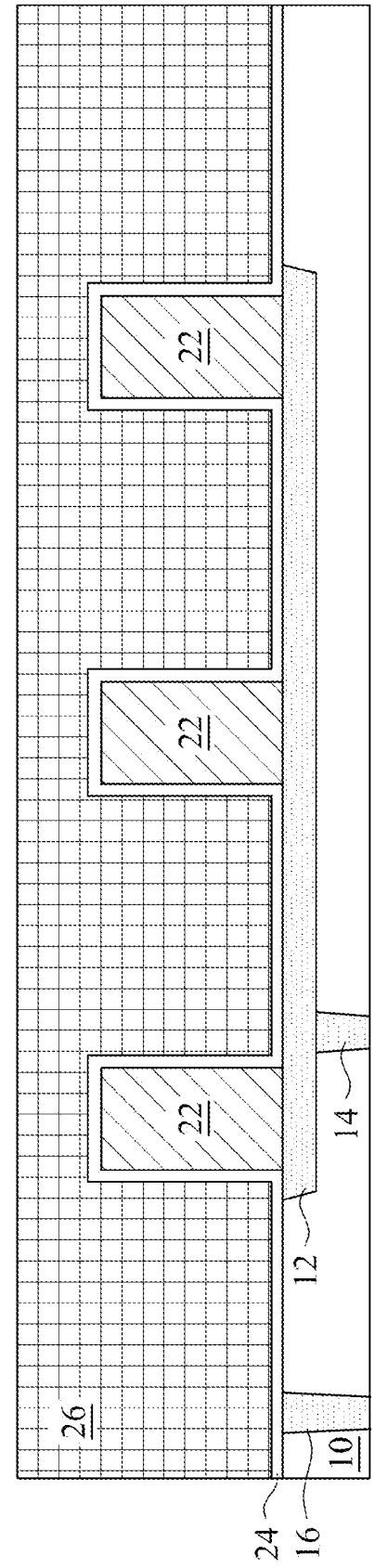

FIGS. 11A and 11B illustrate the deposition of a conductive gate electrode layer 26 over the gate dielectric 24 using a suitable deposition process such as MBD, ALD, PECVD, and the like. The gate electrode layer 26 laterally wraps around the gate dielectric 24. The view in FIGS. 11A and 11B follow from processes performed on the structure illustrated in FIGS. 10A and 10B, respectively. As illustrated in FIGS. 11A and 11B, the conductive gate electrode layer 26 may be deposited to a thickness greater than a height of the channel regions 22. The gate electrode layer 26 may include a metal-containing material such as titanium nitride (TiN), tantalum nitride (TaN), titanium aluminum nitride (TiAlN), tungsten (W), titanium aluminum carbo-nitride (TiAlCN), tantalum carbon (TaC), cobalt (Co), ruthenium (Ru), aluminum (Al), combinations thereof, multi-layers thereof, and the like. In some embodiments, prior to depositing the gate electrode layer 26, a WL via 23 may be formed through the gate dielectric 24 and underlying dielectric layer 10 to couple to an underlying conductive feature, such as a metallization for routing a WL signal. The WL via 23 may be made by an acceptable photopatterning process that patterns an opening through the gate dielectric 24 and dielectric layer 10 to expose an underlying conductive feature. Then a conductive material may be formed using processes and materials similar to those described above with respect to the vias 14 and/or 16.

Figure 12:
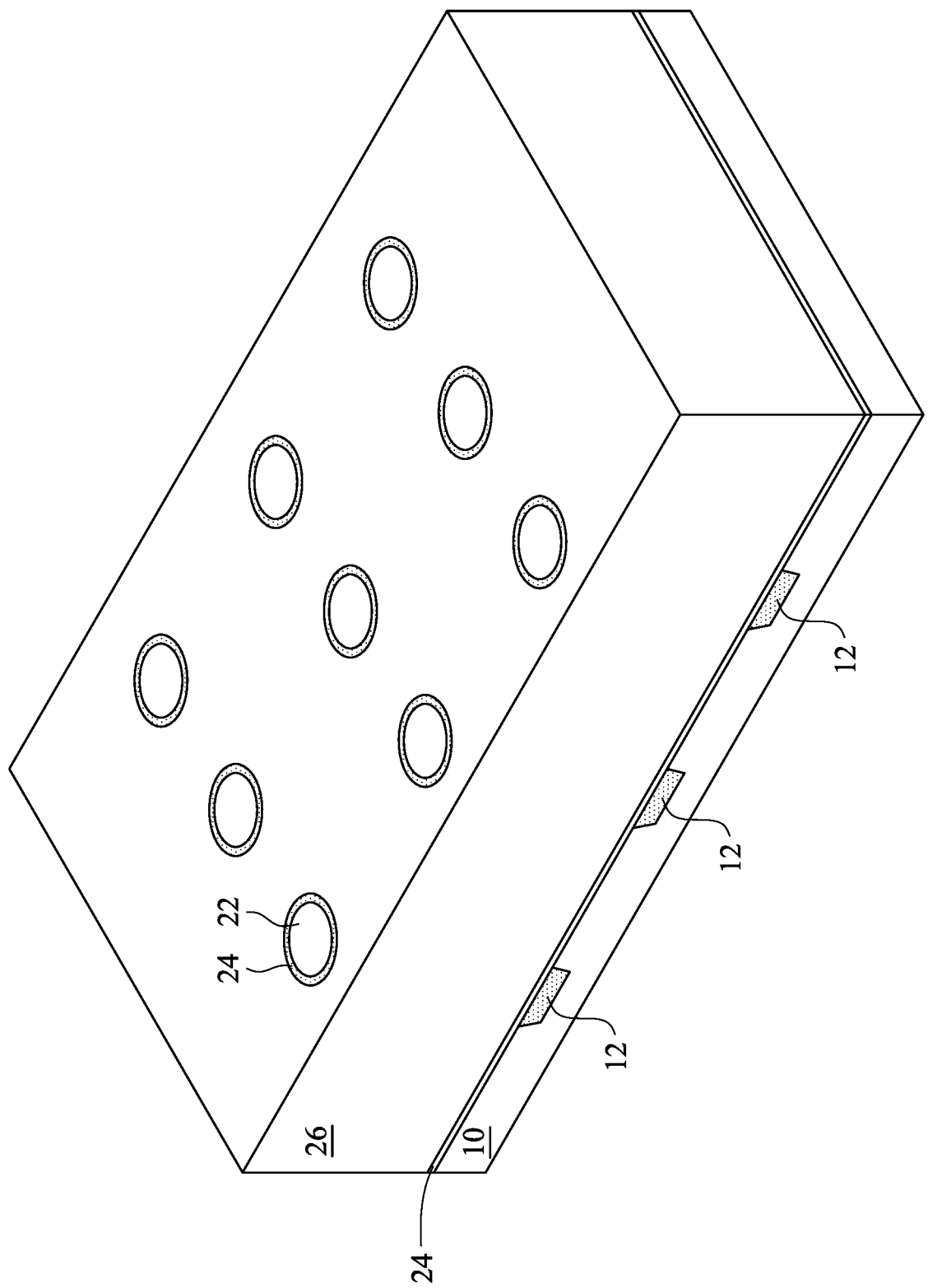

FIG. 12 is a perspective view of the structure illustrated in FIGS. 13A and 13B, after a planarization process has been performed on the gate electrode layer 26 to flatten the gate electrode layer 26 and to level the gate electrode layer 26 so that an upper surface of the gate electrode layer 26 is level with an upper surface of the channel regions 22 and an upper surface of the gate dielectric 24. The view in FIGS. 13A and 13B follow from FIGS. 11A and 11B, respectively. The planarization process may remove upper portions of the gate dielectric 24 (and work function layers 25, if used) as well as a portion of the channel regions 22. The planarization process may utilize any suitable processes, such as a CMP process, etch back process, or combinations thereof.

Figure 14:
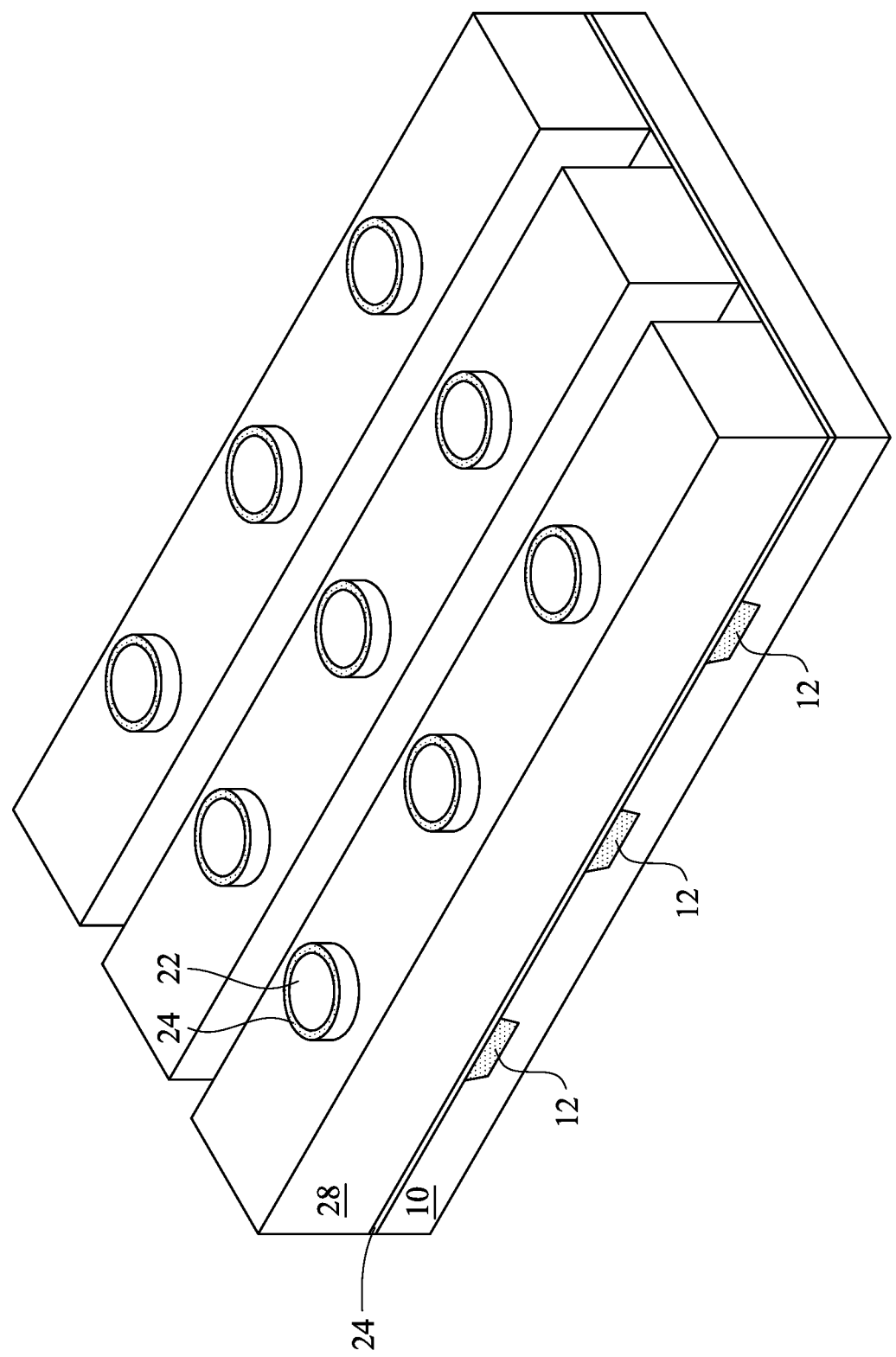
Figure 15C:
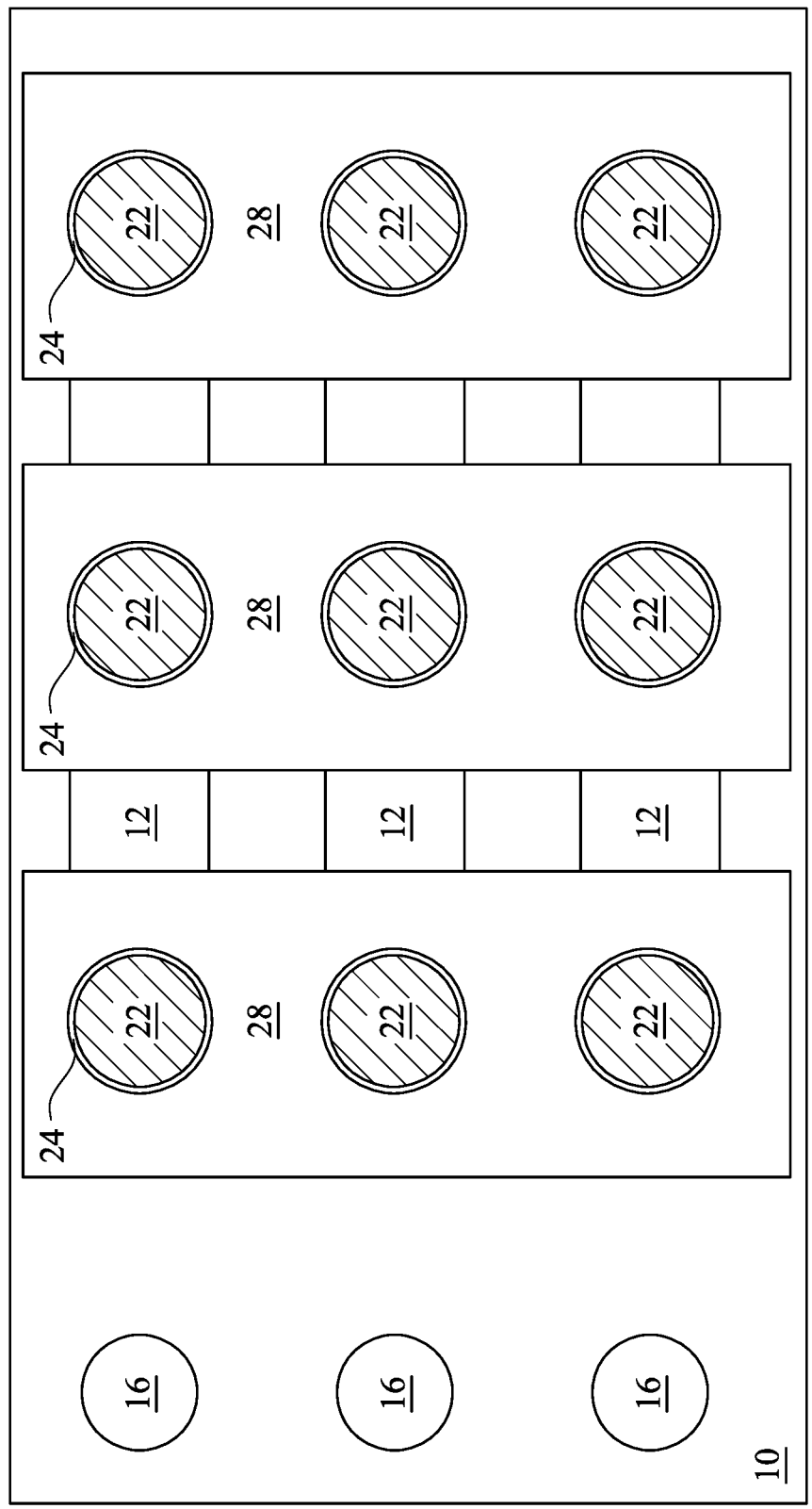

FIG. 14 is a perspective view of the structure illustrated in FIGS. 15A, 15B, and 15C after the gate electrode layer 26 is recessed and etched to form wordlines (WLs) 28 wiring patterns, the WLs 28 running or extending in a lengthwise direction corresponding to columns of the memory array. The view in FIGS. 15A and 15B follow from processes performed on the structure illustrated in FIGS. 13A and 13B, respectively. The view in FIG. 15C is a top down view. In FIGS. 14, 15A, 15B, and 15C an etching process is used to recess the upper surface of the gate electrode layer 26 (and work function layers 25, if used) to expose an upper portion of the gate dielectric 24 and channel regions 22 from gate electrode layer 26 and to provide vertical separation from the upper surface of the channel regions 22 from the gate electrode layer 26. The etching process may include the use of a suitable etchant for the gate electrode layer 26. In addition, in FIGS. 14, 15A, 15B, and 15C a patterning process is used to separate portions of the gate electrode layer 26 from other portions of the gate electrode layer 26 to form WLs 28. The WLs 28 may be arranged as illustrated so that an array of gates are coupled together to a single WL signal, which when activated, switches the entire array of gates simultaneously. The patterning process may include forming a photoresist over the gate electrode layer 26, patterning openings in the photoresist, and using the photoresist as a mask to etch the gate electrode layer 26 to form WLs 28 which include the gate electrodes wrapping all around the channel regions 22 (separated by the gate dielectric 24 and work function layers 25, if used). After patterning the WLs 28, the photoresist may be removed by a suitable process, such as by an ashing process. The recessing and patterning process may be performed in either order.

Figure 16A:
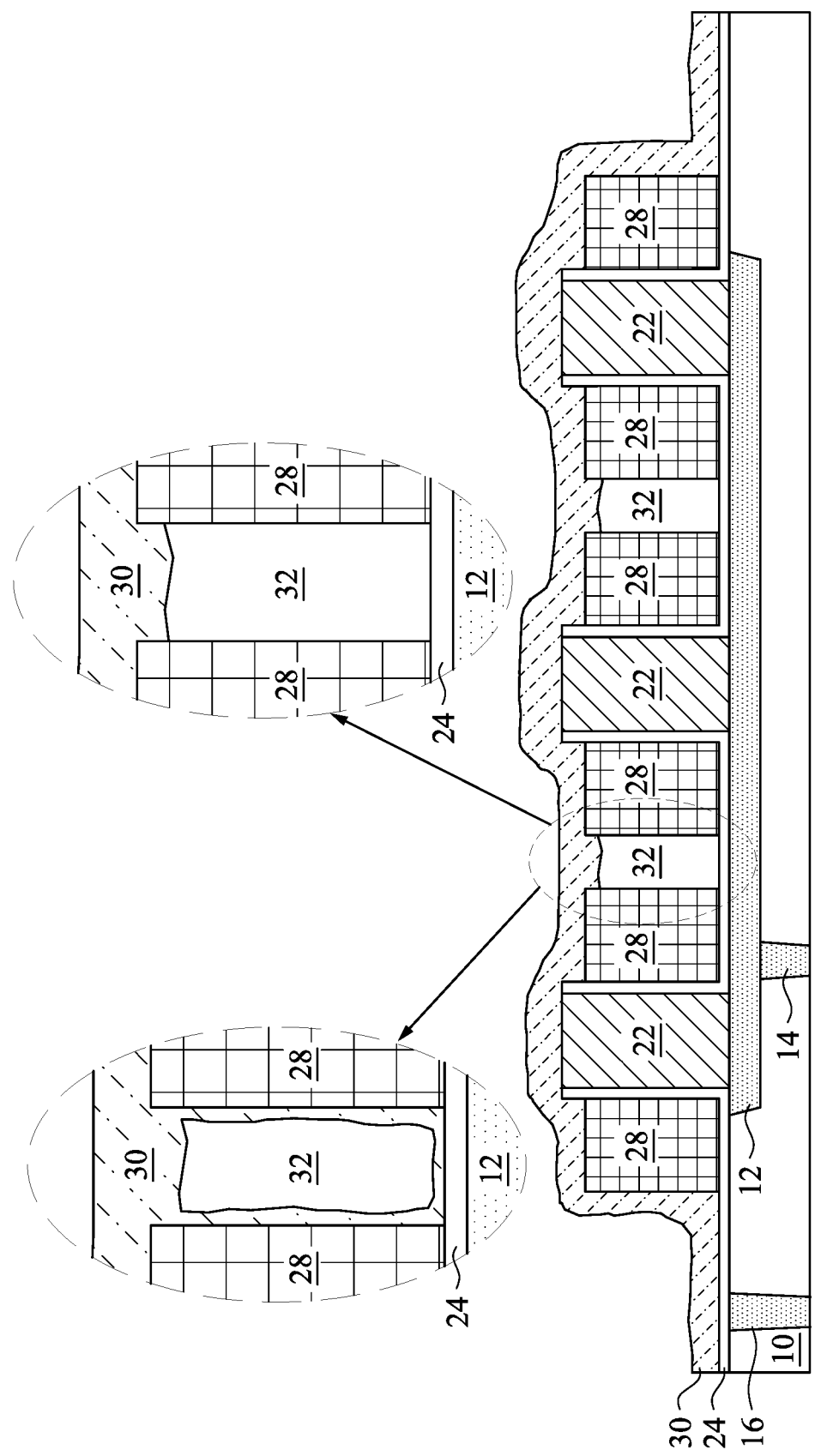
Figure 16C:
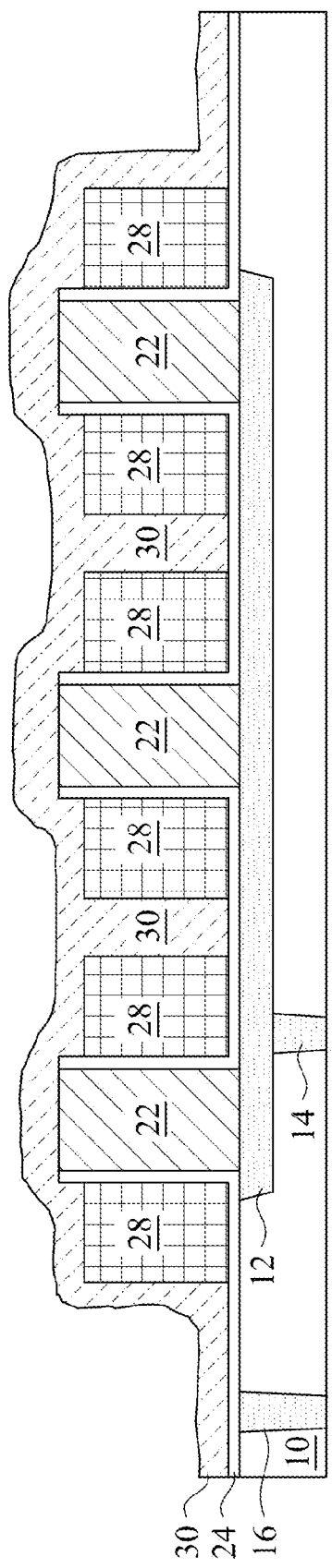
Figure 16B:
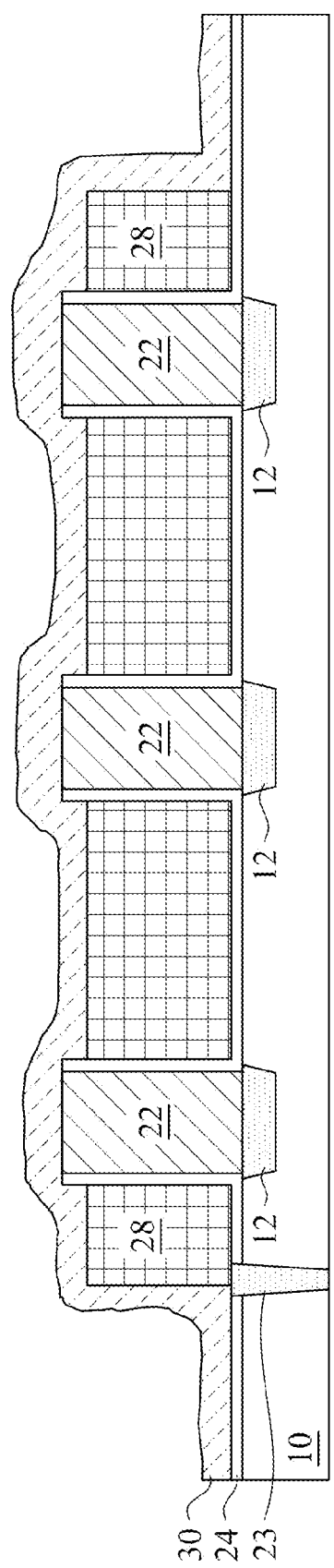

FIGS. 16A, 16B, and 16C illustrate an intermediate stage of a deposition of a first interlayer dielectric (ILD) layer 34 (see FIGS. 17A, 17B, and 17C), illustrated as the partial ILD layer 30. The view in FIGS. 16A and 16B follow from processes performed on the structures illustrated in FIGS. 15A and 15B, respectively, in accordance with some embodiments. The view in FIG. 16C is similar to that of FIG. 16A, in accordance with other embodiments. In FIGS. 16A and 16B, the partial ILD layer 30 is deposited by a CVD process that causes the partial ILD layer 30 to merge over the slit between adjacent WLs 28, thereby forming an air gap 32 between adjacent WLs 28. The air gap 32 provides high dielectric separation between the adjacent WLs 28, which in turn causes less leakage between WLs 28. As illustrated in the call out of the enlarged oval on the left, in some embodiments, the air gap 32 may be lined with a thin layer of the material of the partial ILD layer 30. As illustrated in the call out of the enlarged oval on the right, in some embodiments, the air gap 32 may have sidewalls coinciding with the sidewalls of the WLs 28 and a bottom surface coinciding with the upper surface of the gate dielectric 24. The material of the partial ILD layer 30 may be any suitable insulating material, such as silicon oxide, silicon oxycarbide, silicon carbide, silicon nitride, silicon carbonitride, silicon oxycarbonitride, and so forth, or combinations thereof.

In FIG. 16C, instead of forming the air gap 32, the partial interlayer dielectric (ILD) layer 30 fills the slit between adjacent WLs 28. The partial ILD layer 30 may be deposited using any suitable deposition technique, such as PVD, ALD, and so forth.

Figure 17A:
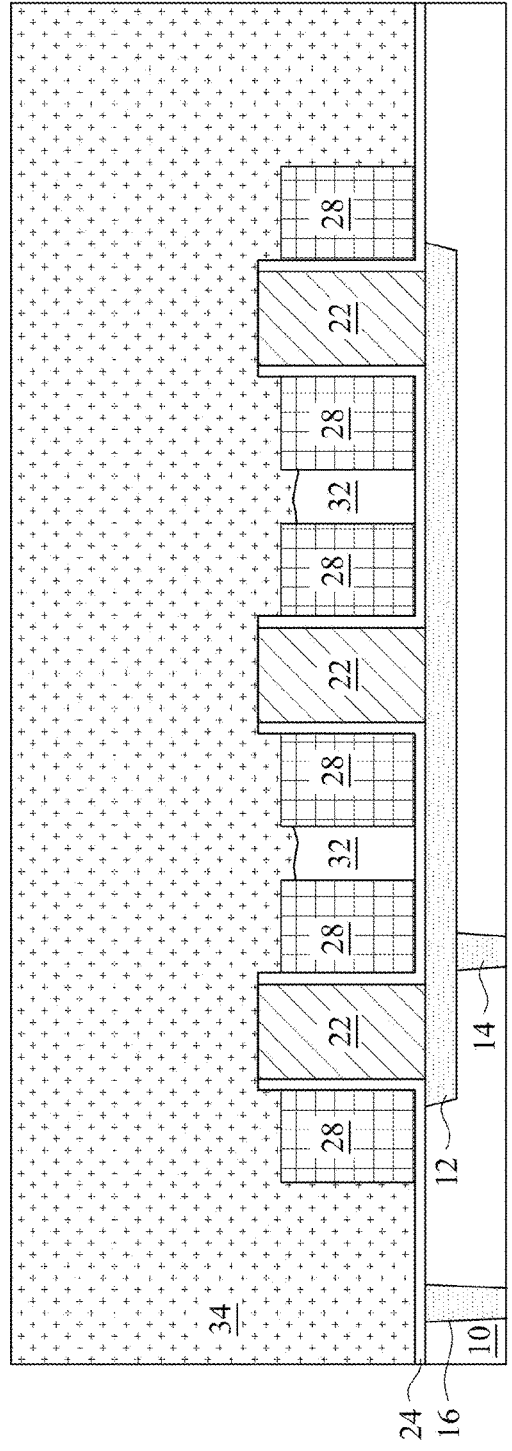
Figure 17B:
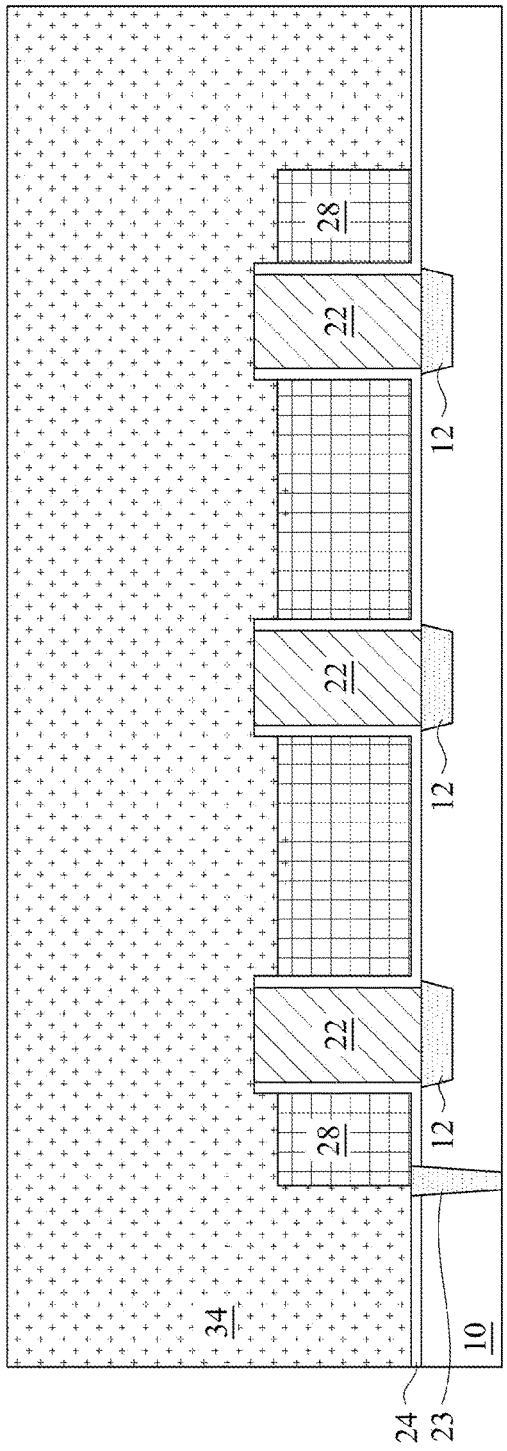
Figure 17C:
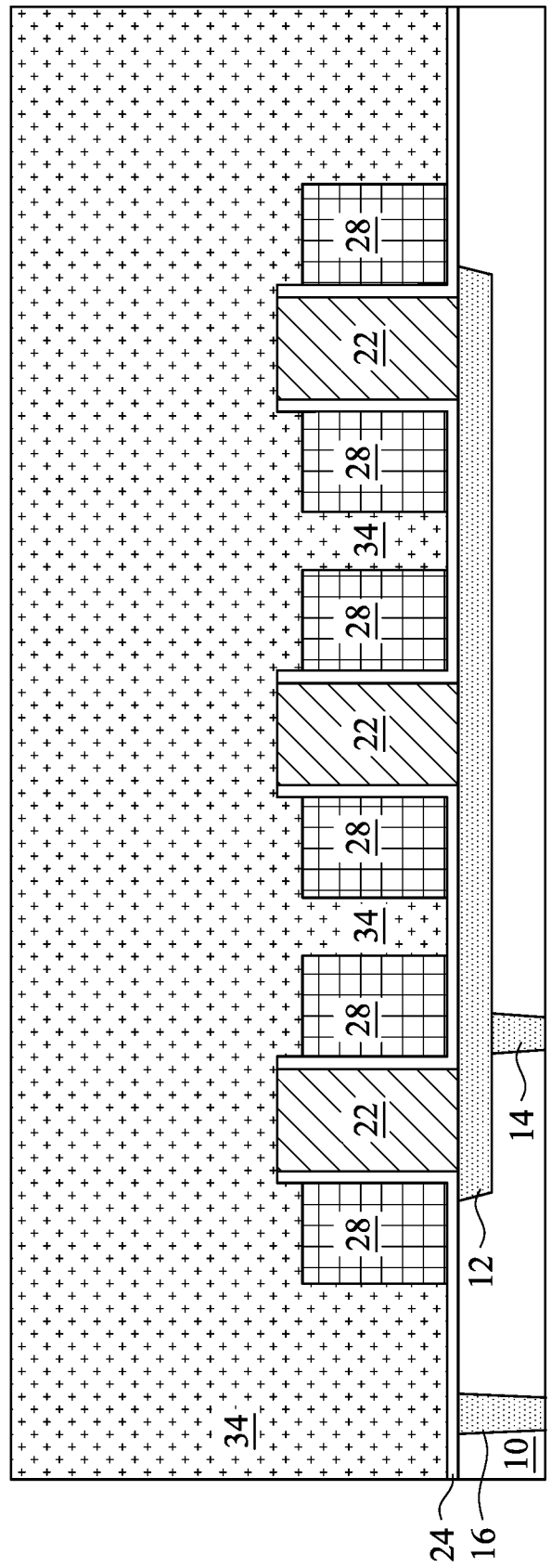

FIGS. 17A, 17B, and 17C illustrate the completion of the deposition of the first ILD 34. The view in FIGS. 17A, 17B, and 17C follow from processes performed on the structures illustrated in FIGS. 16A, 16B, and 16C, respectively, in accordance with some embodiments. In FIGS. 17A, 17B, and 17C, the deposition process for forming the partial ILD layer 30 may be continued to form the first ILD 34 so that the upper surface of the first ILD 34 is higher than the upper surfaces of the channel regions 22. The thickness of the first ILD 34 over the channel regions 22 will provide vertical spacing for forming a vertical capacitor over the channel regions 22. In FIG. 17A the air gap 32 is maintained between adjacent WLs 28, in accordance with some embodiments. In FIG. 17C the material of the first ILD 34 fills the slit between adjacent WLs 28, in accordance with other embodiments. FIG. 17B can serve as a view for either FIG. 17A or 17C. Further illustrated embodiments depict the air gap 32 for the sake of simplicity, however, it should be understood that embodiments with the filled space between the adjacent WLs 28 (such as illustrated in FIG. 17C) may be substituted.

Following deposition of the first ILD 34, a planarization process may be performed, in accordance with some embodiments, to flatten the upper surface of the first ILD 34.

FIG. 18 is a perspective view of the structure illustrated in FIGS. 19A and 19B after forming openings 36 in the first ILD 34 over the channel regions 22. The view in FIGS. 19A and 19B follow from processes performed on the structures illustrated in FIGS. 17A and 17B, respectively. The openings 36 may be formed by an acceptable photo patterning process. In some embodiments, the width of the openings 36 at a bottom of the openings 36 is less than a width of the combination of the channel regions 22 and gate dielectric 24, for example, less than or equal to the width of the channel regions 22. As illustrated in FIGS. 19A and 19B, a thickness of the first ILD 34 between the WLs 28 and the bottom of the opening 36 provides electrical isolation from a subsequently formed capacitor in the opening 36.

Figure 20:
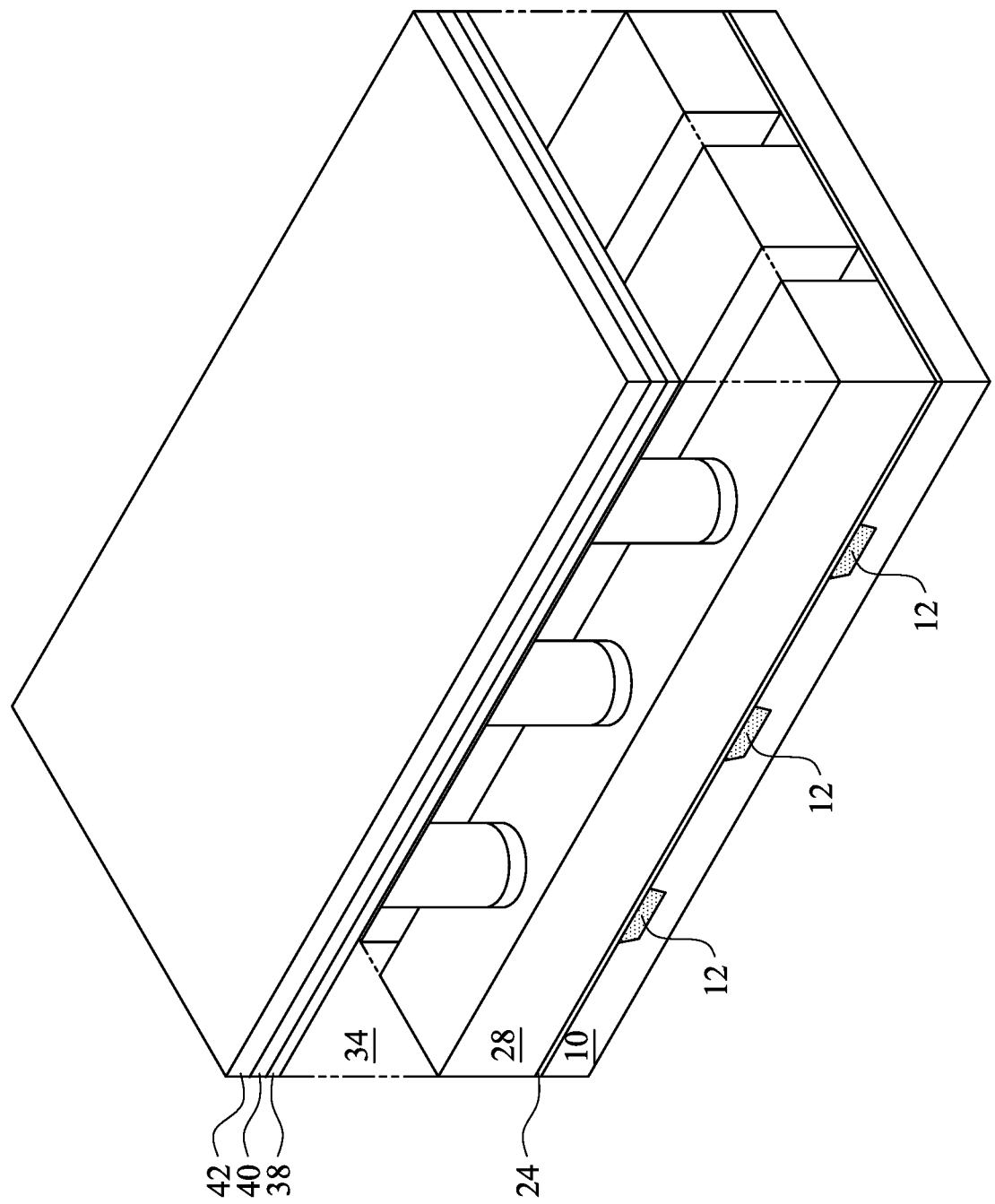
Figure 21A:
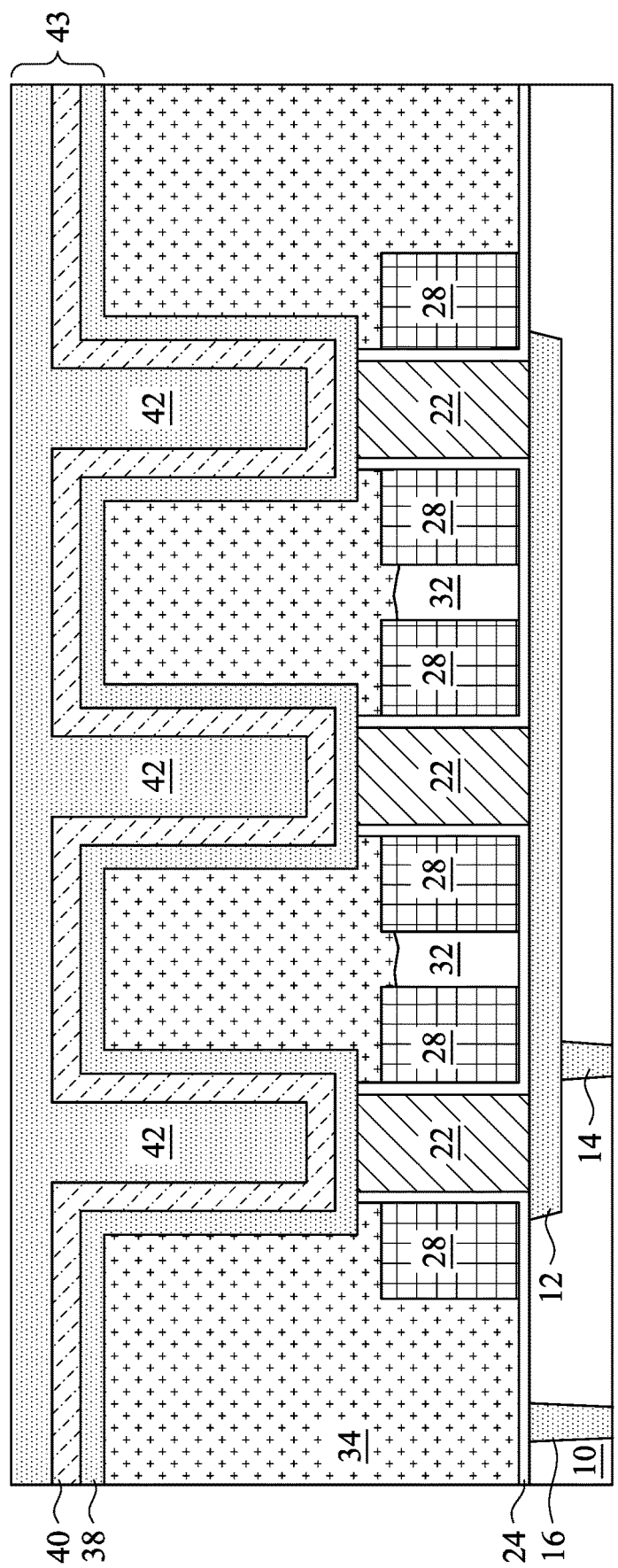
Figure 21B:
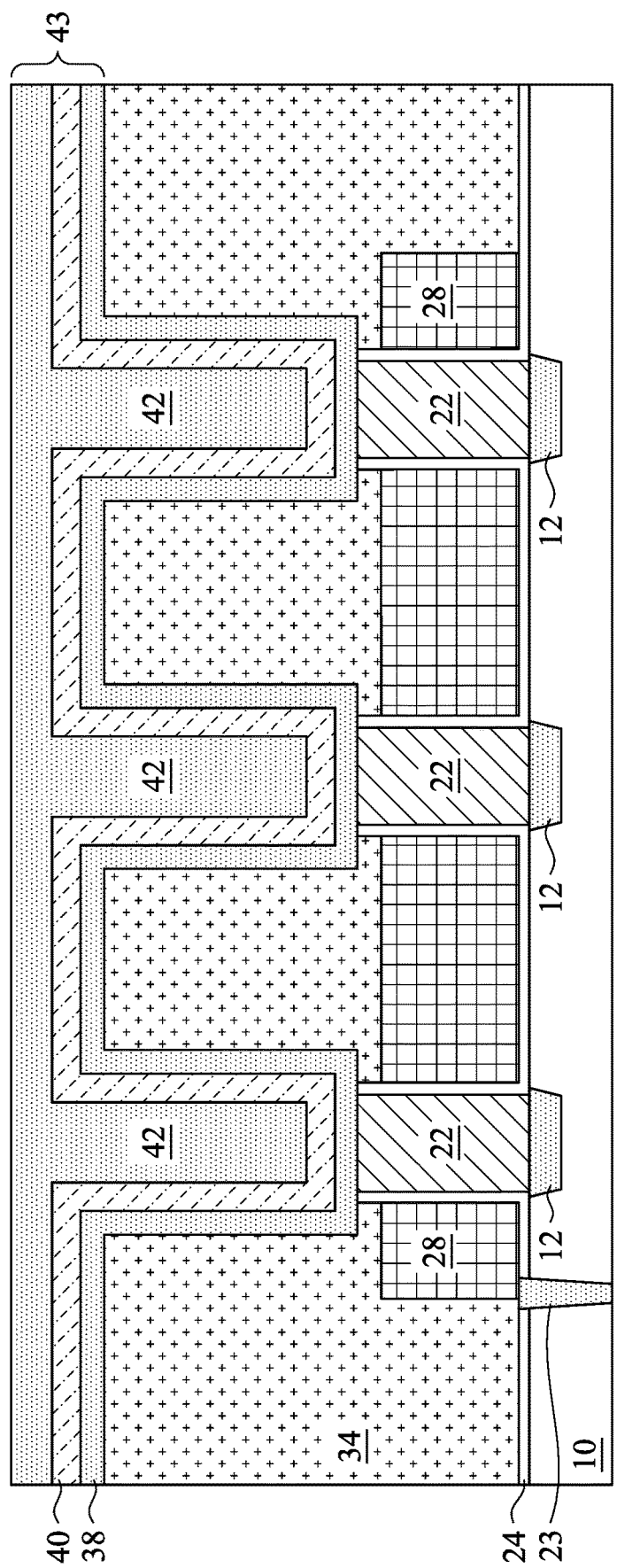

FIG. 20 is a perspective view of the structure illustrated in FIGS. 21A and 21B after forming capacitor layers in the openings 36 in the first ILD 34 over the channel regions 22. The view in FIGS. 21A and 21B follow from processes performed on the structures illustrated in FIGS. 19A and 19B, respectively. The openings 36 may be filled by depositing consecutive material layers forming metal-insulator-metal (MIM) cell capacitor structures over each of the channel regions 22. The material layers of the cell capacitor structures may be formed by any suitable process. In one process, a series of conformal layers are deposited in the openings 36 by a conformal deposition process, such as by ALD or CVD, or the like. The first such layer is a bottom electrode 38. Next, a capacitor dielectric 40 is deposited in the openings 36 on the bottom electrode 38. Finally, a top electrode 42 is deposited over the capacitor dielectric 40. The bottom electrode 38, the capacitor dielectric 40, and the top electrode 42 together are referred to as the cell capacitor 43.

The bottom electrode 38 may be made of any suitable conductive material, such as any of the candidate materials used to form the gate electrode layer 26, some of which are repeated here for example, titanium, titanium nitride, tantalum, a tantalum nitride, tungsten, cobalt, aluminum, or combinations thereof. The top electrode 42 may be made from any of the candidate materials as the bottom electrode 38, and may, in some embodiments, be made the same material as the bottom electrode 38. The capacitor dielectric 40 may include a nitride layer, a silicon nitride layer, or other dielectric material layers of high k dielectric constant. In some embodiments, the capacitor dielectric 40 is a silicon nitride layer deposited by low-temperature CVD or plasmaenhanced CVD (PECVD) methods. In some embodiments, the capacitor dielectric layer is one or more of the candidate materials discussed above for the gate dielectric 24.

Figure 22:
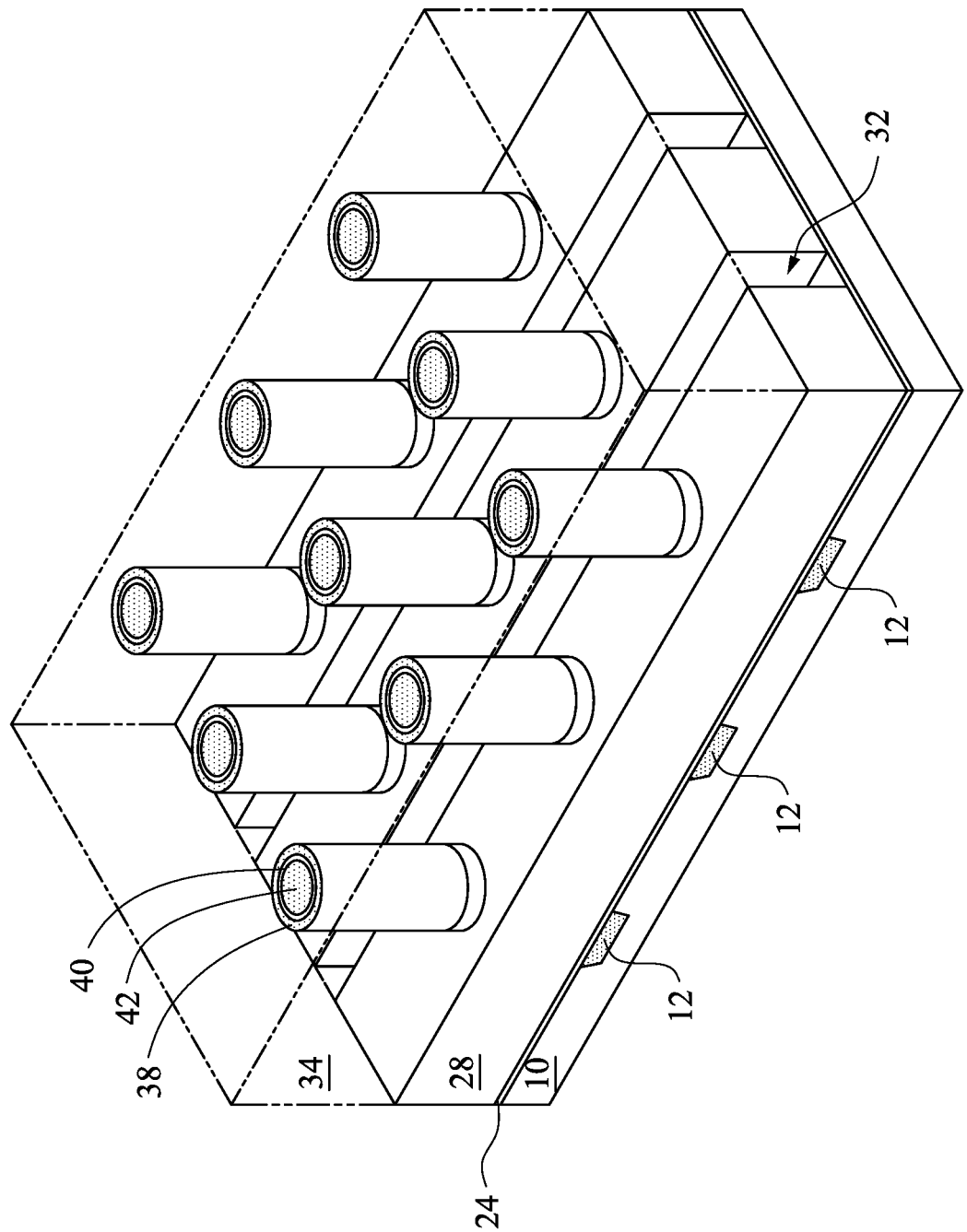
Figure 23A:
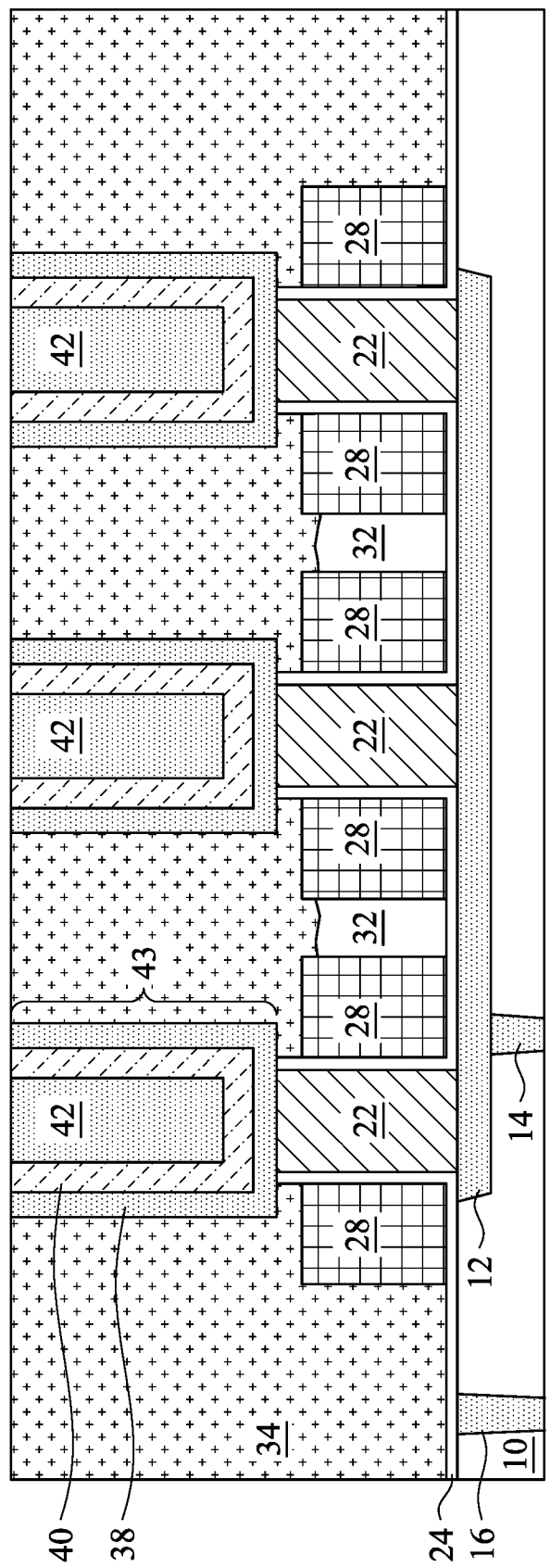
Figure 23B:
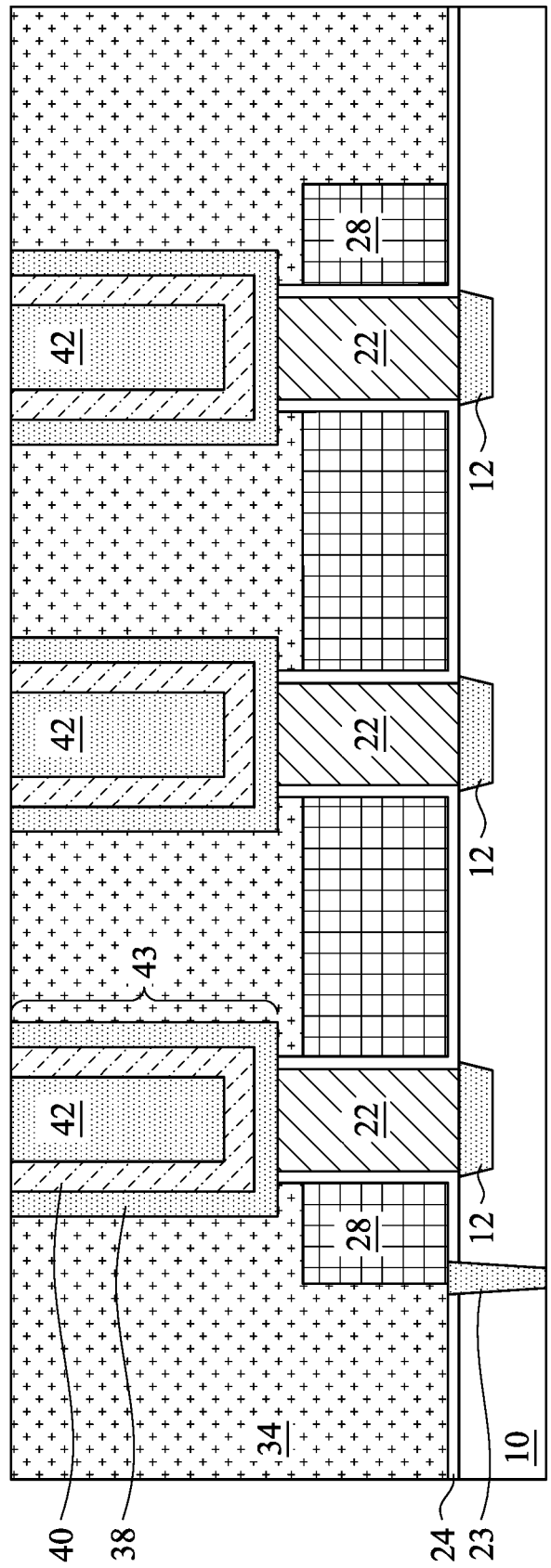
Figure 23C:
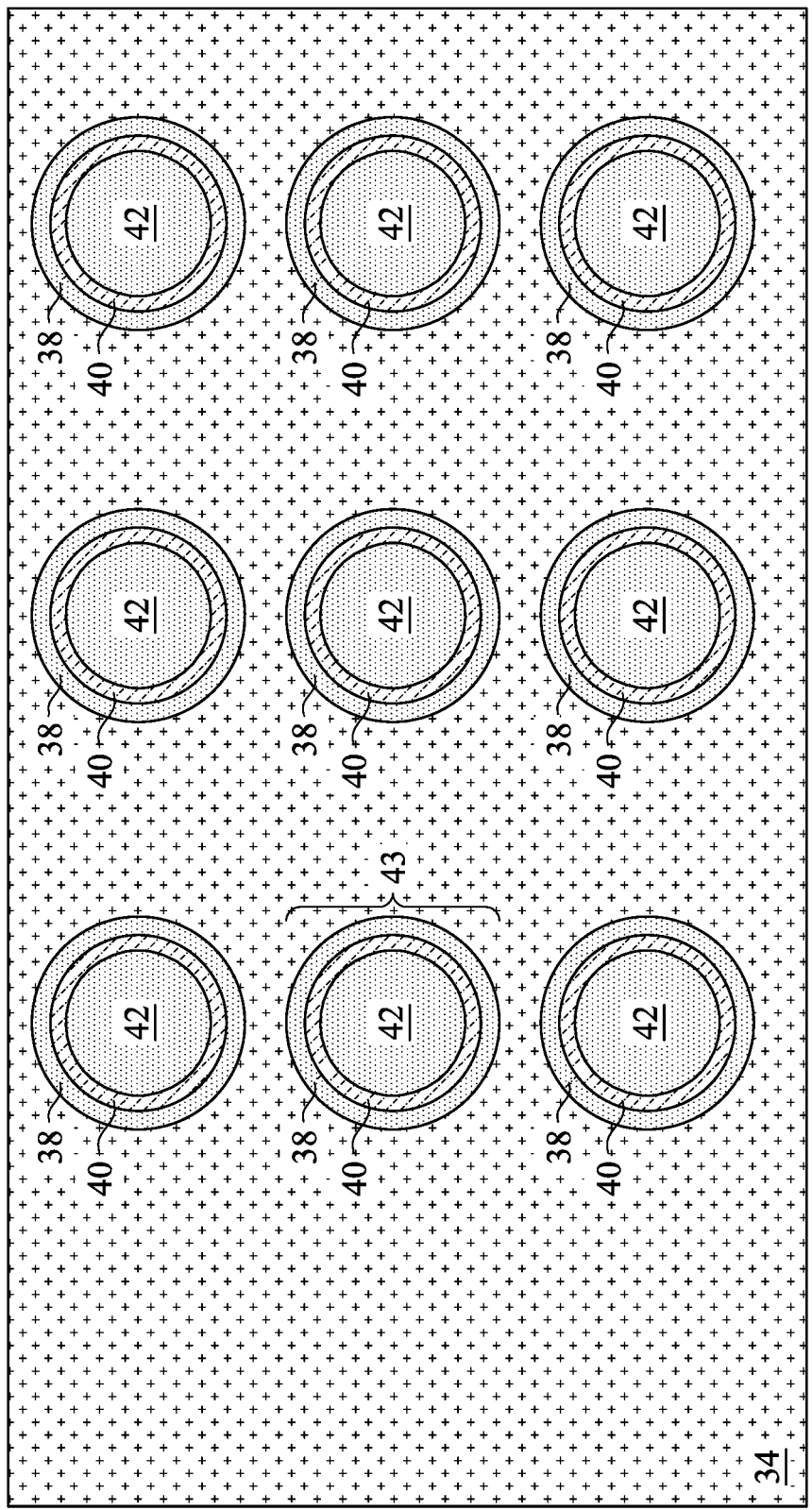

FIG. 22 is a perspective view of the structure illustrated in FIGS. 23A, 23B, and 23C after a planarization process is used to remove excess portions of the bottom electrode 38, capacitor dielectric 40, and top electrode 42, thereby forming the cell capacitors 43. The view in FIGS. 23A and 23B follow from processes performed on the structures illustrated in FIGS. 21A and 21B, respectively. The view in FIG. 23C is a top down illustration of the structure illustrated in FIG. 22. Following the formation of the top electrode 42, a planarization process may be used to remove excess materials from over the first ILD 34. The planarization process also levels the upper surfaces of the top electrode 42, the capacitor dielectric 40, and the bottom electrode 38.

Figure 24A:
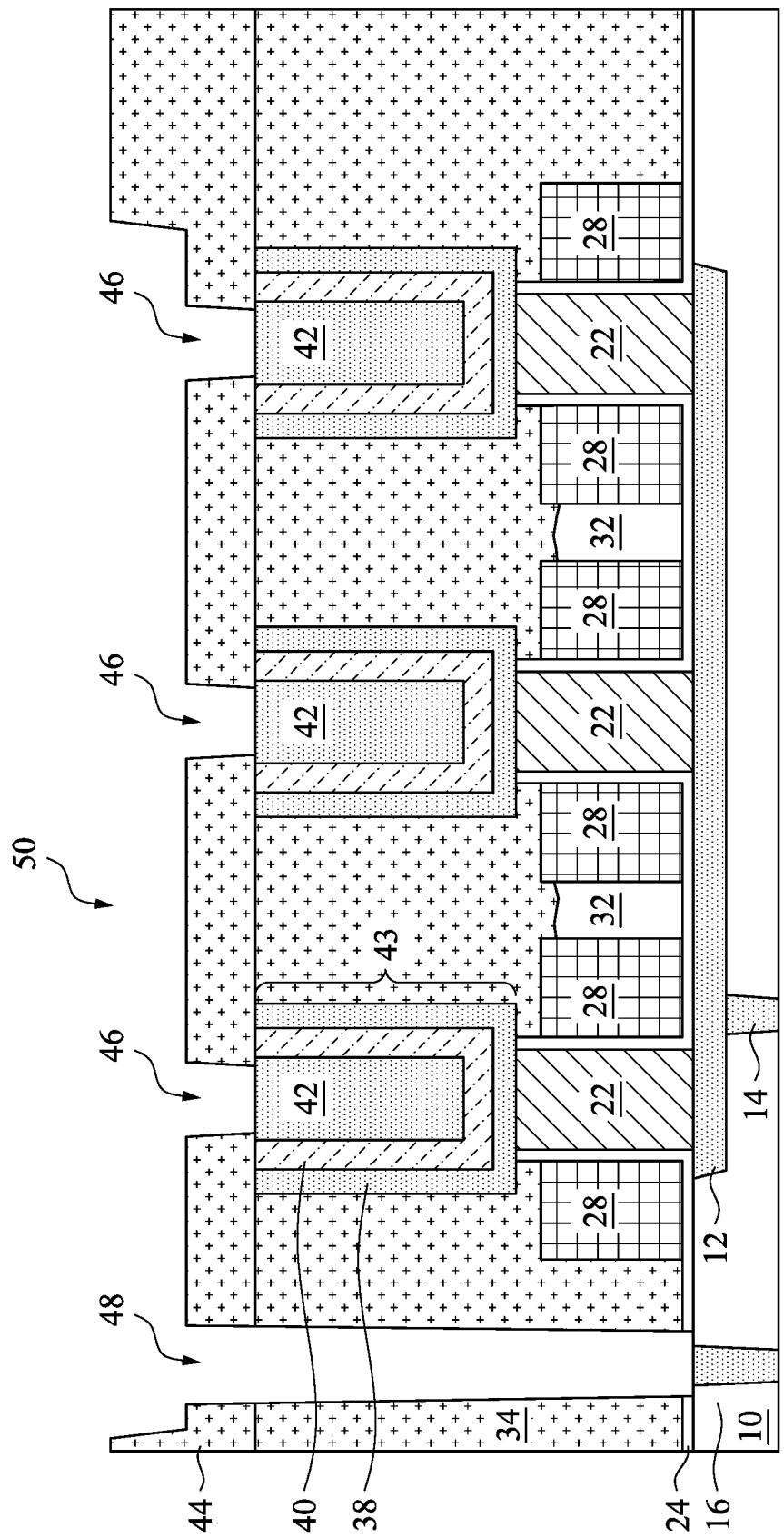
Figure 24B:
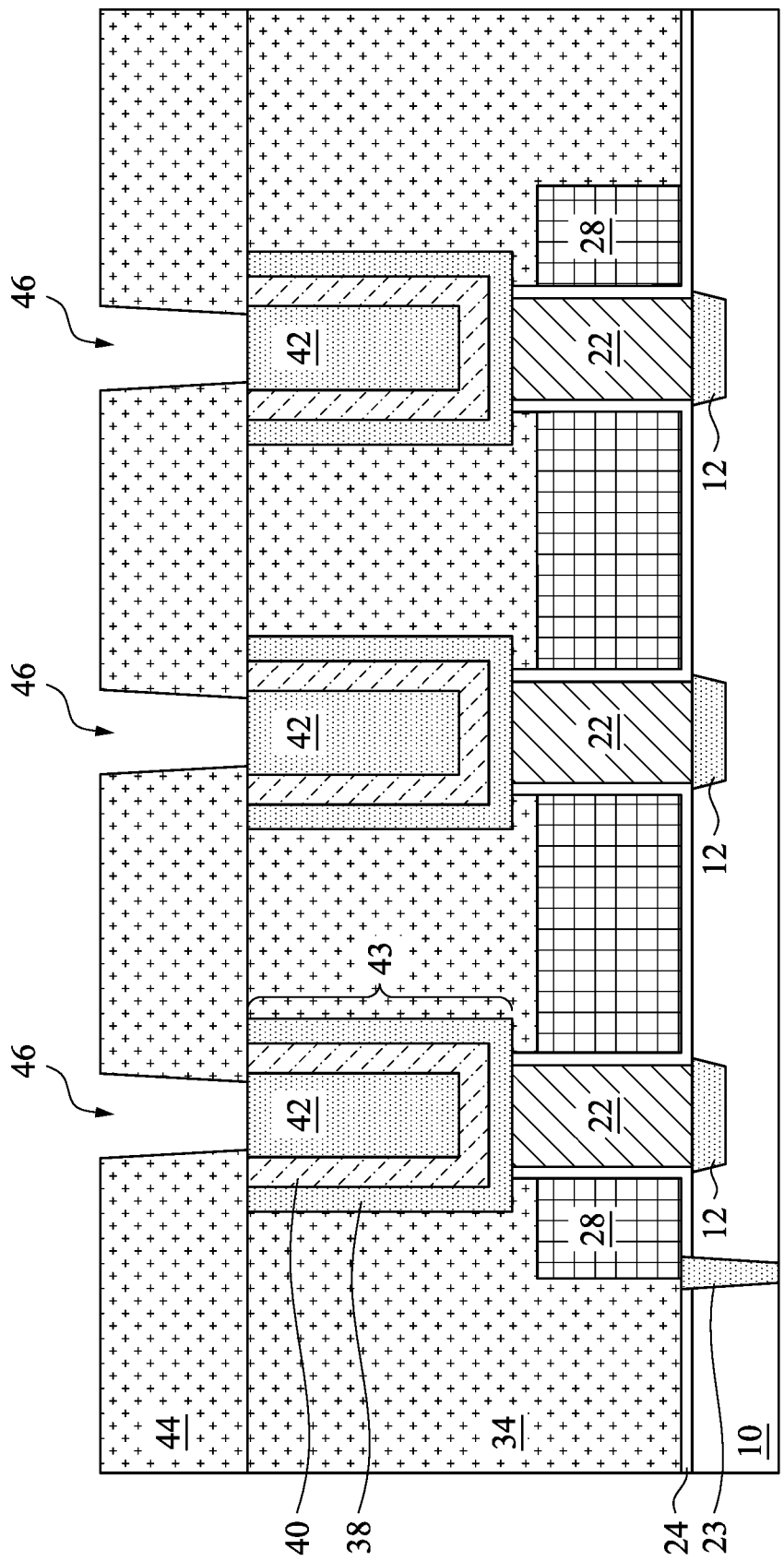

In FIGS. 24A and 24B a second ILD 44 is deposited over the first ILD and openings 46 are formed therein to expose the top electrode 42 of the cell capacitors 43, a via opening 48 is formed through the second ILD 44 and the first ILD 34 to expose the via 16, and a trench 50 is formed over the openings 46 and via opening 48 such that a subsequently formed conductive fill in the openings 46, via opening 48, and trench 50 electrically and physically couples all together the top electrode 42 of the cell capacitors 43 and the via 16. The view in FIGS. 24A and 24B follow from processes performed on the structures illustrated in FIGS. 23A and 23B, respectively.

The deposition of the second ILD 44 may be performed using processes and materials similar to those used to deposit the first ILD 34. The second ILD 44 may be patterned using an acceptable photolithography process. In one embodiment, for example, the trench 50 may be formed first using a first photoresist mask and etching process. Then, the first photoresist mask is removed and a second photoresist mask is deposited and patterned according to the openings 46 and via opening 48. The trench 50 may be extended deeper by an etching process where the openings 46 and via opening 48 are to form these openings. The etching may be continued (e.g., if the first ILD 34 and second ILD 44 are formed of the same material) or be altered to use different etchants (e.g., if the first ILD 34 and second ILD 44 are formed of different materials) to form the via opening 48 through the first ILD 34.

Figure 25:
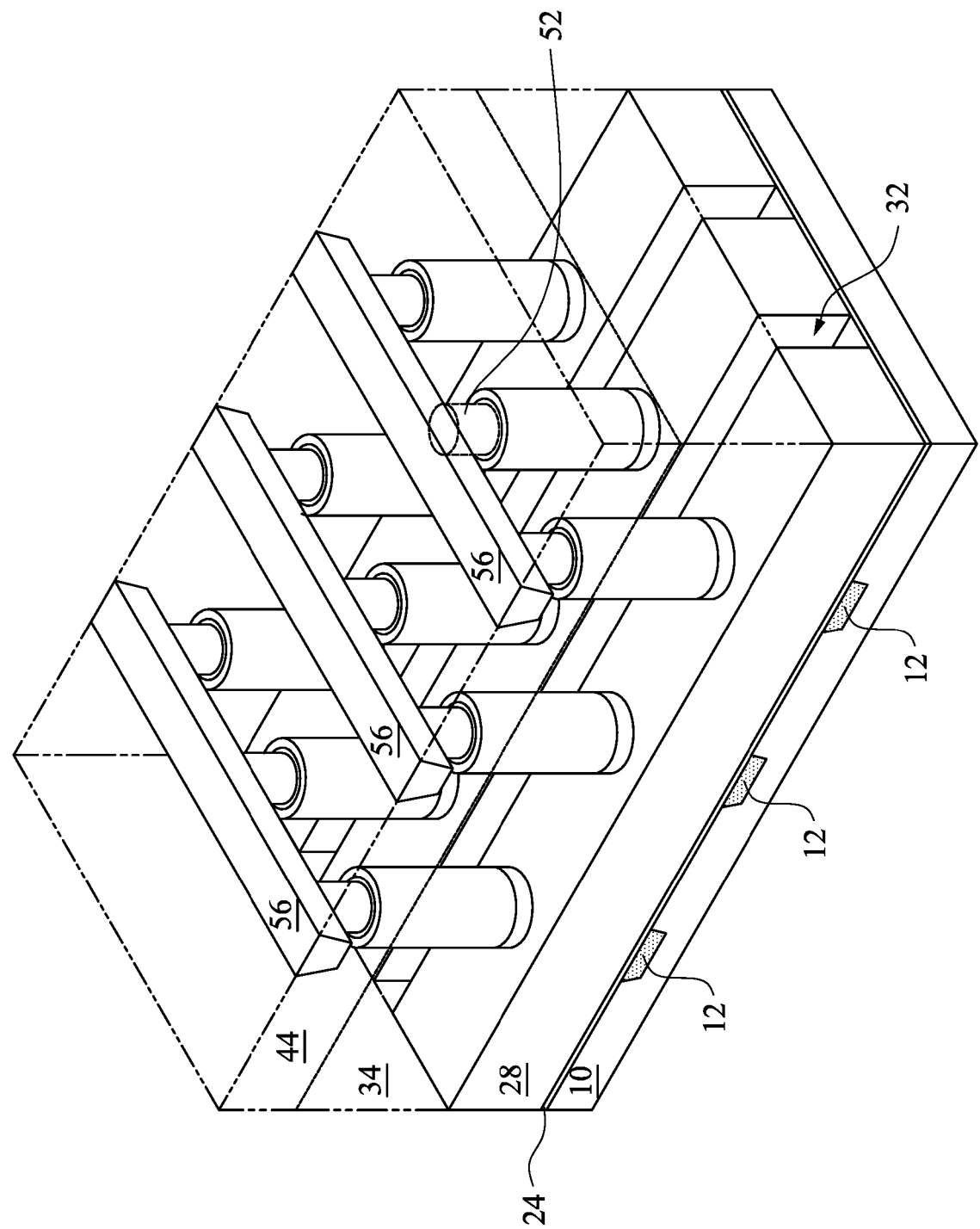
Figure 26A:
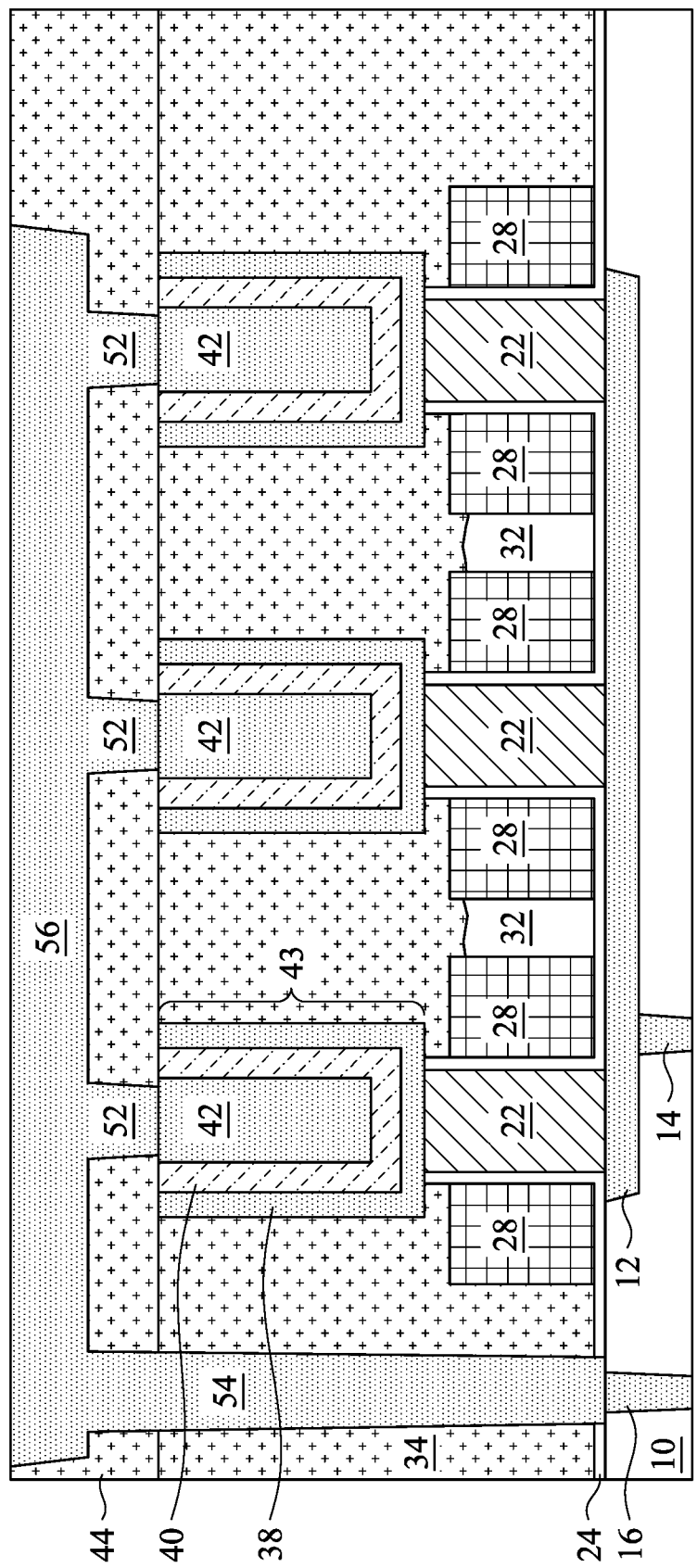
Figure 26B:
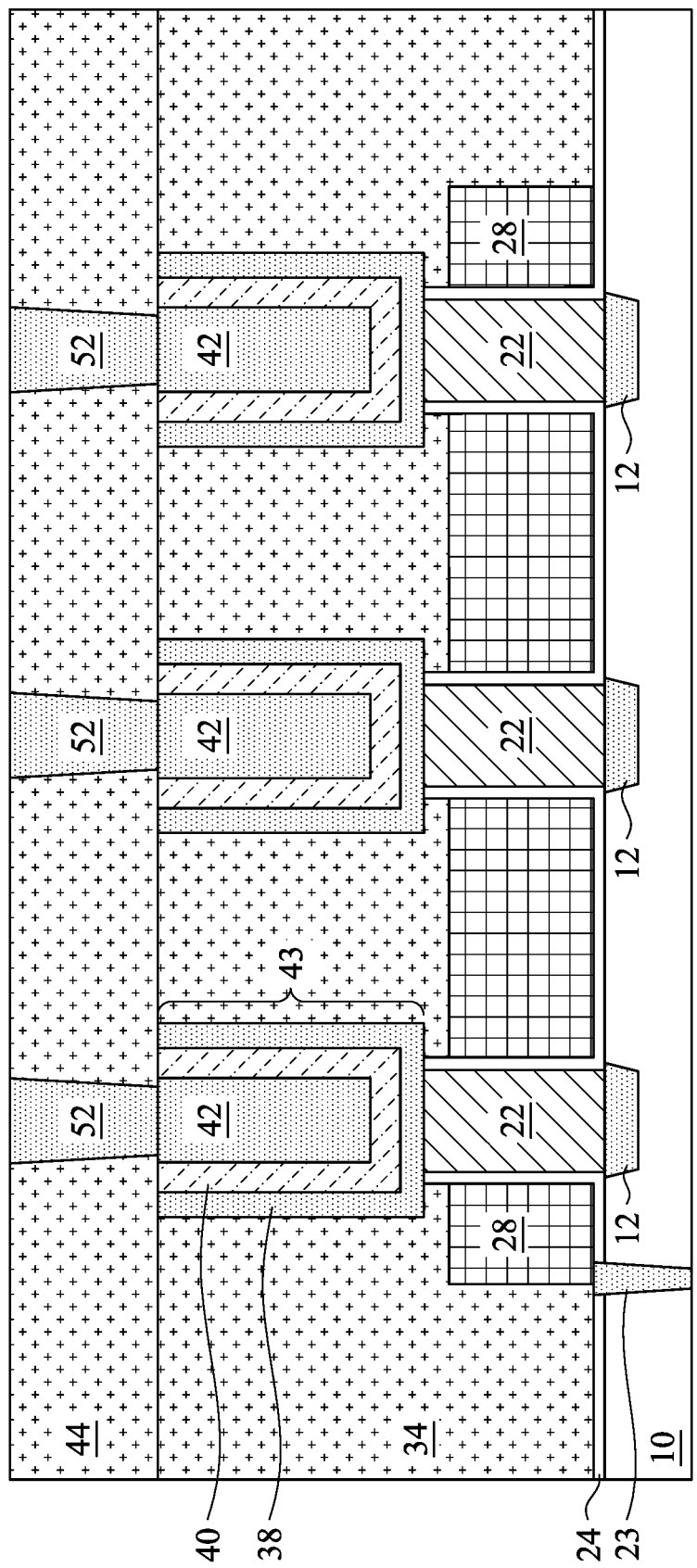

FIG. 25 is a perspective view of the structure illustrated in FIGS. 26A and 26B after a deposition process is used to deposit a conductive fill in the openings 46, via opening 48, and trenches 50, thereby forming the source lines (SLs) 56 wirings. The SLs 56 running or extending in a lengthwise direction according to the rows of the memory array. The views in FIGS. 26A and 26B follow from processes performed on the structures illustrated in FIGS. 24A and 24B, respectively. The SLs 56 are formed by depositing a conductive fill in the via opening 48, openings 46, and trenches 50. The SLs 56 may be formed using processes and materials used to form the BLs 12A, discussed above with respect to FIGS. 3A and 3B. A planarization process, such as a CMP process may be used to level an upper surface of the SLs 56 with an upper surface of the second ILD 44.

As seen in FIGS. 25, 26A, and 26B, a DRAM device 100 has been formed utilizing a vertical gate all around transistor and capacitor combination for each memory cell. For example, the channel region 22 is surrounded by a gate dielectric 24 and a gate electrode corresponding to WLs 28 which can be energized to activate the transistor. The BLs 12 serve as a source/drain disposed at one end of the channel region 22 and the bottom electrode 38 of the cell capacitor 43 serves as the source/drain disposed at the other end of the channel region 22. The built-in cell capacitor 43 for each transistor is disposed directly over the channel region 22 of the transistor, reducing lateral spacing requirements of each memory cell. The cell capacitor 43 stores a voltage potential which may be read to determine if the capacitor corresponds to a 1 or a 0. The SL 56 and BL 12 are coupled to sense circuits (e.g., the corresponding controllers of FIG. 2) to determine the voltage values of each of the cell capacitors 43. The air gap 32 provided between each of the adjacent wordlines 28 provides a low k dielectric effect between the adjacent wordlines 28, thereby reducing parasitic capacitance. In some embodiments, the BLs 12 may be split across multiple levels (see, e.g., FIG. 27B). This provides better dielectric separation between the BLs 12A and 12B, further reducing parasitic capacitance. In some embodiments, the reduction in parasitic capacitance, for example, as compared to a reference device without the air gap 32, between the WL 28 and BL 12 is between about 20% and 30% and between the adjacent WLs 28 the reduction is between about 50% and 70%. In some embodiments, where a two-layer BL 12 structure is used, as compared to a reference gap without the air gap 32 using a single layer BL 12 structure, the parasitic capacitance reduction between the WL 28 and BL 12 (BL 12A/12B combined) is between about 35% and 45%, between the adjacent WLs 28 the reduction is between about 50% and 70%, between vias 13 and BL 12B the reduction is between about 5% and 15%, and between the BL 12A and an adjacent BL 12A the reduction is between about 50% and 70%.

Figure 27A:
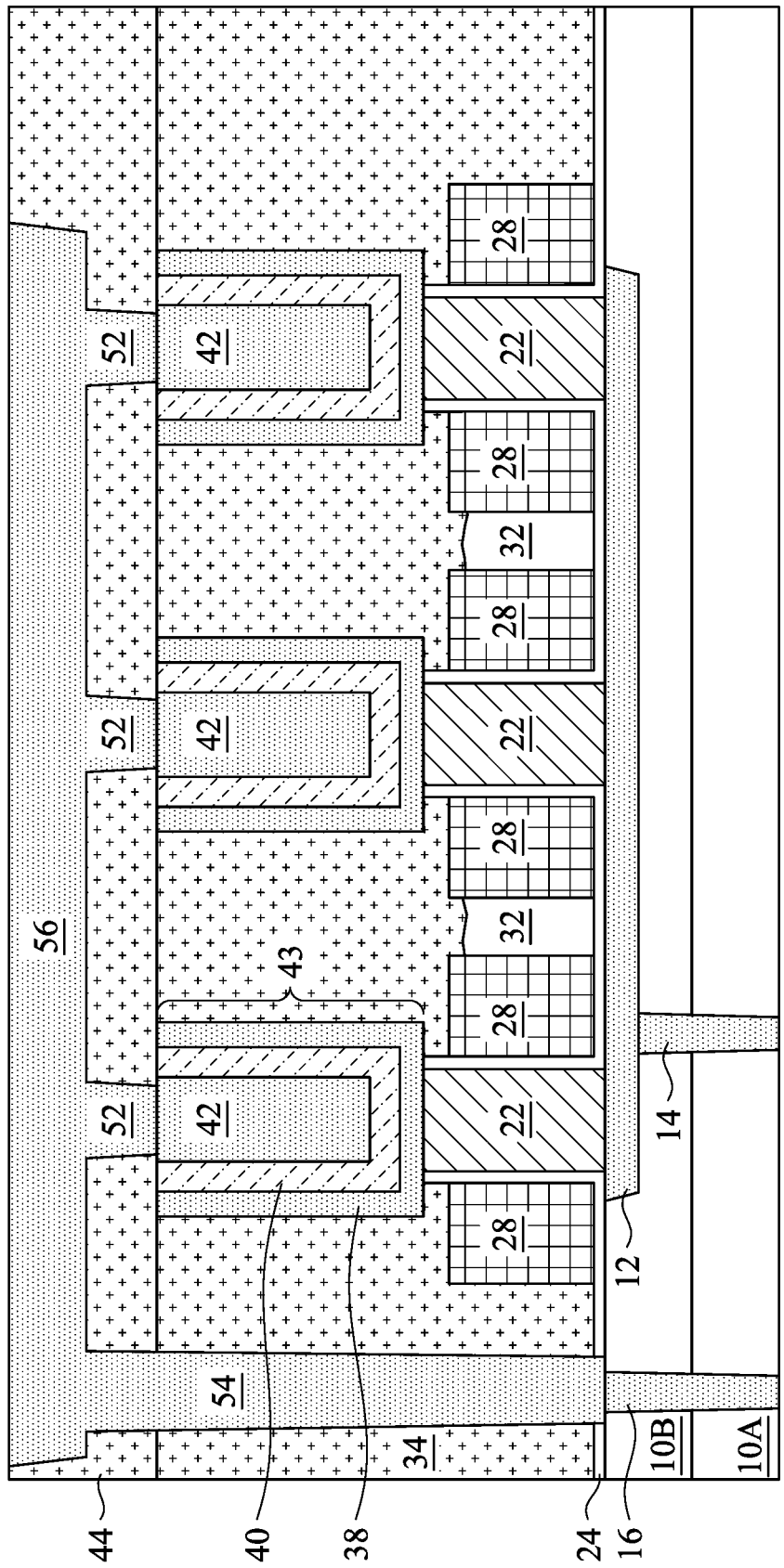
Figure 27B:
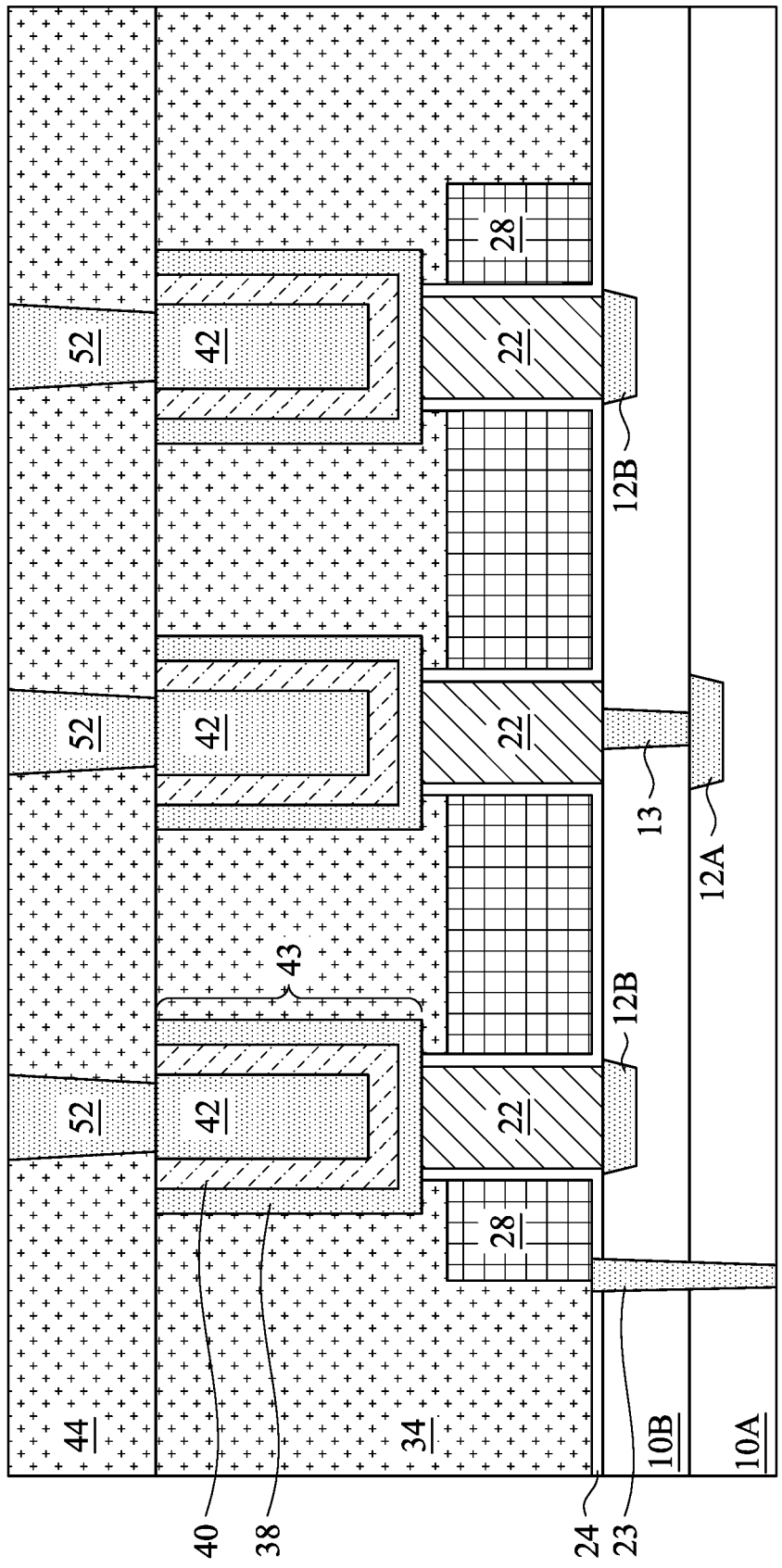
Figure 27C:
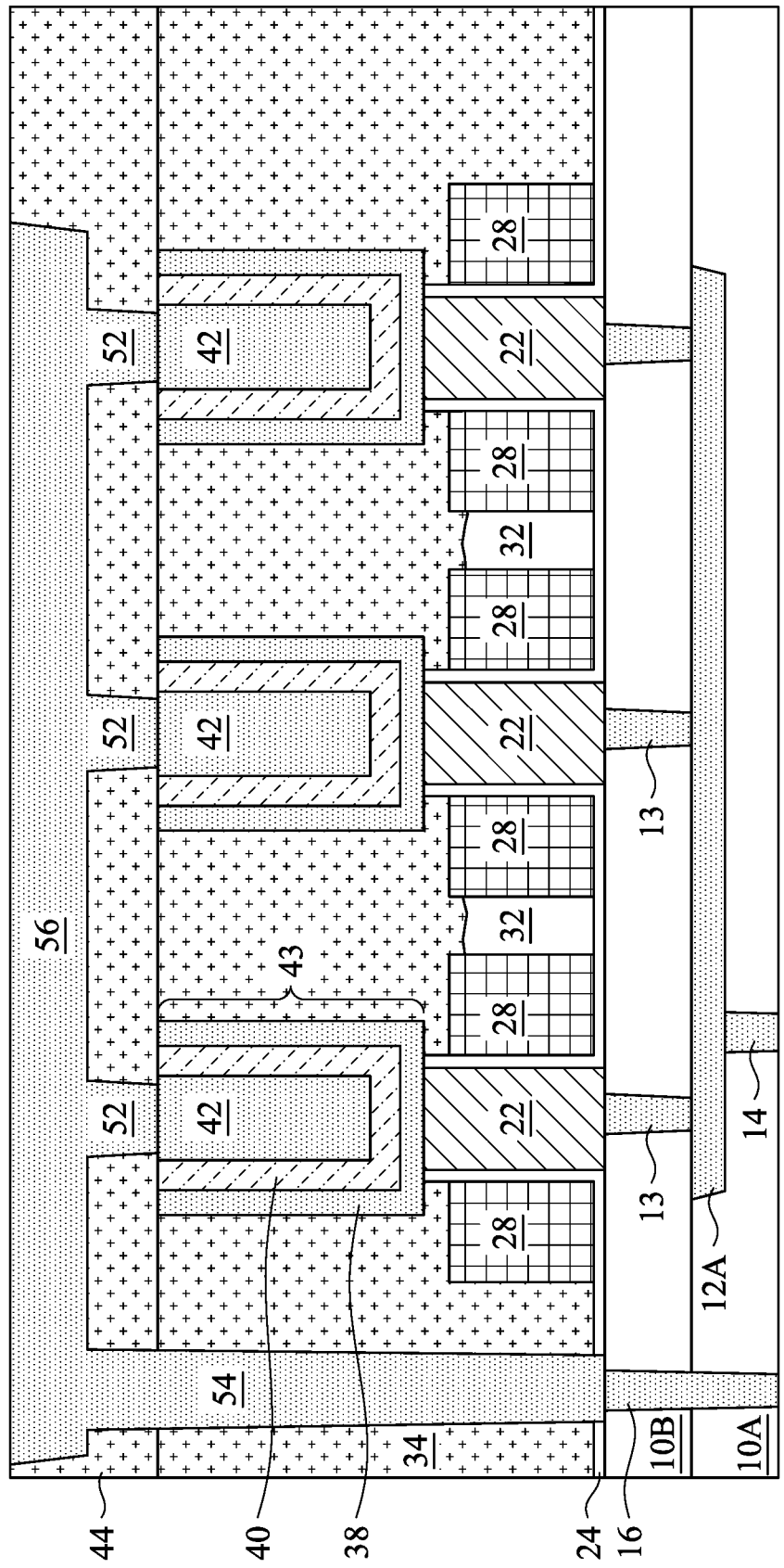

FIGS. 27A, 27B, and 27C illustrate cross-sectional views of the structures of FIGS. 24A and 24B after a deposition process is used to deposit a conductive fill in the openings 46, via opening 48, and trenches 50, thereby forming the source lines (SLs) 56, in accordance with some embodiments. The views in FIGS. 27A, 27B, and 27C follow from processes performed on the structures illustrated in FIGS. 24A and 24B, respectively, except that the structure in FIGS. 27A, 27B, and 27C utilize a two-level bitline structure, including a bitline 12A and bitline 12B, such as illustrated and discussed above with respect to FIGS. 3A, 3B, 4A, and 4B. FIG. 27A is a cross-sectional view along the line A-A of FIG. 1, FIG. 27B is a cross-sectional view along the line B-B of FIG. 1, and FIG. 27C is a cross-sectional view along the line C-C of FIG. 1. The two-level bitline structure may be combined with any of the embodiments discussed herein.

Figure 28A:
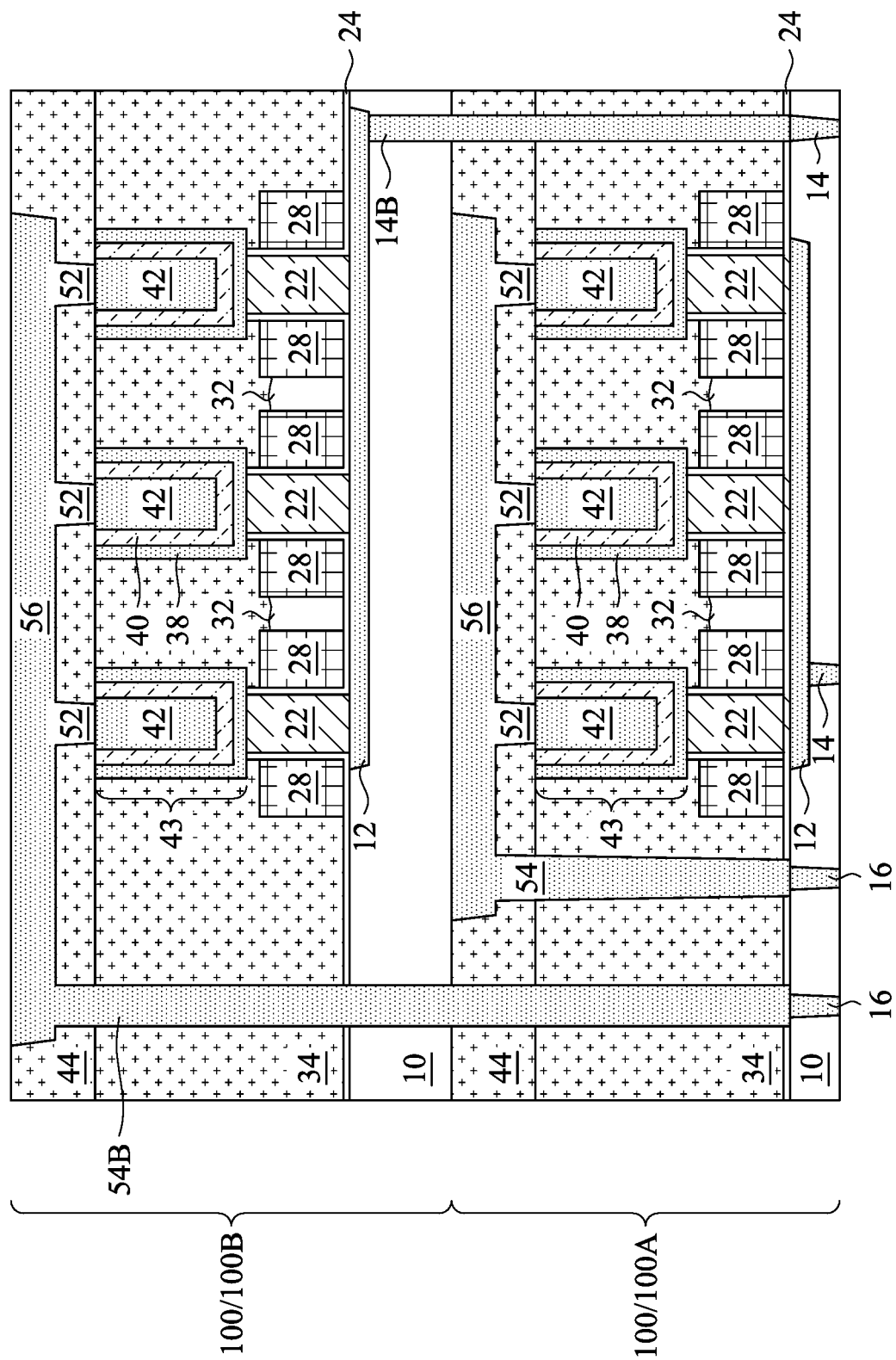
Figure 28B:
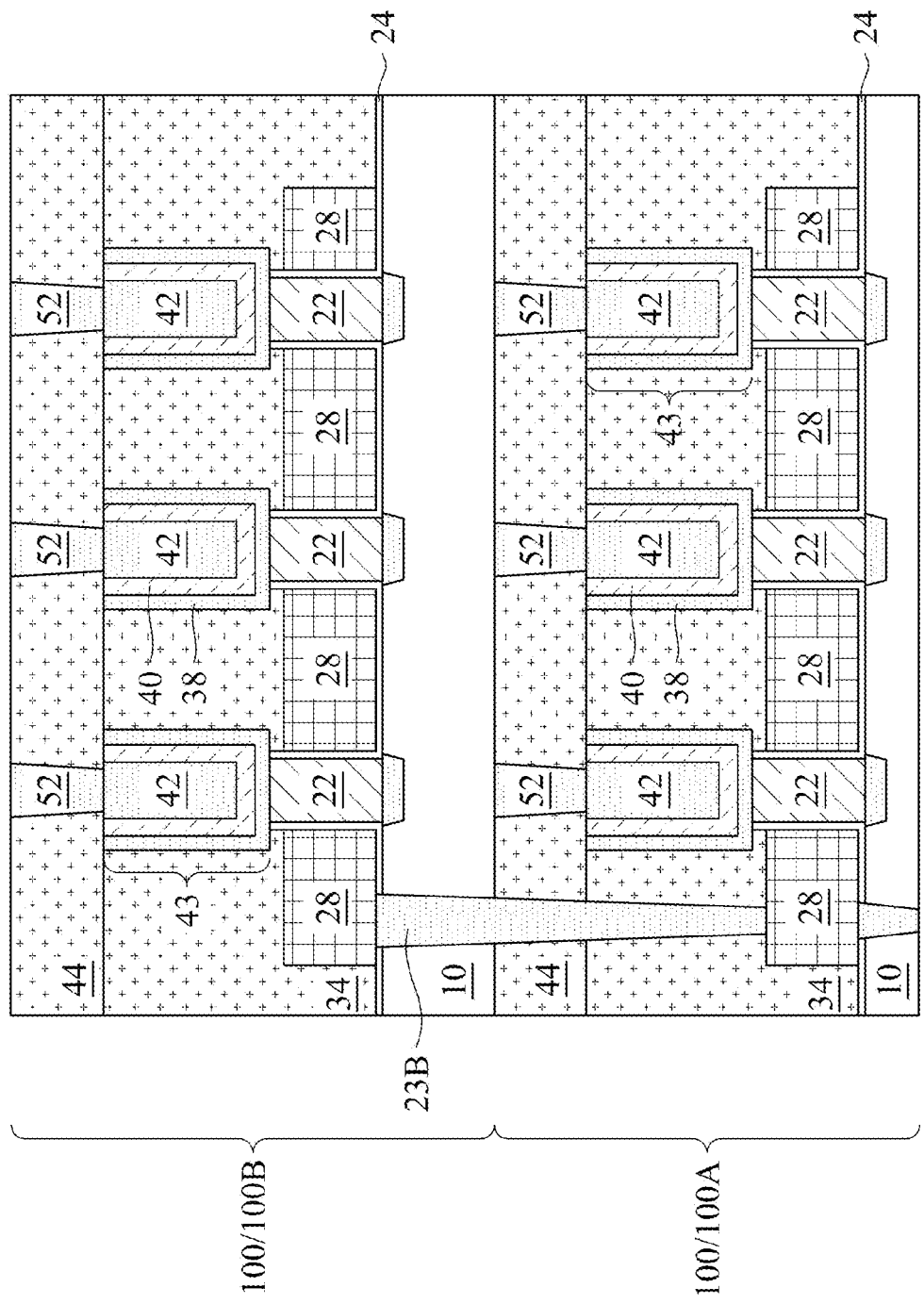

In FIGS. 28A and 28B, the DRAM device includes a first tier 100A and a second tier 100B formed over the first tier 100A. The views in FIGS. 28A and 28B follow from processes performed on the structures illustrated in FIGS. 26A and 26B, respectively. Forming the second tier 100B may be done using processes and materials similar to those used to form the first tier 100A. It should also be understood that the illustrated structures in FIGS. 28A and 28B may utilize the dual bitline embodiment discussed above, for example with respect to FIGS. 27A and 27B, and/or may utilize a filled space between the WLs 28, for example with respect to FIGS. 16C and 17C.

Each of vias 14B, 23B, and 54B of the second tier 100B may be respectively formed in one stage or in multiple stages. For example, the via 14B may have a first part formed through the first ILD 34 and second ILD 44 at the same time as the via 54 (see FIGS. 24A, 24B, 25, 26A, and 26B) and a second part formed after depositing the dielectric layer 10 of the second tier 100B. The via 23B may have a first part formed through the first ILD 34 and second ILD 44 at the same time as the source line via 54 (see FIGS. 24A, 24B, 25, 26A, and 26B) and a second part formed after depositing the gate dielectric 24 of the second tier 100B (see, e.g., FIG. 11B). The via 54B may have a first part formed through the first ILD 34 and second ILD 44 at the same time as the source line via 54 of the first tier 100A (see FIGS. 24A, 24B, 25, 26A, and 26B) and a second part formed through the first ILD 34 and second ILD 44 of the second tier 100B at a same process step relative to the second tier 100B. In some embodiments, each of the vias 14B, 23B, and 54B may each be formed in a single stage. The vias 14B, 23B, and 54B may be formed using processes and materials similar to those discussed above with respect to each of the vias 14, 23, and 54, respectively.

Following forming the second tier 100B, a third tier, fourth tier, fifth tier, etc. may be formed over the second tier 100B. Any number of tiers may be stacked to form a vertical DRAM device having a vertical gate all around transistor with a vertical capacitor disposed over the vertical gate all around transistor. This arrangement provides a highly compact lateral design, saving footprint (area) space, allowing for a compact and dense memory device.

Figure 29:
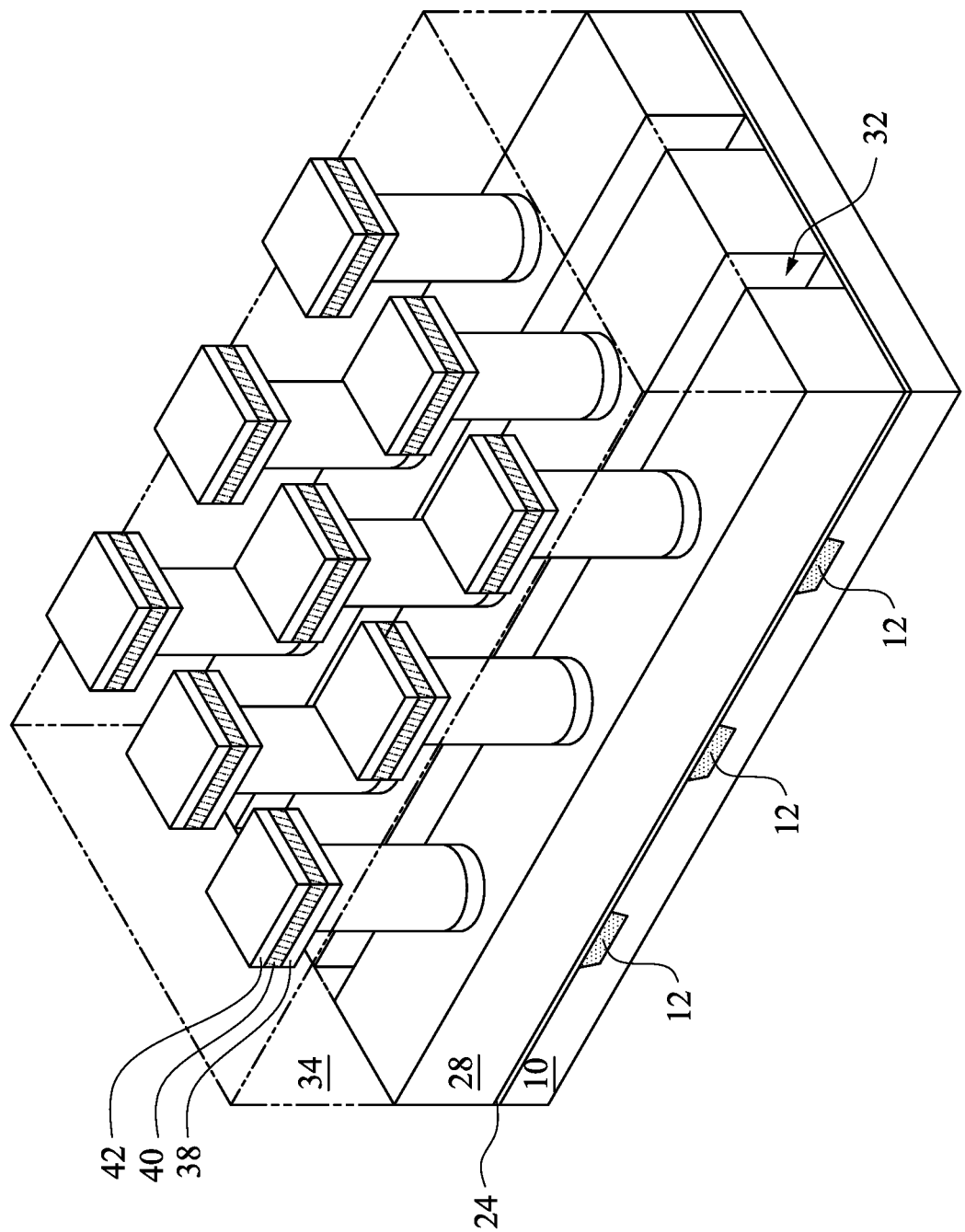

FIGS. 29 through 33A and 33B illustrate various intermediate views of the formation of the cell capacitors 43, in accordance with some embodiments. In FIG. 29, rather than planarize the bottom electrode 38, capacitor dielectric 40, and top electrode 42 to separate the cell capacitors 43 from one another (see, e.g., FIGS. 22, 23A, and 23B), the bottom electrode 38, capacitor dielectric 40, and top electrode 42 are patterned so that the excess materials over the first ILD 34 remain over the first ILD 34, but separated from one another into the cell capacitors 43. This provides a larger landing for a subsequently formed source line via 52. In particular, as illustrated in FIGS. 26A and 26B, the source line via 52 must land on the top electrode 42. Misalignment or over etching can cause the source line via 52 to offset and inadvertently simultaneously contacting the bottom electrode 38, thereby rendering the memory cell inoperable. To solve this potential issue, iteratively patterning the top electrode 42, capacitor dielectric 40, and bottom electrode 38 provides the cell capacitor 43 separation as well as a large landing area that can compensate for misalignment of the subsequently formed source line vias 52.

Figure 30A:
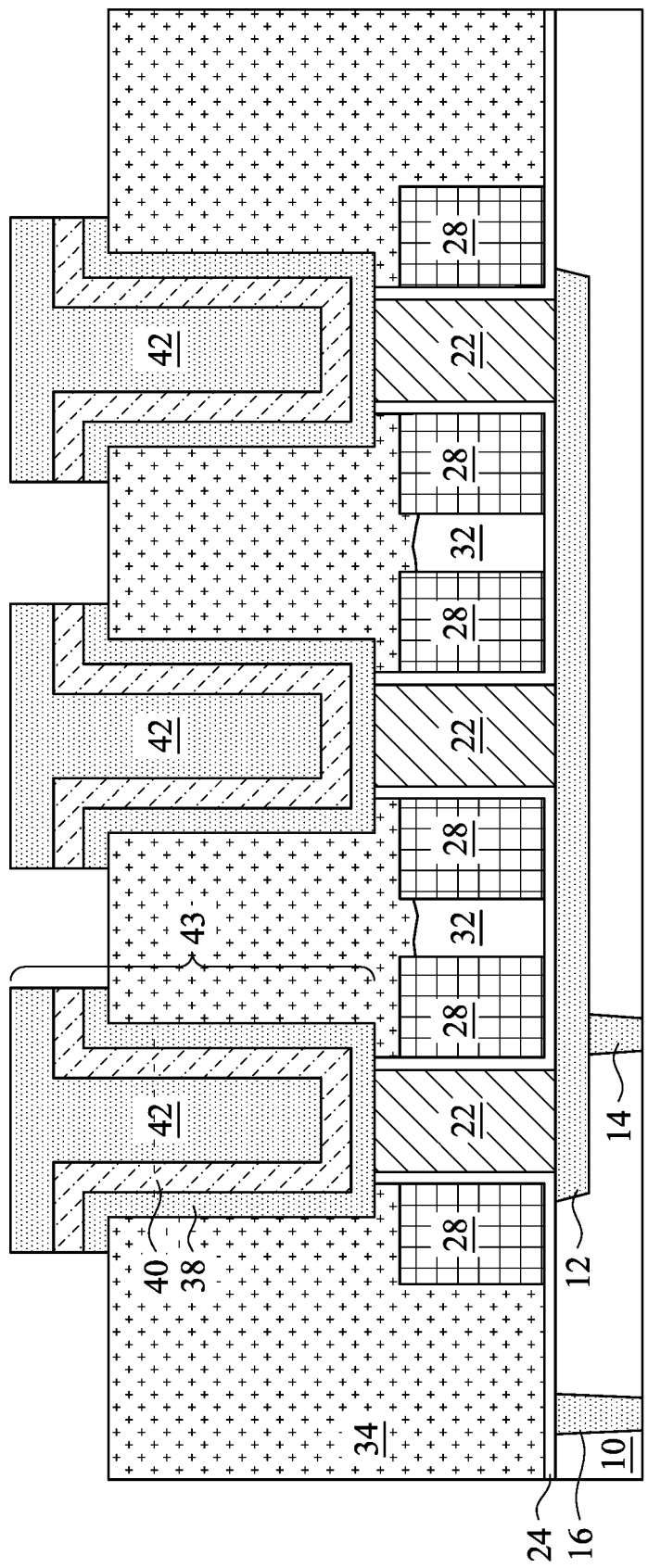
Figure 30B:
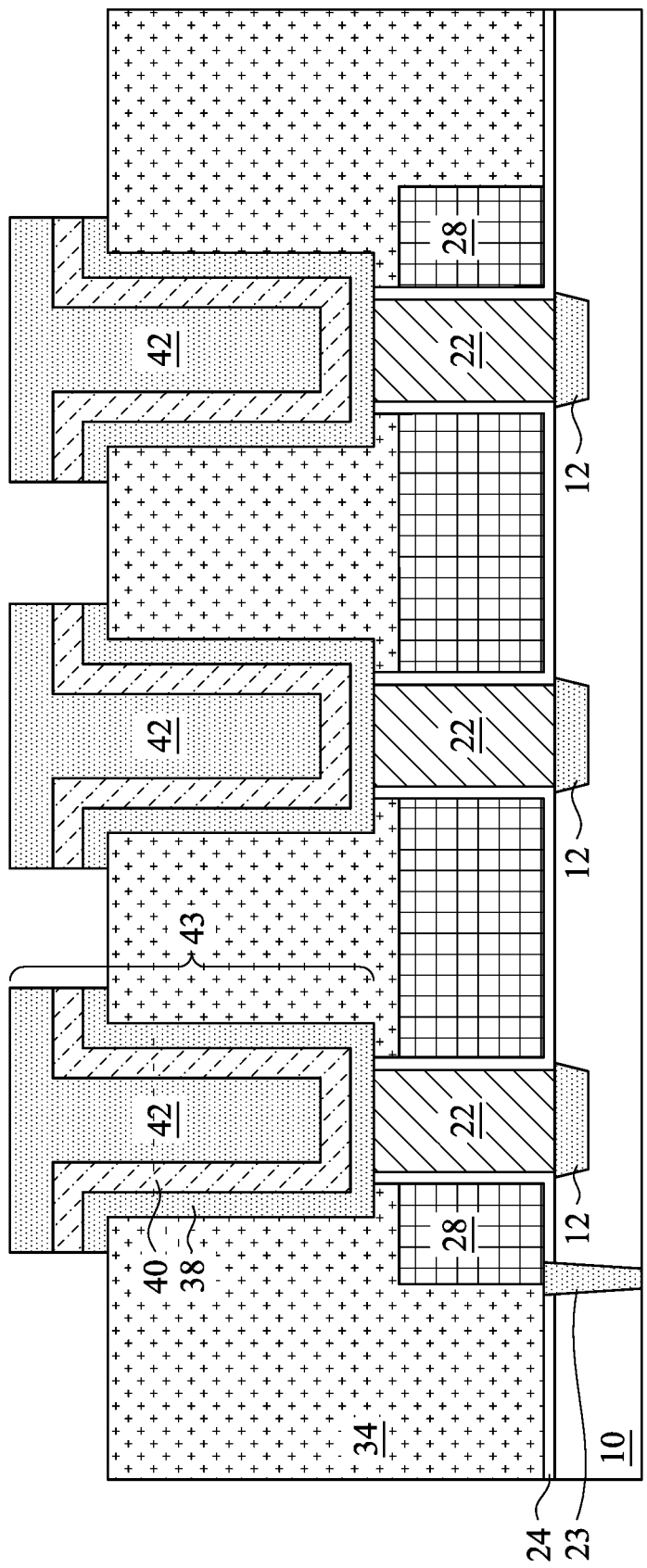
Figure 30C:
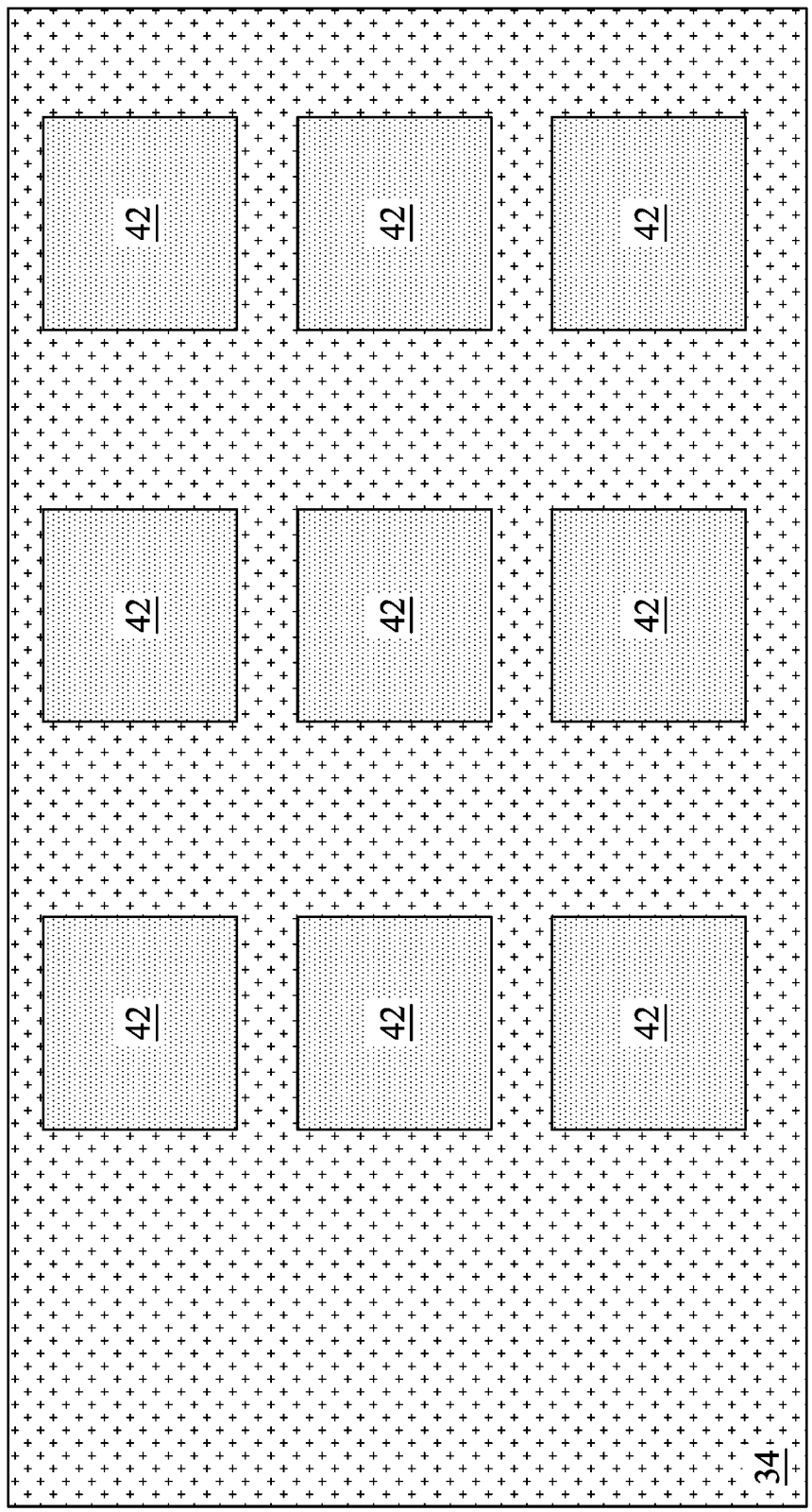

FIG. 29 is a perspective view of the structure illustrated in FIGS. 30A, 30B, and 30C after a patterning process is used to separate the bottom electrode 38, capacitor dielectric 40, and top electrode 42 into MIM cell capacitors 43. The view in FIGS. 30A, 30B, and 30C follow from processes performed on the structures illustrated in FIGS. 21A and 21B. The patterning process may use an acceptable photo-etching process to form a photoresist over the top electrode 42, pattern the photoresist, and use the photoresist as an etch mask to sequentially etch the top electrode 42, capacitor dielectric 40, and the bottom electrode 38. Following the etching, the photoresist may be removed by an ashing technique or other suitable technique. As illustrated in FIG. 30C, the resulting top electrode has a large landing area.

Figure 31A:
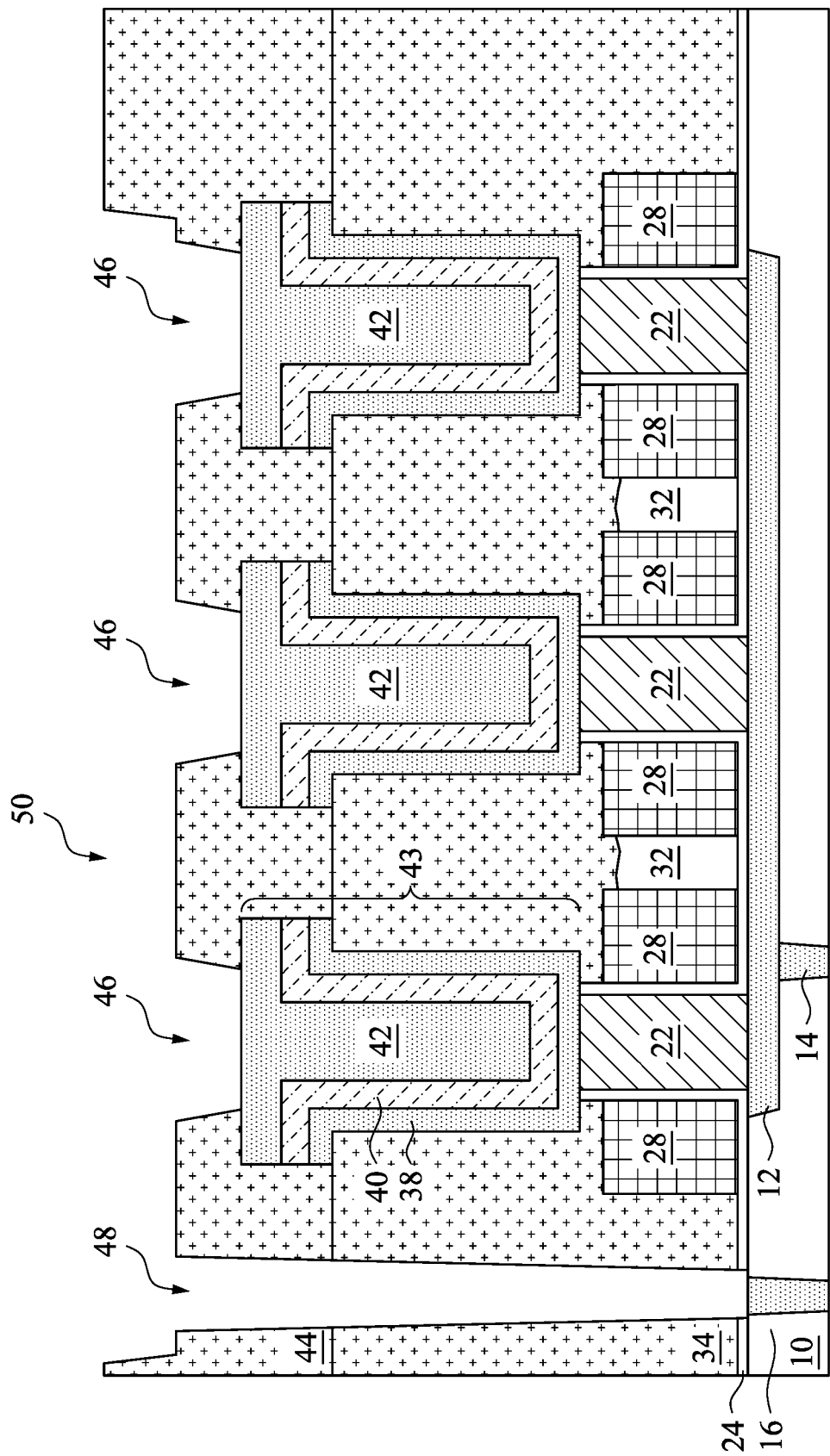
Figure 31B:
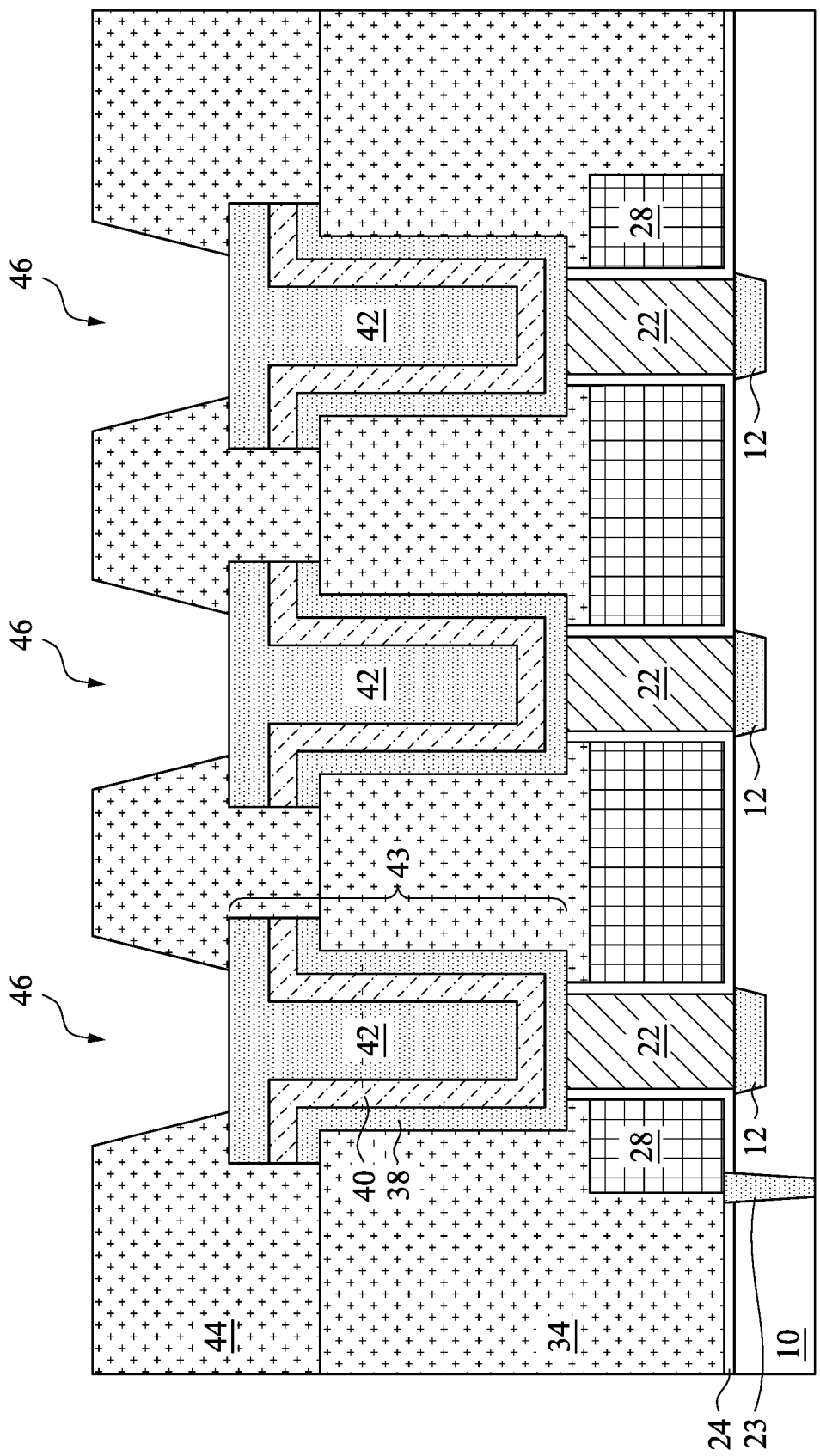

In FIGS. 31A and 31B a second ILD 44 is deposited over the first ILD 34 and openings 46 are formed therein to expose the top electrode 42 of the cell capacitors 43, a via opening 48 is formed through the second ILD 44 and the first ILD 34 to expose the via 16, and a trench 50 is formed over the openings 46 and via opening 48 such that a subsequently formed conductive fill in the openings 46, via opening 48, and trench 50 electrically and physically couples all together the top electrode 42 of the cell capacitors 43 and the via 16. The view in FIGS. 31A and 31B follow from processes performed on the structures illustrated in FIGS. 30A and 30B, respectively. The deposition and patterning of the second ILD 44 may be performed using processes and materials similar to those used to deposit and pattern the second ILD 44 discussed above with respect to FIGS. 24A and 24B. Because, however, the landing area for the top electrode is enlarged, the openings 46 may be enlarged (as illustrated) or may be placed with more tolerance for patterning errors.

Figure 32:
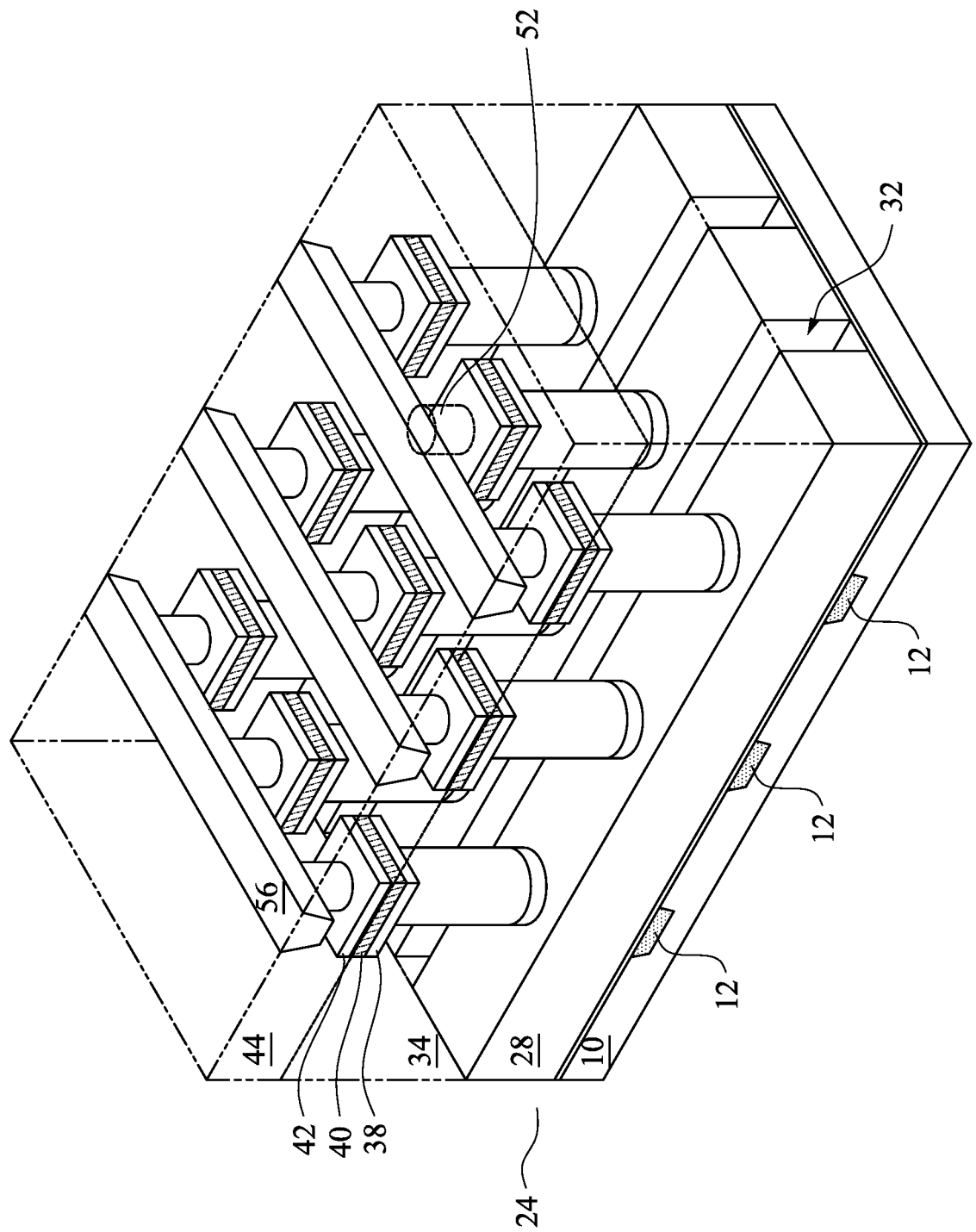
Figure 33A:
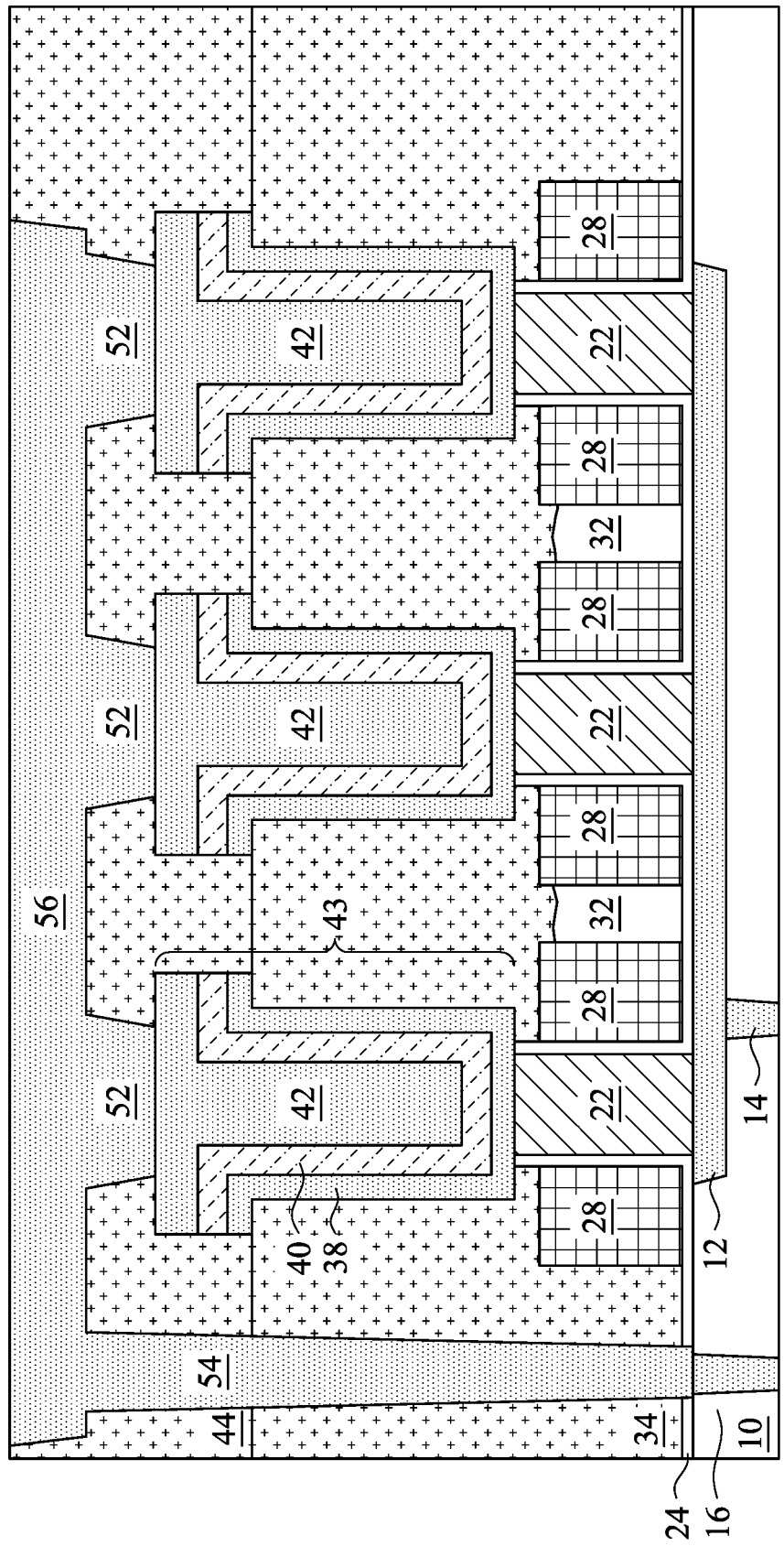
Figure 33B:
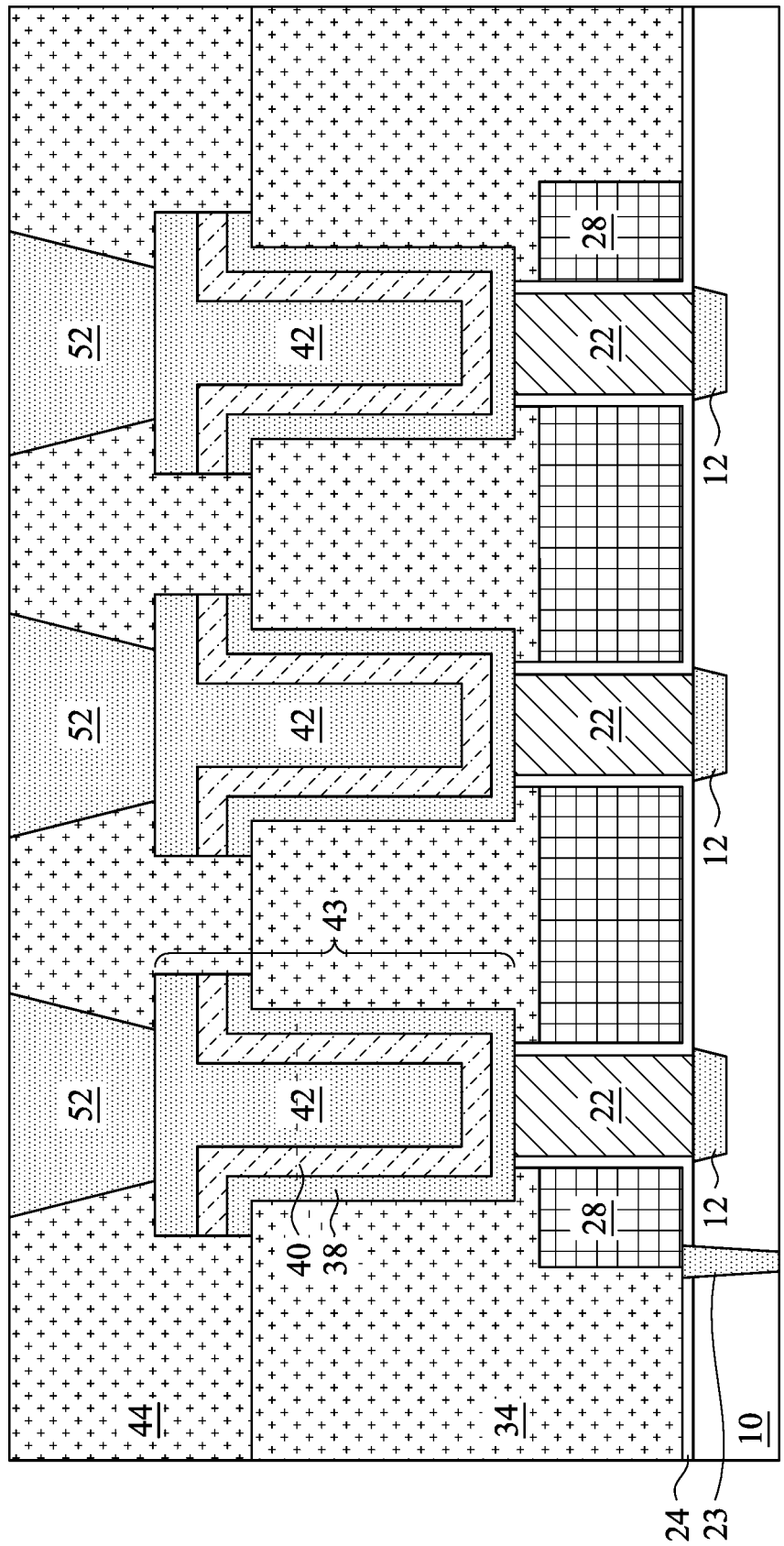

FIG. 32 is a perspective view of the structure illustrated in FIGS. 33A and 33B after a deposition process is used to deposit a conductive fill in the openings 46, via opening 48, and trenches 50, thereby forming the source lines (SLs) 56. The views in FIGS. 33A and 33B follow from processes performed on the structures illustrated in FIGS. 31A and 31B, respectively. The SLs 56 are formed by depositing a conductive fill in the via opening 48, openings 46, and trenches 50. The SLs 56 may be formed using processes and materials similar to those used to form the BLs 12A, discussed above with respect to FIGS. 3A and 3B. A planarization process, such as a CMP process may be used to level an upper surface of the SLs 56 with an upper surface of the second ILD 44.

FIGS. 34A, 34B, 34C, 34D, and 34E illustrate various configurations of the cell capacitors 43 that may be used over the transistors of each of the memory cells. FIGS. 35A and 35B through FIGS. 41A and 41B illustrate intermediate processes in forming each of the capacitor types discussed below with respect to FIGS. 34A, 34B, 34C, 34D, and 34E. Like references are used to refer to like structures, which may be formed using like materials and processes, unless otherwise noted.

In FIGS. 34A, 34B, 34C, 34D, and 34E, the bottom portion of each Figure illustrates a partial cross-sectional view of the cell capacitors 43 along the reference line A-A of FIG. 1 and the top portion of each Figure illustrates a horizontal cross-section identified in each respective bottom portion. FIG. 34A illustrates a cup capacitor which may be formed using processes and materials such as those described above (see FIGS. 20 through 23C). FIG. 34B illustrates a cup capacitor which may be formed using processes and materials such as those described above (see FIGS. 29 through 30B).

In each of FIGS. 34C and 34D an protruding upper channel region 22t of the channel regions 22 extend from the channel regions 22. In FIG. 34C, these upper channel regions 22t serve as a bottom electrode for the cell capacitor 43, and the bottom electrode 38 may be omitted. The capacitor dielectric 40 lines the protruding upper channel region 22t of the channel region 22. In FIG. 34D a conformal bottom electrode 38 is formed prior to the formation of the capacitor dielectric 40. In FIG. 34E, a bottom electrode 38 is formed to have a ring-like protrusion, the ring-like protrusion is lined with the capacitor dielectric 40 and then the remaining openings are filled with the top electrode 42.

FIGS. 34C, 34D, and 34E also include an outline in phantom of an embodiment of each which utilizes a patterning process instead of a planarization process to separate the bottom electrode 38' (if used), the capacitor dielectric 40', and the top electrode 42' into the cell capacitors 43. These embodiments may leave a portion of the top electrode protruding above the first ILD 34 to provide a larger landing space for a subsequently formed via over the cell capacitors 43.

FIGS. 35A and 35B through FIGS. 41A and 41B illustrate intermediate processes in forming each of the capacitor types discussed above with respect to FIGS. 34A, 34B, 34C, 34D, and 34E. FIGS. 35A, 36A, 37A, 38A, 39A, 40A, and 41A illustrate cross-sectional views along the A-A reference line of FIG. 1. FIGS. 35B, 36B, 37B, 38B, 39B, 40B, and 41B illustrate cross-sectional views along the B-B reference line of FIG. 1.

Figure 35A:
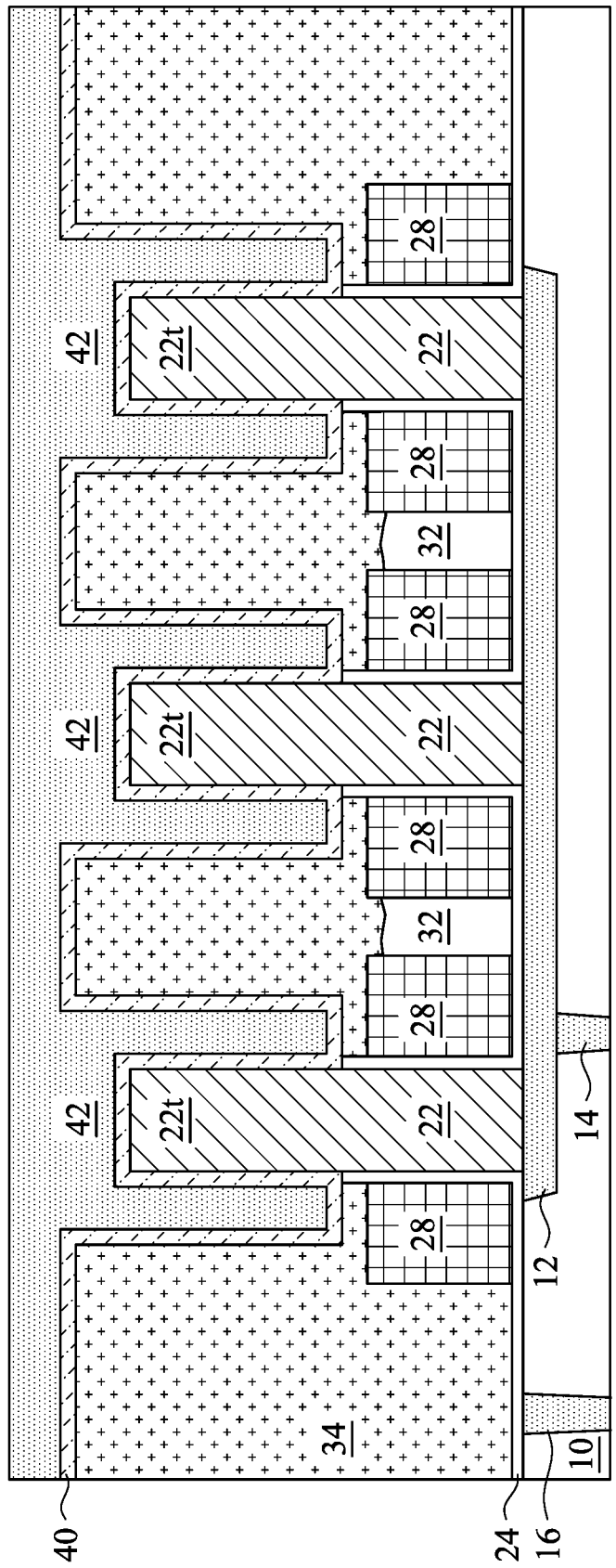
Figure 35B:
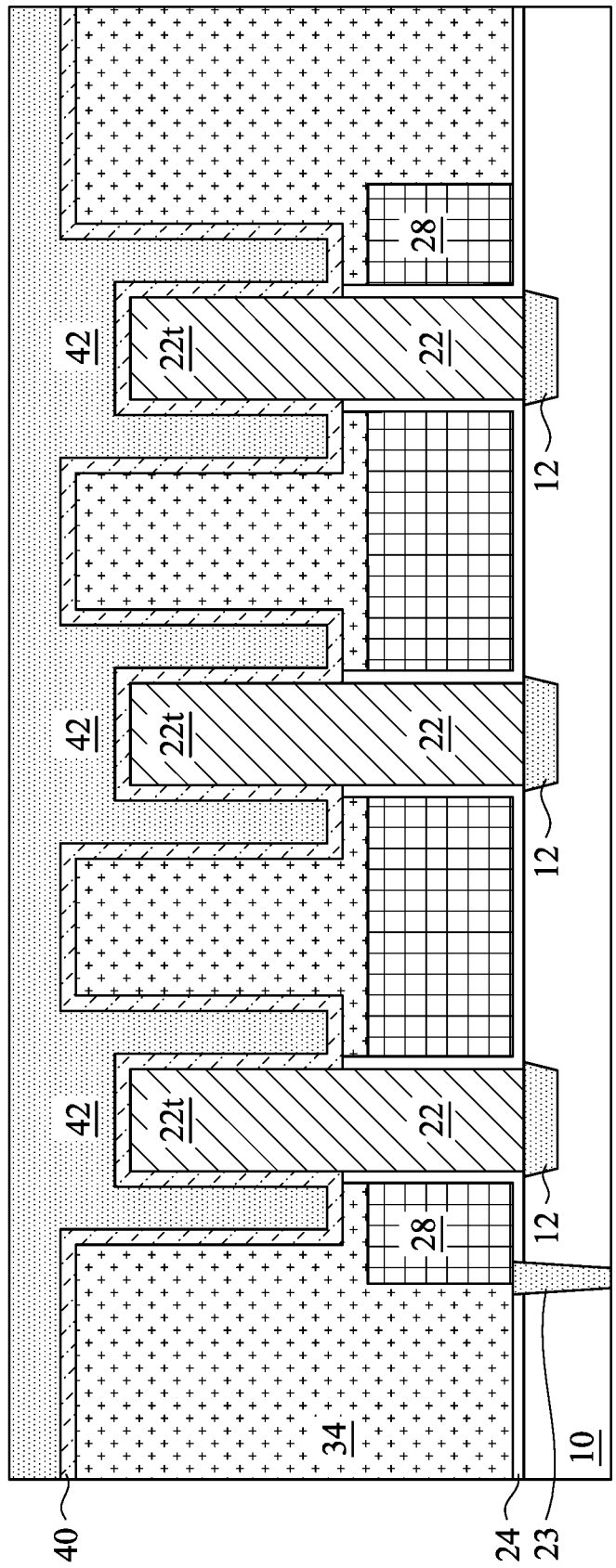

In FIGS. 35A and 35B, the openings 36 (see FIGS. 19A and 19B) are formed to remove the material of the first ILD 34. In some embodiments, the gate dielectric 24 may also be removed over the upper channel region 22t, such as illustrated in FIGS. 35A and 35B. In other embodiments, the gate dielectric 24 may be left remaining on the upper channel region 22t. Next, the capacitor dielectric 40 is conformally deposited over the exposed surfaces of the openings 36. Then, the remaining openings 36 are filled with the top electrode 42. This embodiment has the advantage of eliminating the bottom electrode 38, as the top electrode 42 and upper channel region 22t maintain a capacitance across the capacitor dielectric 40.

Figure 36A:
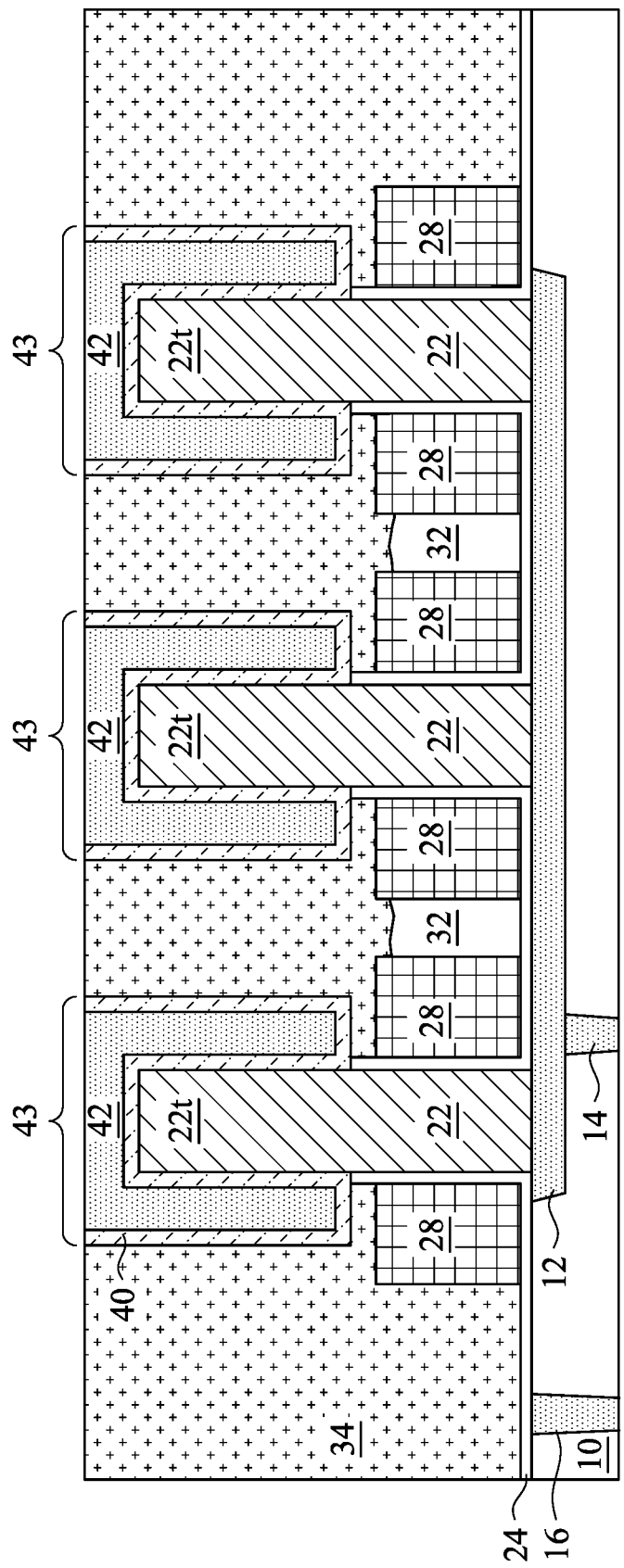
Figure 36B:
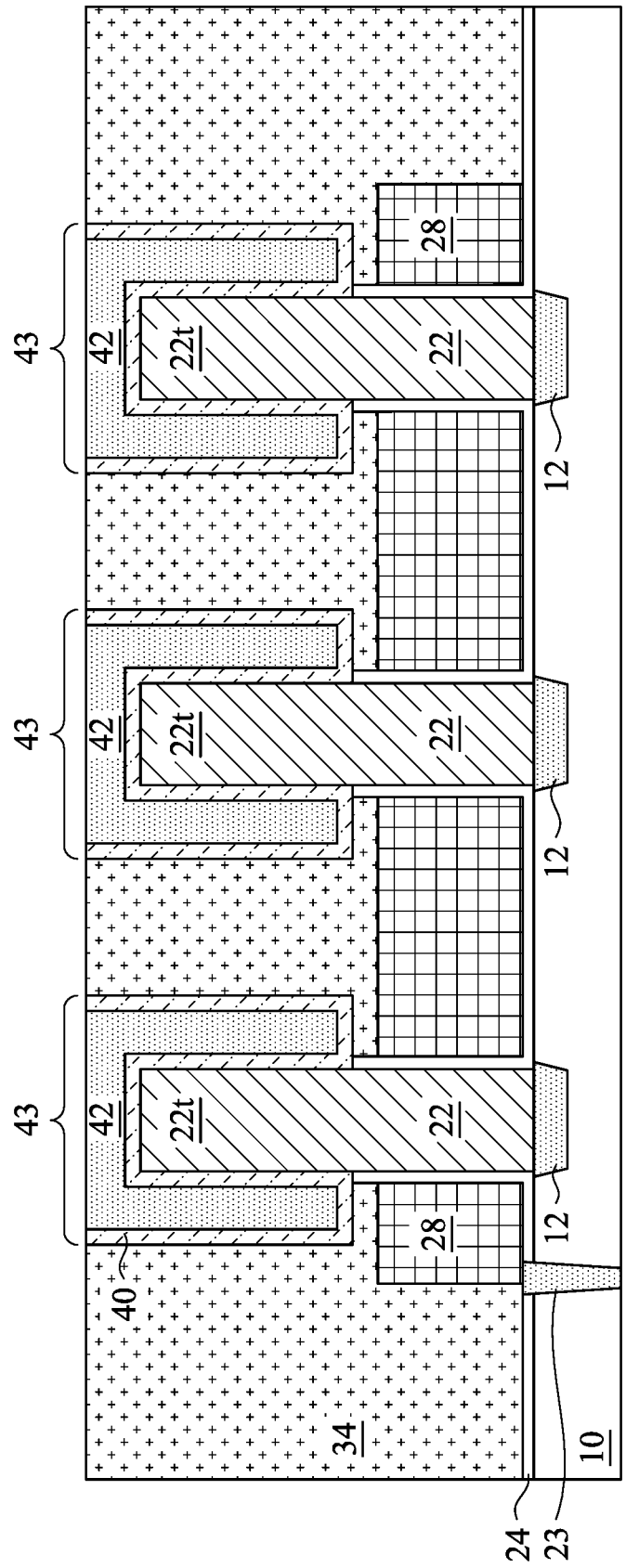

In FIGS. 36A and 36B, the structure of FIGS. 35A and 35B is planarized to separate the capacitor dielectric 40 and top electrode 42 into the cell capacitors 43, in accordance with some embodiments. In other embodiments, the structure of FIGS. 35A and 35B may be patterned to remove portions of the top electrode 42 and capacitor dielectric 40 to form cell capacitors protruding higher than the first ILD 34, having a shape similar to the cell capacitors 43 of FIGS. 32, 33A, and 33B.

Figure 37A:
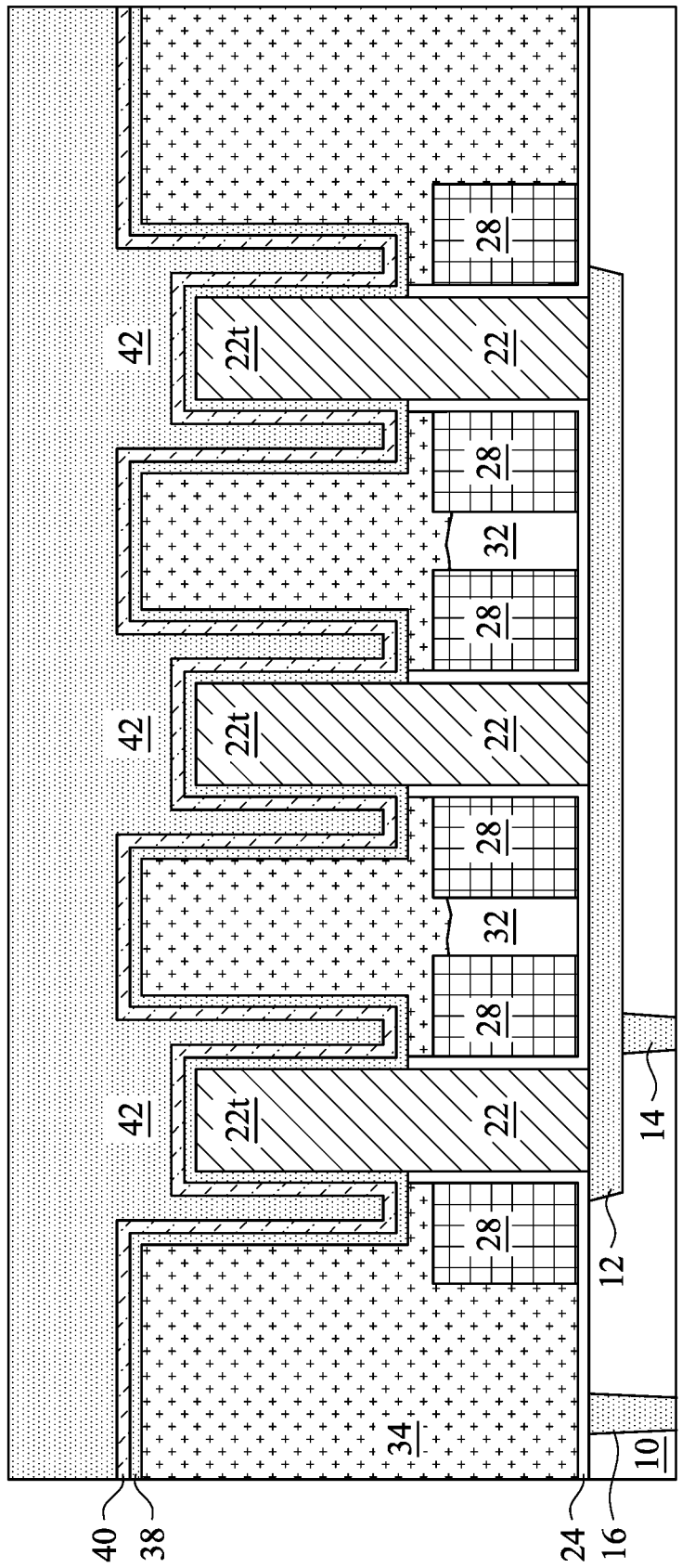
Figure 37B:
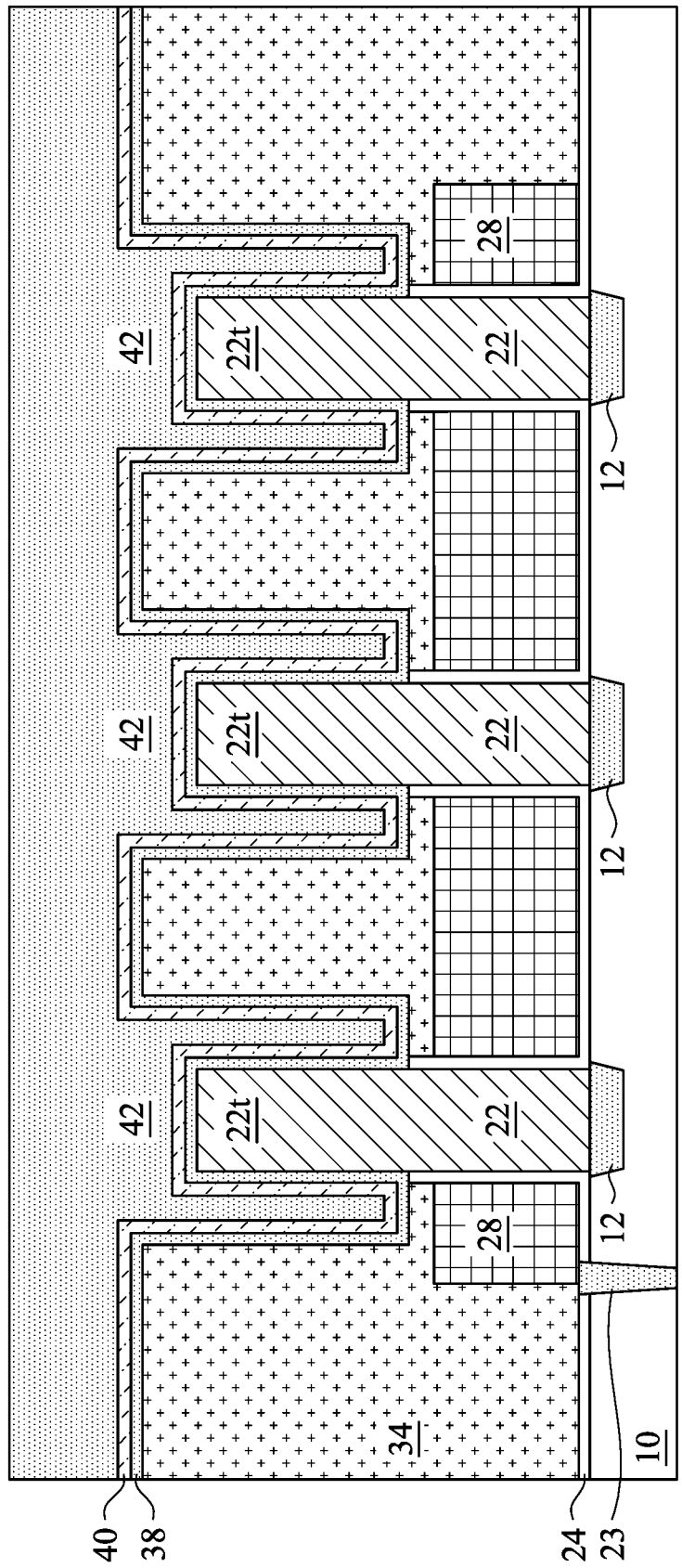

In FIGS. 37A and 37B, the openings 36 (see FIGS. 19A and 19B) are formed to remove the material of the first ILD 34. The gate dielectric 24 is also removed over the upper channel region 22t, such as illustrated in FIGS. 37A and 37B. Next, a bottom electrode 38 layer is conformally deposited over the upper channel region 22t and along sidewalls of the openings 36. After depositing the bottom electrode 38 layer, the capacitor dielectric 40 is conformally deposited over the bottom electrode 38 layer. Then, the remaining openings 36 are filled with the top electrode 42. This embodiment provides a larger interface between the upper channel region 22t and the bottom electrode 38, resulting in reduced resistance and better device performance over the embodiment, for example depicted in FIG. 34A.

Figure 38A:
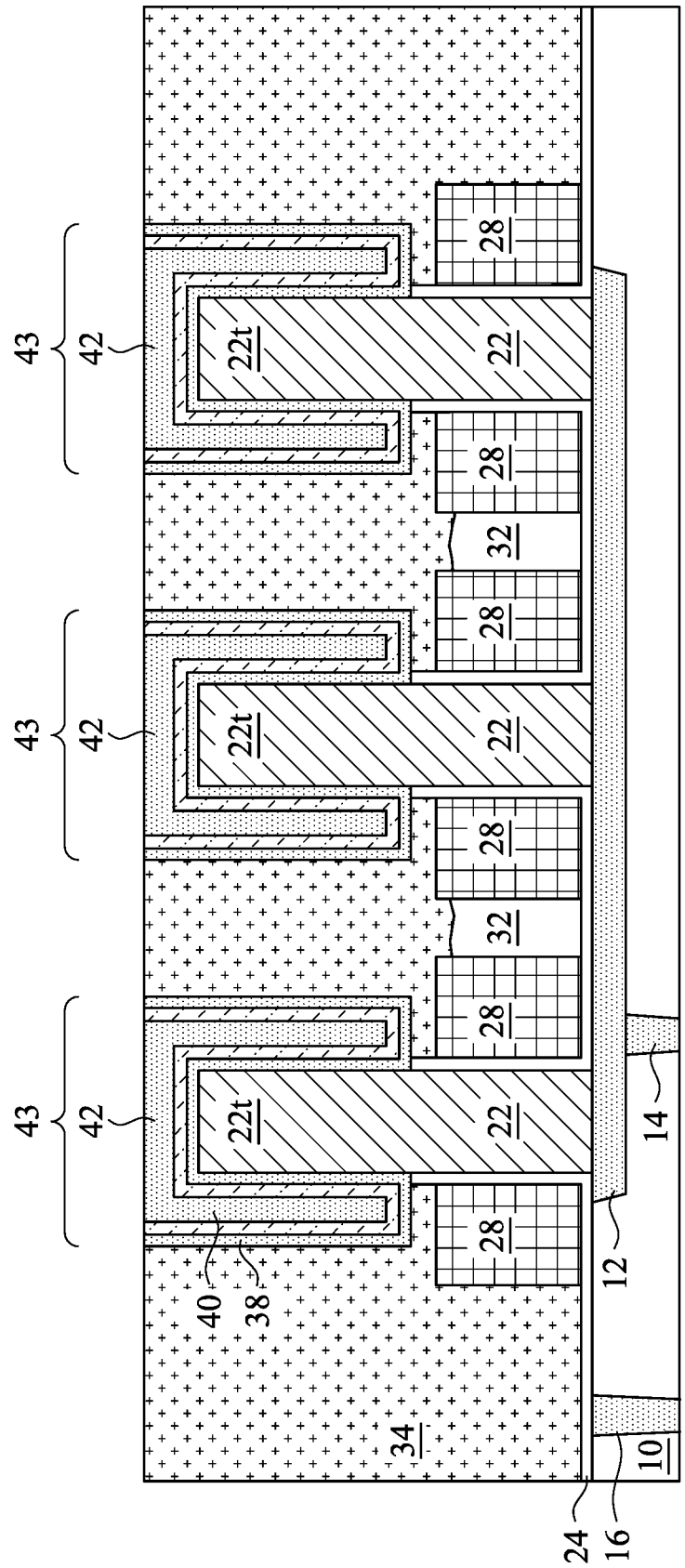
Figure 38B:
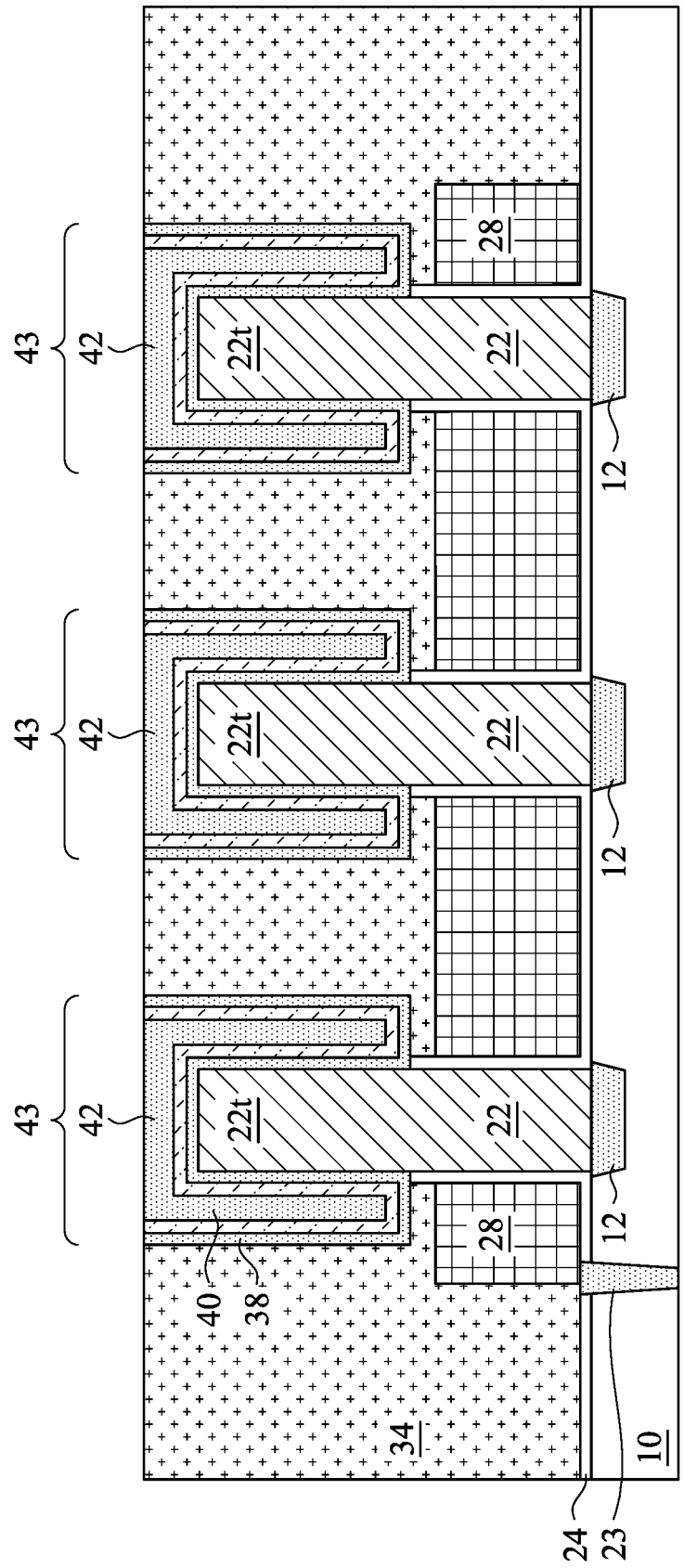

In FIGS. 38A and 38B, the structure of FIGS. 37A and 37B is planarized to separate the bottom electrode 38, capacitor dielectric 40, and top electrode 42 into the cell capacitors 43, in accordance with some embodiments. In other embodiments, the structure of FIGS. 37A and 37B may be patterned to remove portions of the top electrode 42, capacitor dielectric 40, and bottom electrode 38 to form cell capacitors 43 protruding higher than the first ILD 34, having a shape similar to the cell capacitors 43 of FIGS. 32, 33A, and 33B.

Figure 39A:
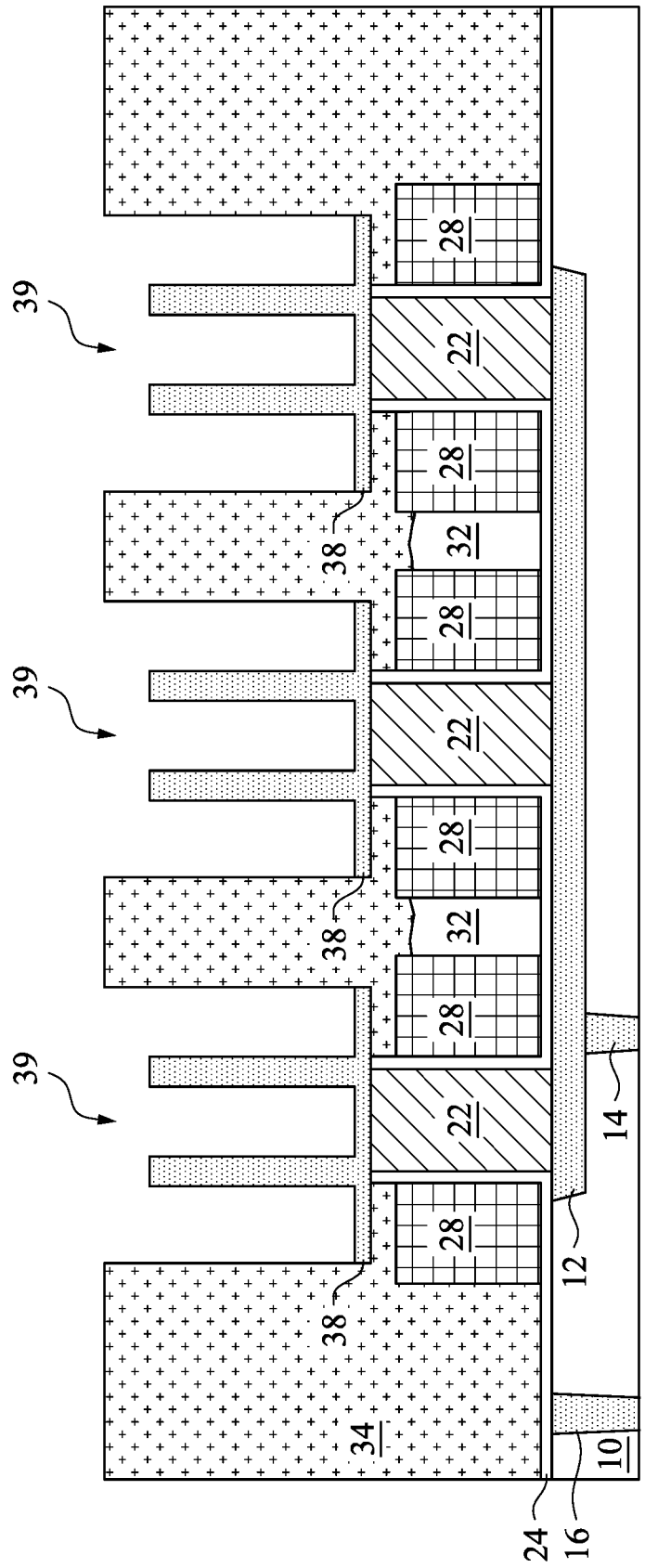
Figure 39B:
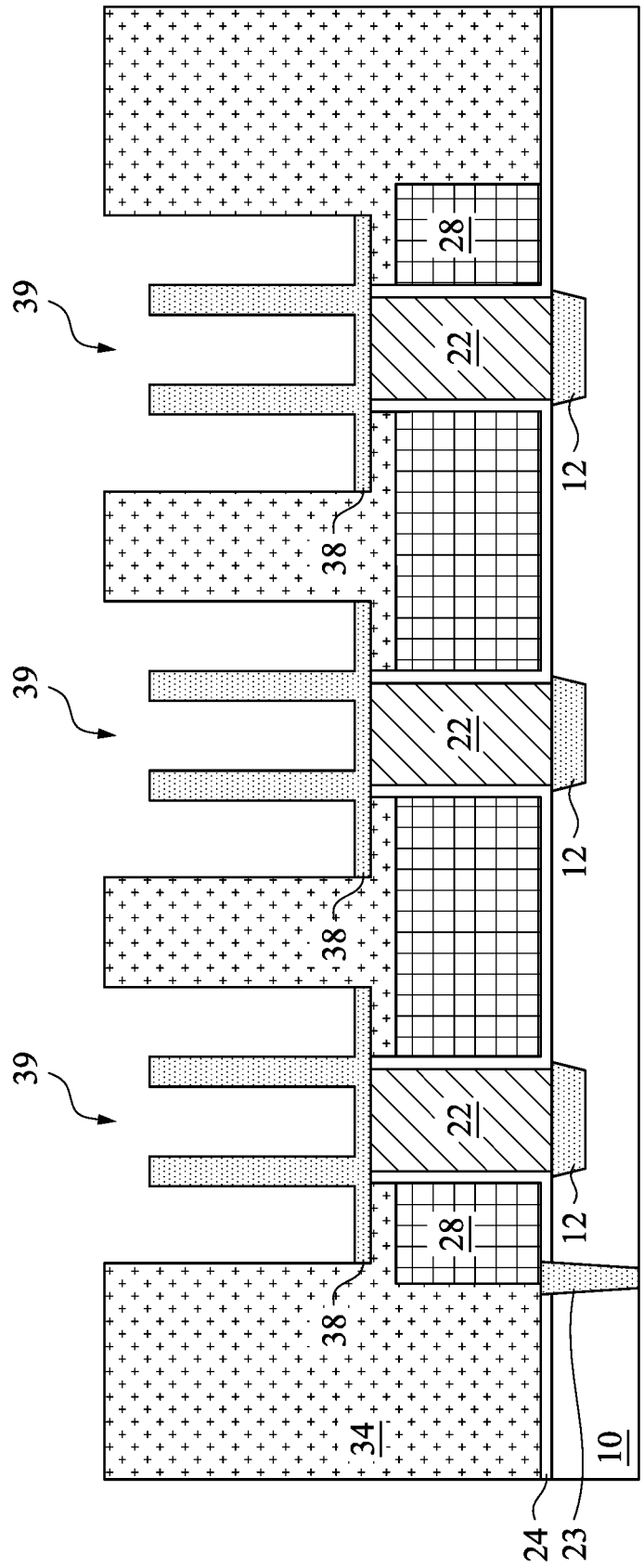

In FIGS. 39A and 39B, the openings 36 (see FIGS. 19A and 19B) are formed to remove the material of the first ILD 34 and upper portion of the gate dielectric 24. Next, a bottom electrode 38 layer is formed which has a lower portion and upper ring-like portion protruding from the lower portion. This may be formed using a variety of techniques. For example, in one embodiment, the opening 36 may be partially filled with the material of the bottom electrode 38 and then an acceptable photoetching process may be used to remove the unwanted portions of the fill, resulting in the ring-like protrusion of the bottom electrode 38. In another embodiment, the opening 36 may be conformally deposited with a first layer of the bottom electrode 38, then a photoresist mask may be deposited in the openings 36 and patterned to form openings exposing portions of the first layer of the bottom electrode 38. Then the remaining portion of the bottom electrode 38 may be deposited in the openings in the photoresist mask, for example, by an electroplating or electroless plating process or other suitable process. Then the photoresist mask may be removed by an ashing process. In such embodiments, the bottom electrode 38 may optionally line the sidewalls of the first ILD 34 in the openings 36.

Figure 40A:
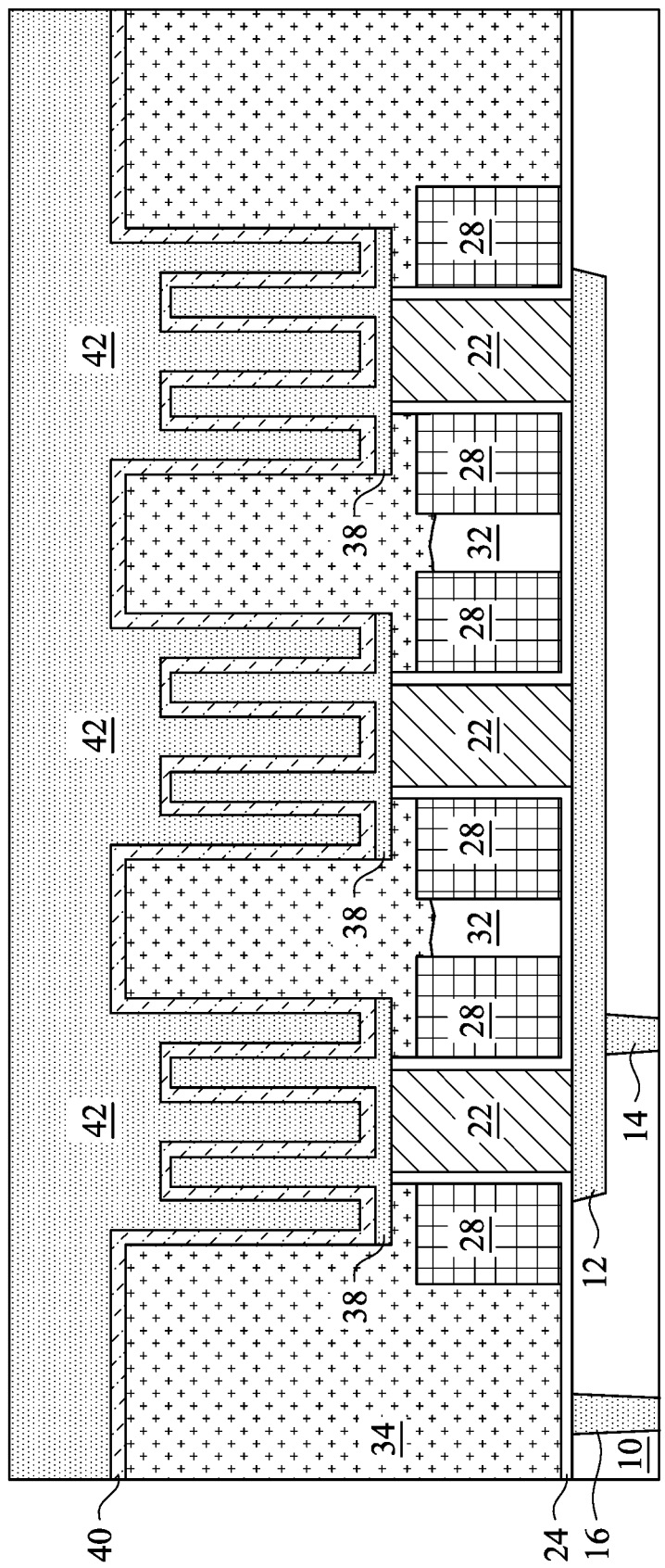
Figure 40B:
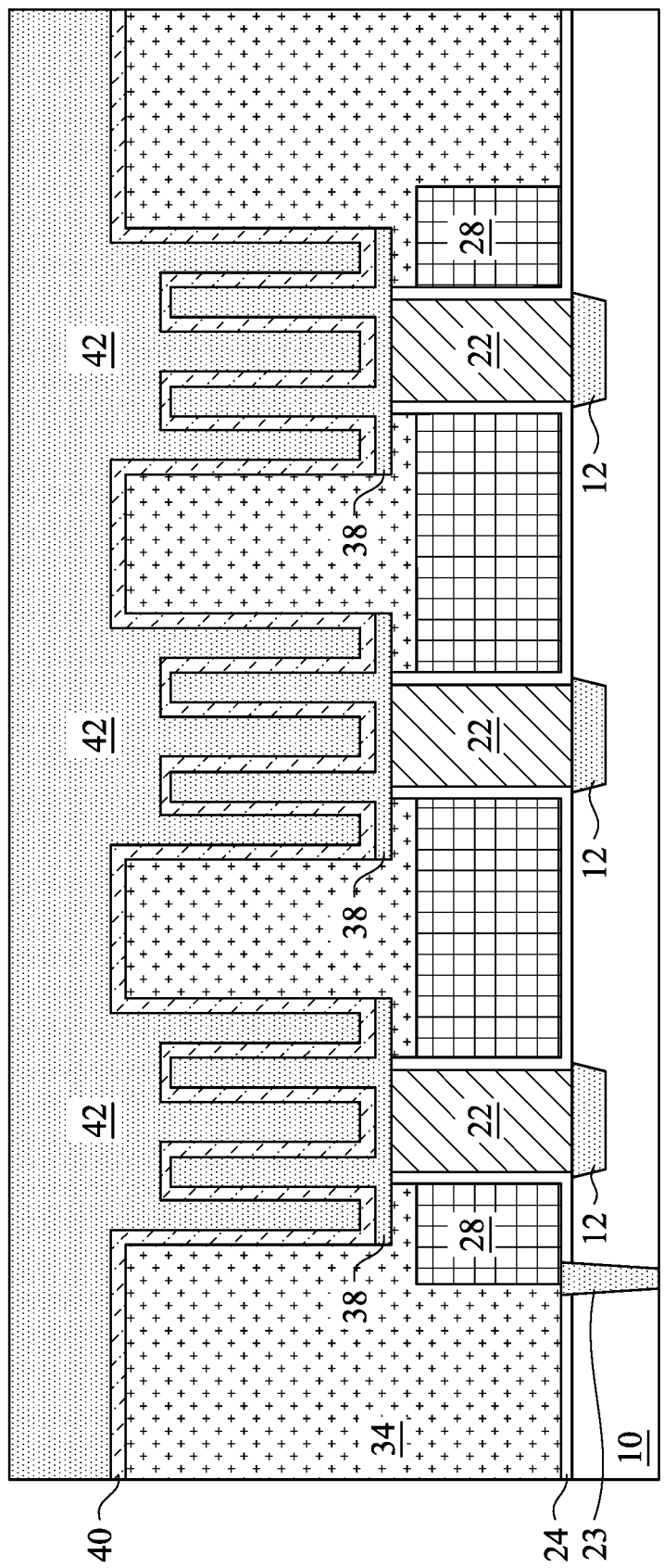

In FIGS. 40A and 40B, after forming and shaping the bottom electrode 38, the capacitor dielectric 40 may be conformally deposited in the remaining openings 39 (see FIGS. 39A and 39B). Then, the remaining openings may be filled with the top electrode 42. This embodiment provides a larger capacitance by increasing the surface area between the bottom electrode 38, the capacitor dielectric 40, and the top electrode 42.

Figure 41A:
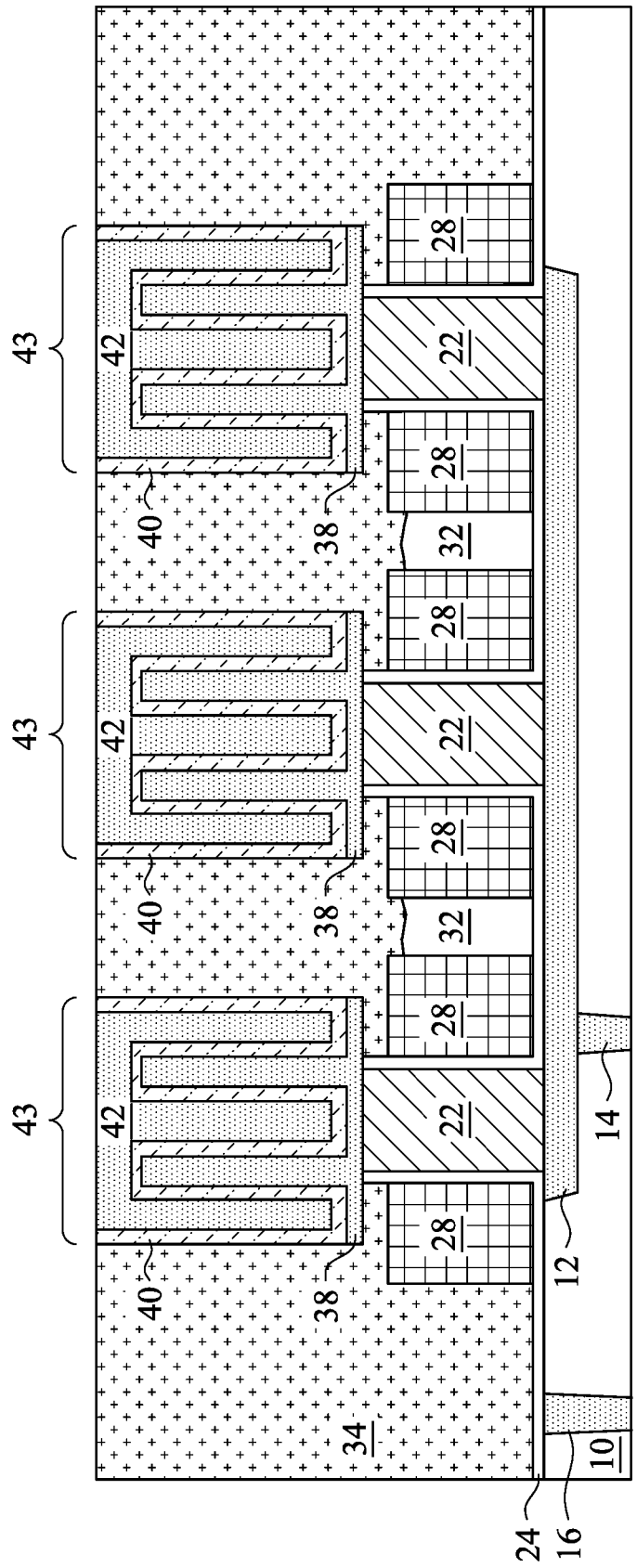
Figure 41B:
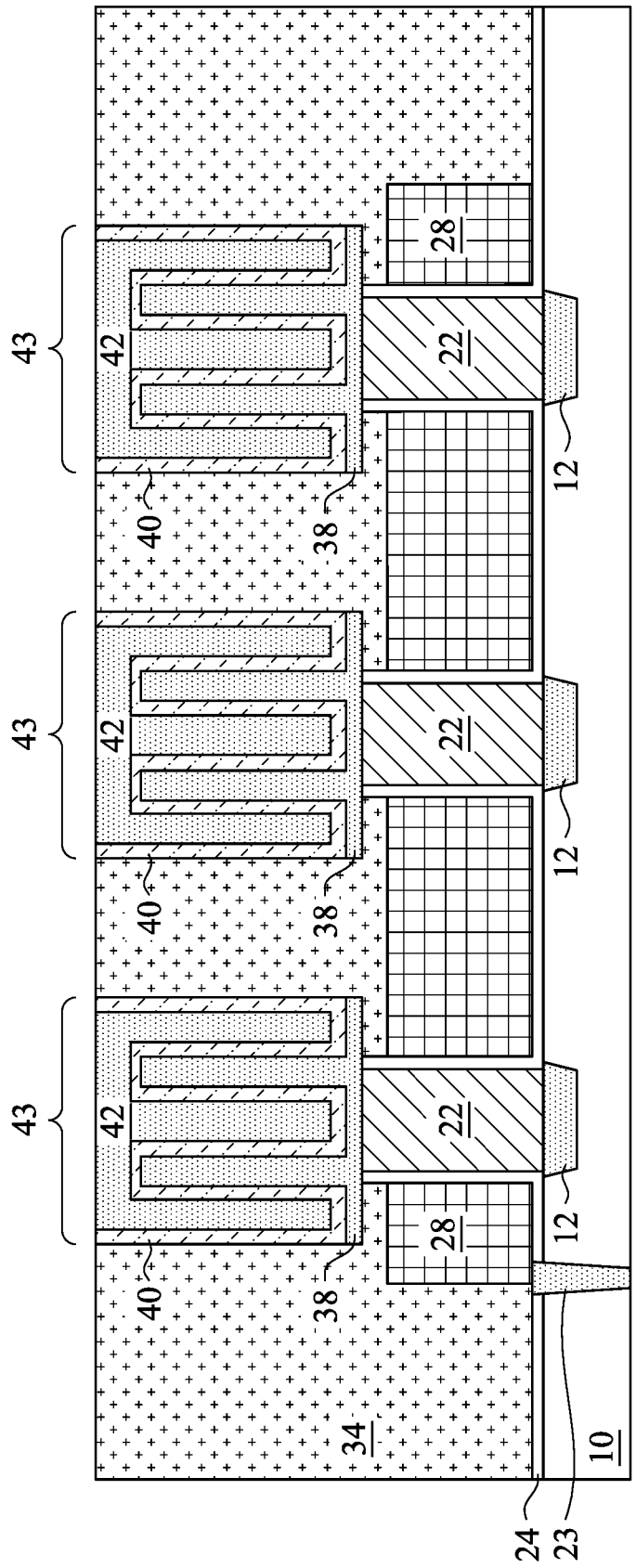

In FIGS. 41A and 41B, the structure of FIGS. 40A and 40B is planarized to separate the bottom electrode 38, capacitor dielectric 40, and top electrode 42 into the cell capacitors 43, in accordance with some embodiments. In other embodiments, the structure of FIGS. 40A and 40B may be patterned to remove portions of the top electrode 42 and capacitor dielectric 40 to form cell capacitors protruding higher than the first ILD 34, having a shape similar to the cell capacitors 43 of FIGS. 32, 33A, and 33B.

Embodiments described above have some advantages. Utilizing a vertical DRAM structure minimizes area requirements. This includes utilizing a vertical gate-all-around transistor with an integrated cell storage capacitor disposed thereover. Further, the vertical DRAM structure is stackable, providing for several tiers of DRAM cell arrays, thereby further increasing memory density. An air gap may be formed between adjacent wordlines (corresponding to the gate-all-around gate electrodes), providing less parasitic capacitance/current leakage. A two-tiered bitline structure may also be used to provide improved performance and less parasitic capacitance/current leakage. Embodiments provide for several capacitor options to allow tuning of the capacitance for each of the cell capacitors. Embodiments also provide a capacitor formation scheme which provides large landings for subsequently formed source line vias. Also, utilizing a monolithic design and formation methodology, i.e., depositing layers and etching deposited layers to form various structures, provides for a process that produces less errors and therefore increases yield and lowers overall cost.

One embodiment is a structure including a first semiconductor pillar disposed over and coupled to a bitline wiring, the bitline wiring extending in a first direction. The semiconductor structure also includes a gate dielectric laterally wrapping the first semiconductor pillar. The semiconductor structure also includes a gate electrode laterally wrapping the gate dielectric, the gate electrode extending in a second direction perpendicular to the first direction, the gate electrode extending continuously to laterally wrap a gate dielectric of a first adjacent semiconductor pillar. The semiconductor structure also includes a capacitor disposed directly over the first semiconductor pillar, an upper electrode of the capacitor coupled to a source line wiring.

In an embodiment, the semiconductor structure further includes an air gap disposed between two adjacent gate electrodes. In an embodiment, the capacitor includes a bottom electrode directly contacting an upper surface of the first semiconductor pillar, a capacitor insulating layer over the bottom electrode, and an upper electrode over the capacitor insulating layer, further including a second insulating layer laterally encapsulating a first portion of the capacitor. In an embodiment, a second portion of the capacitor extends over an upper surface of the second insulating layer. In an embodiment, the bitline wiring is a first bitline wiring, further including: a first bitline insulating layer, the first bitline wiring extending in the first bitline insulating layer; a second bitline insulating layer directly under the first bitline insulating layer; and a second bitline wiring extending in the second bitline insulating layer in a direction parallel to the first bitline wiring, the second bitline wiring coupled to a second adjacent semiconductor pillar. In an embodiment, the semiconductor structure further includes an unfilled space between the gate electrode and an adjacent gate electrode. In an embodiment, the first semiconductor pillar is in a first tier, further including a second tier over the first tier, the second tier including a second semiconductor pillar. In an embodiment, the gate electrode corresponds to a first wordline of the first tier, further including a second gate electrode in the second tier, the second gate electrode corresponding to a second wordline of the second tier, further including a conductive via coupling the second wordline to the first wordline. In an embodiment, the first semiconductor pillar has sidewalls which curve inward or outward. In an embodiment, the first semiconductor pillar has a shape in top down view corresponding to a circular shape, an elongated circular shape, a curved rectangular shape, a diamond-like shape, an inverted-corner rectangular shape, or a hexagonal shape.

Another embodiment is a method including depositing a first insulating layer over a substrate. The method also includes forming a bitline wiring in the first insulating layer, the bitline wiring having a first lengthwise direction. The method also includes depositing a semiconductor material layer over the first insulating layer. The method also includes patterning the semiconductor material layer into a plurality of pillars disposed along the bitline wiring. The method also includes depositing a gate dielectric layer over the pillars. The method also includes depositing a second insulating layer over the gate dielectric layer. The method also includes forming a capacitor directly over each pillar of the plurality of pillars.

In an embodiment, the method further includes: after depositing the gate dielectric layer, depositing a metal electrode layer, the metal electrode layer laterally surrounding the plurality of pillars; and patterning the metal electrode layer to form a first wordline wiring extending in a second lengthwise direction, the first wordline wiring surrounding the gate dielectric layer of each of a row of the plurality of pillars. In an embodiment, depositing the second insulating layer causes a slit between the first wordline wiring and an adjacent second wordline wiring to contain an air gap between the first wordline wiring and the second wordline wiring. In an embodiment, the bitline wiring is a first bitline wiring further including: depositing a third insulating layer over the substrate, the third insulating layer interposed between the substrate and the first insulating layer; and forming a second bitline wiring in the third insulating layer, the bitline wiring having the first lengthwise direction, the second bitline wiring adjacent the first bitline wiring. In an embodiment, forming the capacitor further includes: forming openings in the second insulating layer, each of the openings exposing a corresponding pillar of the plurality of pillars; depositing a capacitor insulating layer in each of the openings and over the second insulating layer; depositing a top electrode over the second insulating layer, the top electrode filling a remaining portion of the openings; patterning the top electrode and the second insulating layer to separate a capacitor over each pillar of the plurality of pillars; and depositing a third insulating layer over the second insulating layer, the third insulating layer laterally surrounding an upper portion of the capacitor over each pillar of the plurality of pillars.

Another embodiment includes a method including forming an opening in a first insulating layer, the opening exposing an upper surface of a first vertical channel region of a first transistor, the first vertical channel region laterally surrounded by a gate dielectric and a gate electrode, the gate electrode spanning laterally to further surround a second vertical channel region of a second transistor. The method also includes depositing a conformal second insulating layer in the opening over a conductive area of the first transistor. The method also includes depositing a top electrode layer in order to fill a remainder of the opening, the top electrode layer extending over an upper surface of the first insulating layer. The method also includes separating the top electrode layer and second insulating layer to form a first capacitor over the first vertical channel region and a second capacitor over the second vertical channel region.

In an embodiment, the opening exposes sidewalls of an upper portion of the first vertical channel region. In an embodiment, the second insulating layer is deposited directly on the exposed sidewalls of the upper portion of the first vertical channel region. In an embodiment, the method further includes, prior to forming the second insulating layer, depositing a conformal bottom electrode layer over the upper portion of the first vertical channel region. In an embodiment, the method further includes forming a bottom electrode in the opening prior to depositing the second insulating layer, the bottom electrode contacting an upper surface of the first vertical channel region, the bottom electrode having a vertical ring extending from a bottom surface of the bottom electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a first insulating layer over a substrate;
forming a bitline wiring in the first insulating layer, the bitline wiring having a first lengthwise direction;
depositing a semiconductor material layer over the first insulating layer;
patterning the semiconductor material layer into a plurality of pillars disposed along the bitline wiring;
depositing a gate dielectric layer over the pillars;
depositing a second insulating layer over the gate dielectric layer; and
forming a capacitor directly over each pillar of the plurality of pillars.

2. The method of claim 1, further comprising:
after depositing the gate dielectric layer, depositing a metal electrode layer, the metal electrode layer laterally surrounding the plurality of pillars; and
patterning the metal electrode layer to form a first wordline wiring extending in a second lengthwise direction, the first wordline wiring surrounding the gate dielectric layer of each of a row of the plurality of pillars.

3. The method of claim 2, wherein depositing the second insulating layer causes a slit between the first wordline wiring and an adjacent second wordline wiring to contain an air gap between the first wordline wiring and the second wordline wiring.

4. The method of claim 1, wherein the bitline wiring is a first bitline wiring further comprising:
depositing a third insulating layer over the substrate, the third insulating layer interposed between the substrate and the first insulating layer; and
forming a second bitline wiring in the third insulating layer, the second bitline wiring having the first lengthwise direction, the second bitline wiring adjacent the first bitline wiring.

5. The method of claim 1, wherein forming the capacitor further comprises:
forming openings in the second insulating layer, each of the openings exposing a corresponding pillar of the plurality of pillars;
depositing a capacitor insulating layer in each of the openings and over the second insulating layer;
depositing a top electrode over the second insulating layer, the top electrode filling a remaining portion of the openings;
patterning the top electrode and the second insulating layer to separate a capacitor over each pillar of the plurality of pillars; and
depositing a third insulating layer over the second insulating layer, the third insulating layer laterally surrounding an upper portion of the capacitor over each pillar of the plurality of pillars.

6. A method comprising:
forming an opening in a first insulating layer, the opening exposing an upper surface of a first vertical channel region of a first transistor, the first vertical channel region laterally surrounded by a gate dielectric and a gate electrode, the gate electrode spanning laterally to further surround a second vertical channel region of a second transistor;
depositing a conformal second insulating layer in the opening over a conductive area of the first transistor;
depositing a top electrode layer in order to fill a remainder of the opening, the top electrode layer extending over an upper surface of the first insulating layer; and
separating the top electrode layer and second insulating layer to form a first capacitor over the first vertical channel region and a second capacitor over the second vertical channel region.

7. The method of claim 6, wherein the opening exposes sidewalls of an upper portion of the first vertical channel region.

8. The method of claim 7, wherein the second insulating layer is deposited directly on the exposed sidewalls of the upper portion of the first vertical channel region.

9. The method of claim 7, further comprising, prior to forming the second insulating layer, depositing a conformal bottom electrode layer over the upper portion of the first vertical channel region.

10. The method of claim 6, further comprising:
forming a bottom electrode in the opening prior to depositing the second insulating layer, the bottom electrode contacting an upper surface of the first vertical channel region, the bottom electrode having a vertical ring extending from a bottom surface of the bottom electrode.

11. A method of forming a semiconductor structure, the method comprising:
forming a bitline wiring in a first dielectric layer;
a first semiconductor pillar disposed over and coupled to the bitline wiring, the bitline wiring extending in a first direction;
forming a gate dielectric laterally surrounding the first semiconductor pillar;
forming a gate electrode laterally surrounding the first semiconductor pillar, wherein the gate dielectric separates the gate electrode from the first semiconductor pillar, the gate electrode extending in a second direction perpendicular to the first direction in a plan view;
forming a second dielectric layer over the gate electrode; and
forming a capacitor in the second dielectric layer and disposed directly over the first semiconductor pillar.

12. The method of claim 11, further comprising:
forming a second semiconductor pillar over the bitline wiring, wherein the gate dielectric and the gate electrode extends continuously around the second semiconductor pillar; and
forming a recess in the gate electrode to form a first gate electrode surrounding the first semiconductor pillar and a second gate electrode surrounding the second semiconductor pillar.

13. The method of claim 12, wherein forming the second dielectric layer seals the recess and forms an air gap between the first gate electrode and the second gate electrode.

14. The method of claim 12, wherein forming the second dielectric layer fills the recess.

15. The method of claim 11, wherein forming the capacitor comprises:
forming a bottom electrode directly contacting an upper surface of the first semiconductor pillar;
forming a capacitor insulating layer over the bottom electrode; and
forming an upper electrode over the capacitor insulating layer.

16. The method of claim 11, wherein a portion of the capacitor extends over an upper surface of the second dielectric layer.

17. The method of claim 11, further comprising:
forming a first conductive via through the second dielectric layer, wherein the conductive via contacts an upper surface of the gate electrode.

18. The method of claim 17, further comprising:
forming a second conductive via in the first dielectric layer, wherein the bitline wiring is formed on the second conductive via.

19. The method of claim 11, wherein the first semiconductor pillar has sidewalls that curve inward or outward.

* * * * *